(12) United States Patent
Kurokawa et al.

(10) Patent No.: US 10,734,310 B2
(45) Date of Patent: Aug. 4, 2020

(54) SEMICONDUCTOR APPARATUS

(71) Applicant: Murata Manufacturing Co., Ltd., Kyoto (JP)

(72) Inventors: Atsushi Kurokawa, Kyoto (JP); Masayuki Aoike, Kyoto (JP); Takayuki Tsutsui, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/210,135

(22) Filed: Dec. 5, 2018

(65) Prior Publication Data
US 2019/0172773 A1 Jun. 6, 2019

(30) Foreign Application Priority Data

Dec. 6, 2017 (JP) ................................. 2017-234278
Jun. 19, 2018 (JP) ................................. 2018-115799
Sep. 10, 2018 (JP) ................................. 2018-168440

(51) Int. Cl.
*H01L 23/49* (2006.01)
*H01L 23/14* (2006.01)
(Continued)

(52) U.S. Cl.
CPC ............ *H01L 23/49* (2013.01); *H01L 23/147* (2013.01); *H01L 23/296* (2013.01);
(Continued)

(58) Field of Classification Search
CPC . H01L 23/49; H01L 23/53228; H01L 23/196; H01L 23/47; H01L 2224/05572; H01L 2924/19105; H01L 2924/19042; H01L 2924/19041; H01L 24/05; H01L 2224/92244; H01L 2224/73267; H01L 2224/32225; H01L 2224/16227; H01L 2224/13155; H01L 2224/13147; H01L 2224/13111; H01L 24/13; H01L 2224/131; H01L 2224/13083; H01L 2224/13082;
(Continued)

(56) References Cited

U.S. PATENT DOCUMENTS

2011/0254986 A1* 10/2011 Nishimura ............ H01L 27/146
348/302

FOREIGN PATENT DOCUMENTS

JP 2003-077930 A 3/2003
JP 5967317 B2 8/2016

* cited by examiner

*Primary Examiner* — Jasmine J Clark
(74) *Attorney, Agent, or Firm* — Pearne & Gordon LLP

(57) ABSTRACT

A wiring is disposed above operating regions of plural unit transistors arranged on a substrate in a first direction. An insulating film is disposed on the wiring. A cavity entirely overlapping with the wiring as viewed from above is formed in the insulating film. A metal member electrically connected to the wiring via the cavity is disposed on the insulating film. The centroid of the cavity is displaced from that of the operating region of the corresponding unit transistor in the first direction. When the cavity having a centroid the closest to the operating region of a unit transistor is defined as the closest proximity cavity, the amount of deviation of the centroid of the closest proximity cavity from that of the operating region of the corresponding unit transistor in the first direction becomes greater from the center to the ends of the arrangement direction of the unit transistors.

20 Claims, 31 Drawing Sheets

(51) Int. Cl.
    *H01L 23/29*     (2006.01)
    *H01L 23/532*    (2006.01)
    *H01L 23/528*    (2006.01)
    *H01L 23/00*     (2006.01)

(52) U.S. Cl.
    CPC ...... *H01L 23/528* (2013.01); *H01L 23/53228* (2013.01); *H01L 24/05* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0346* (2013.01); *H01L 2224/0401* (2013.01); *H01L 2224/04105* (2013.01); *H01L 2224/05548* (2013.01); *H01L 2224/05569* (2013.01); *H01L 2224/05572* (2013.01); *H01L 2224/05647* (2013.01); *H01L 2224/12105* (2013.01); *H01L 2224/131* (2013.01); *H01L 2224/13082* (2013.01); *H01L 2224/13083* (2013.01); *H01L 2224/13111* (2013.01); *H01L 2224/13147* (2013.01); *H01L 2224/13155* (2013.01); *H01L 2224/16227* (2013.01); *H01L 2224/32225* (2013.01); *H01L 2224/73267* (2013.01); *H01L 2224/92244* (2013.01); *H01L 2924/19041* (2013.01); *H01L 2924/19042* (2013.01); *H01L 2924/19105* (2013.01)

(58) Field of Classification Search
    CPC . H01L 2224/12105; H01L 2224/05647; H01L 2224/05548; H01L 2224/04105; H01L 24/73; H01L 2224/0401; H01L 2224/0346; H01L 2224/05569; H01L 24/92; H01L 24/32; H01L 24/16; H01L 23/296; H01L 2924/013; H01L 2924/00014; H01L 23/528; H01L 23/147
    See application file for complete search history.

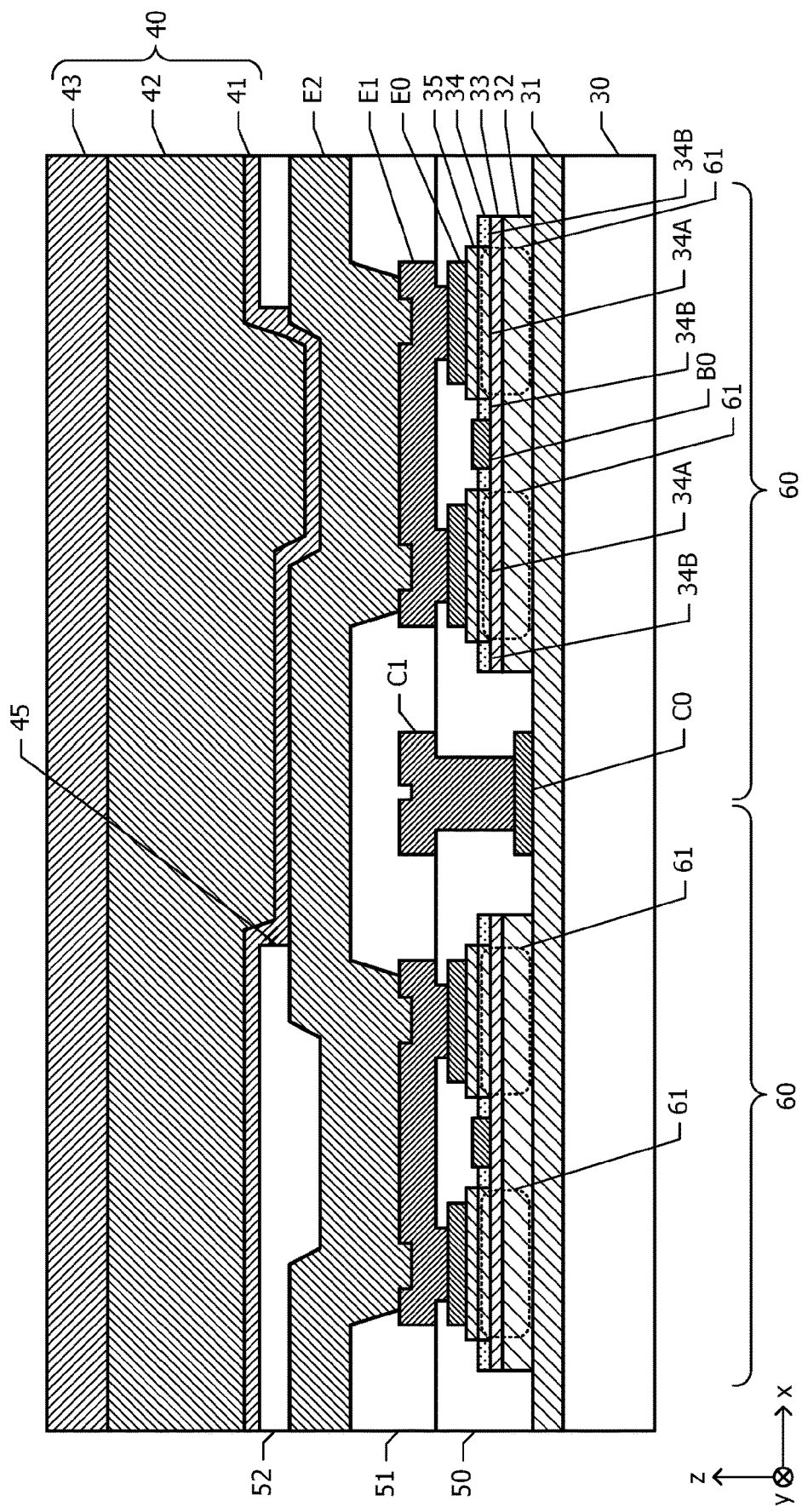

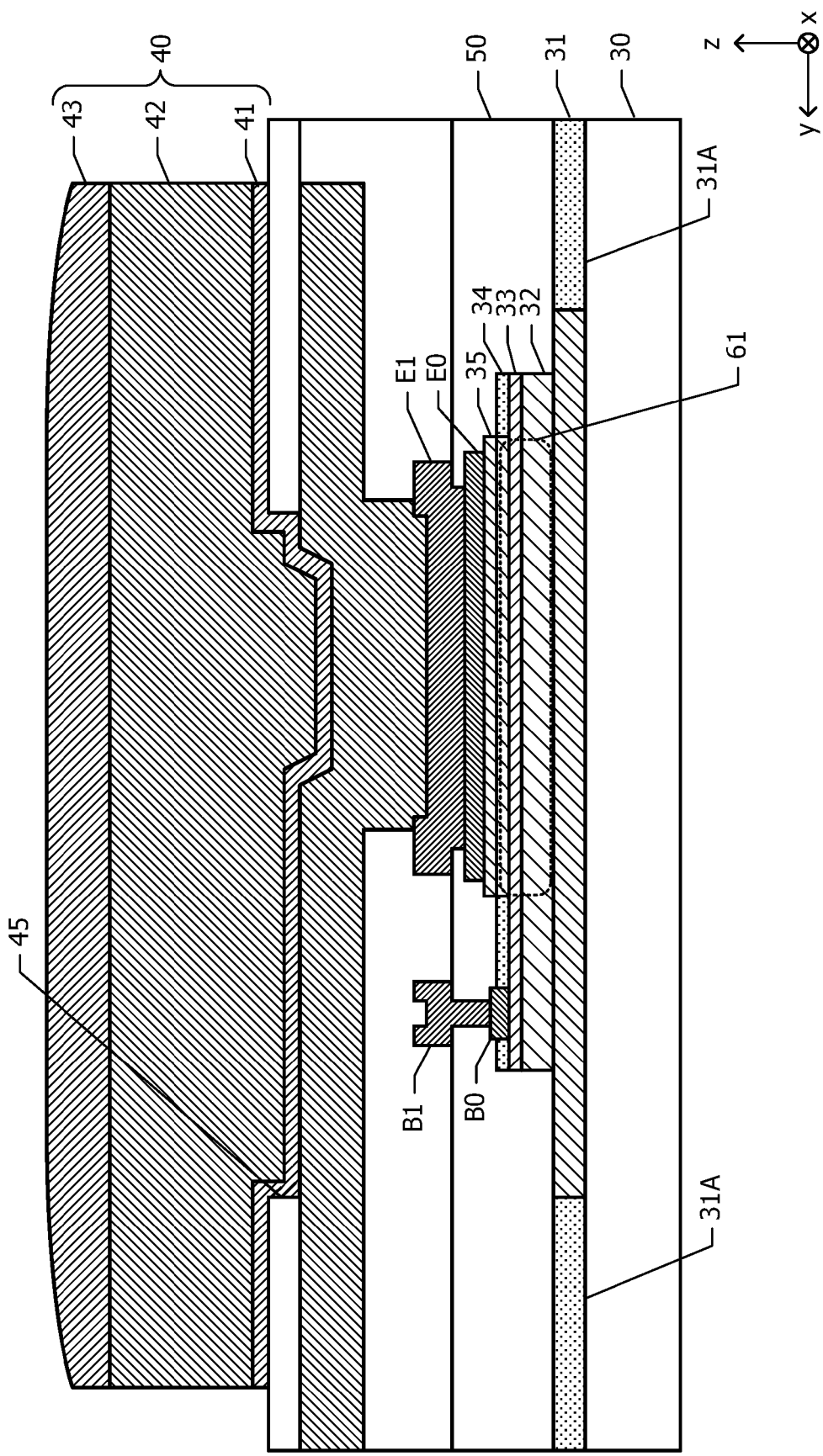

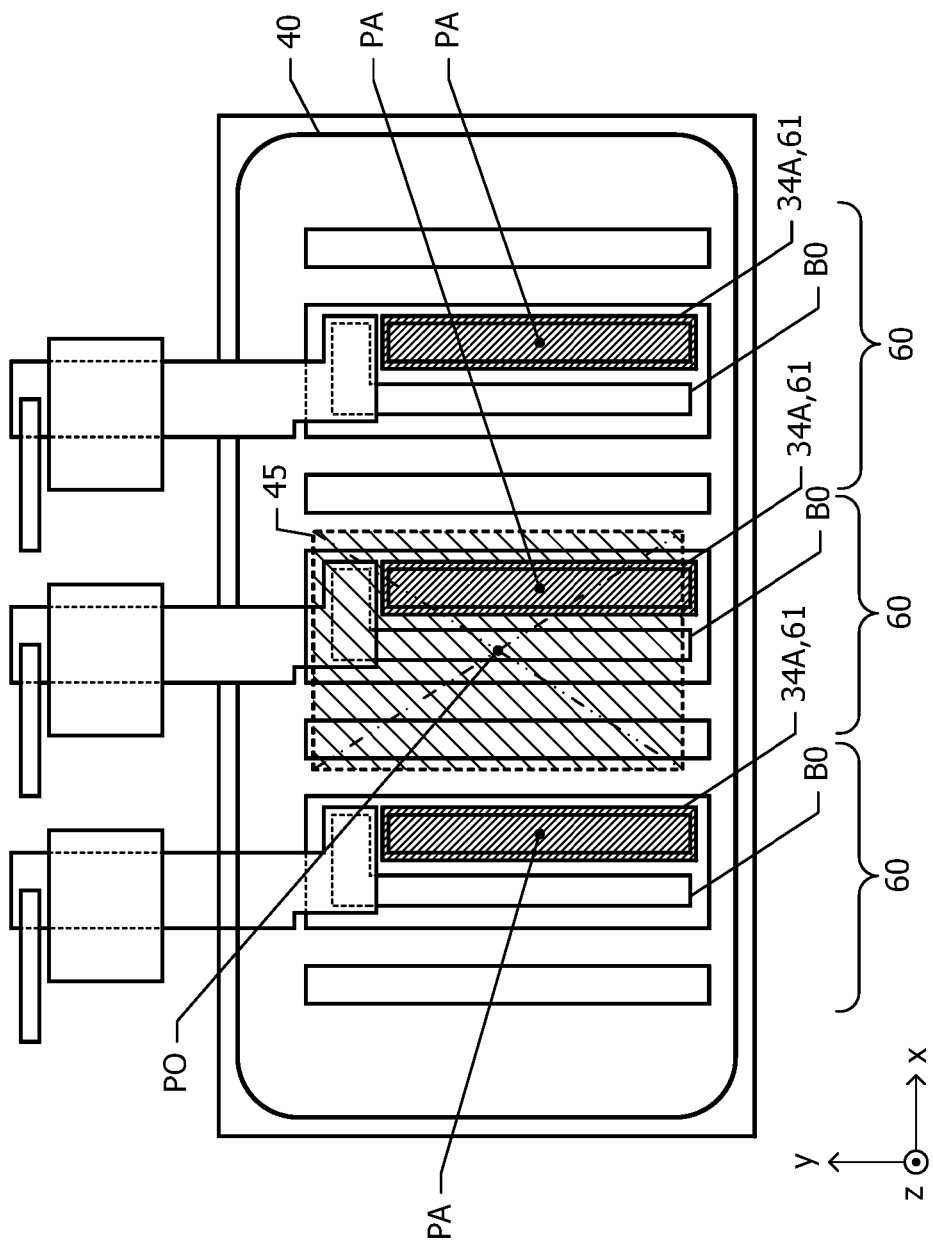

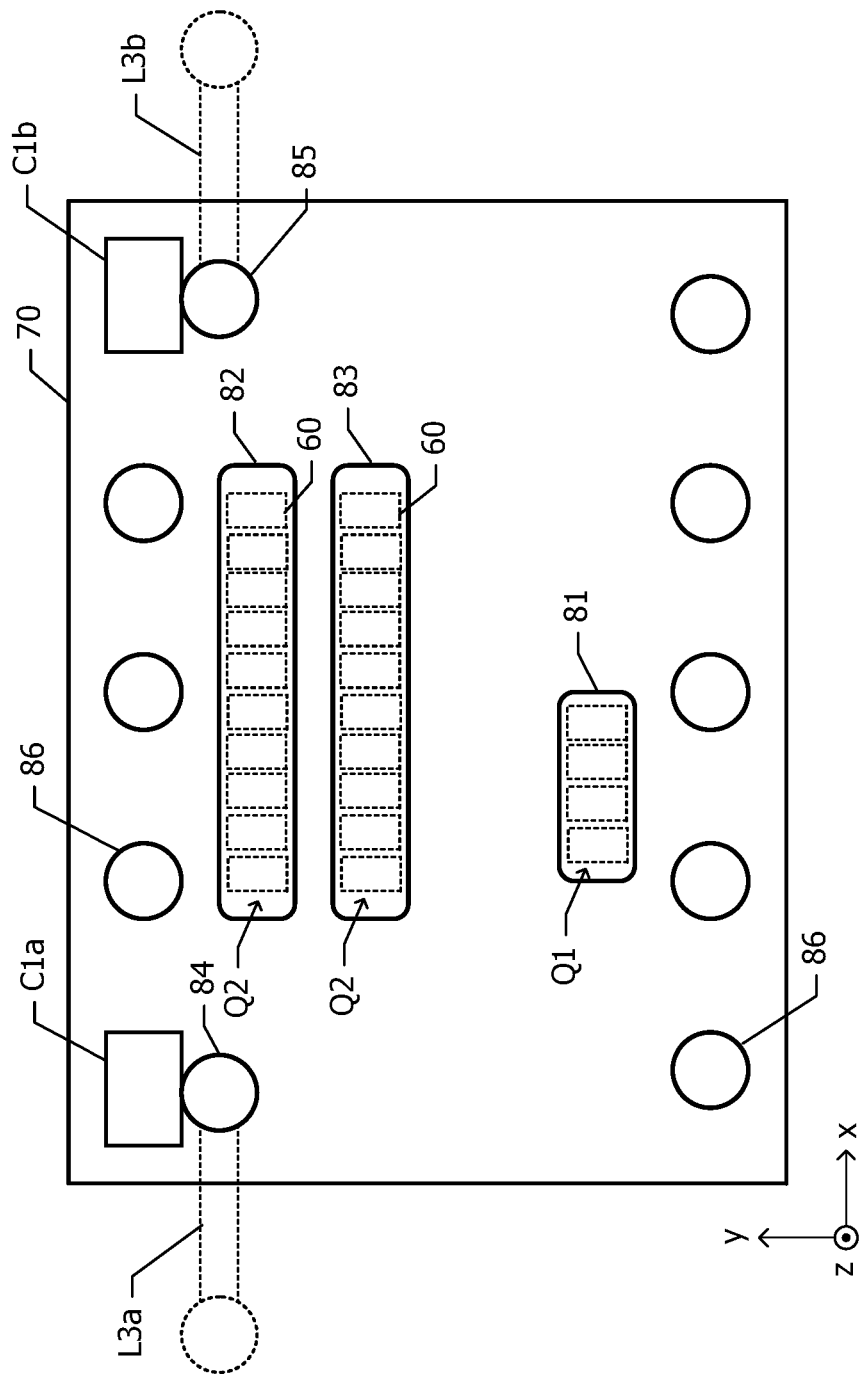

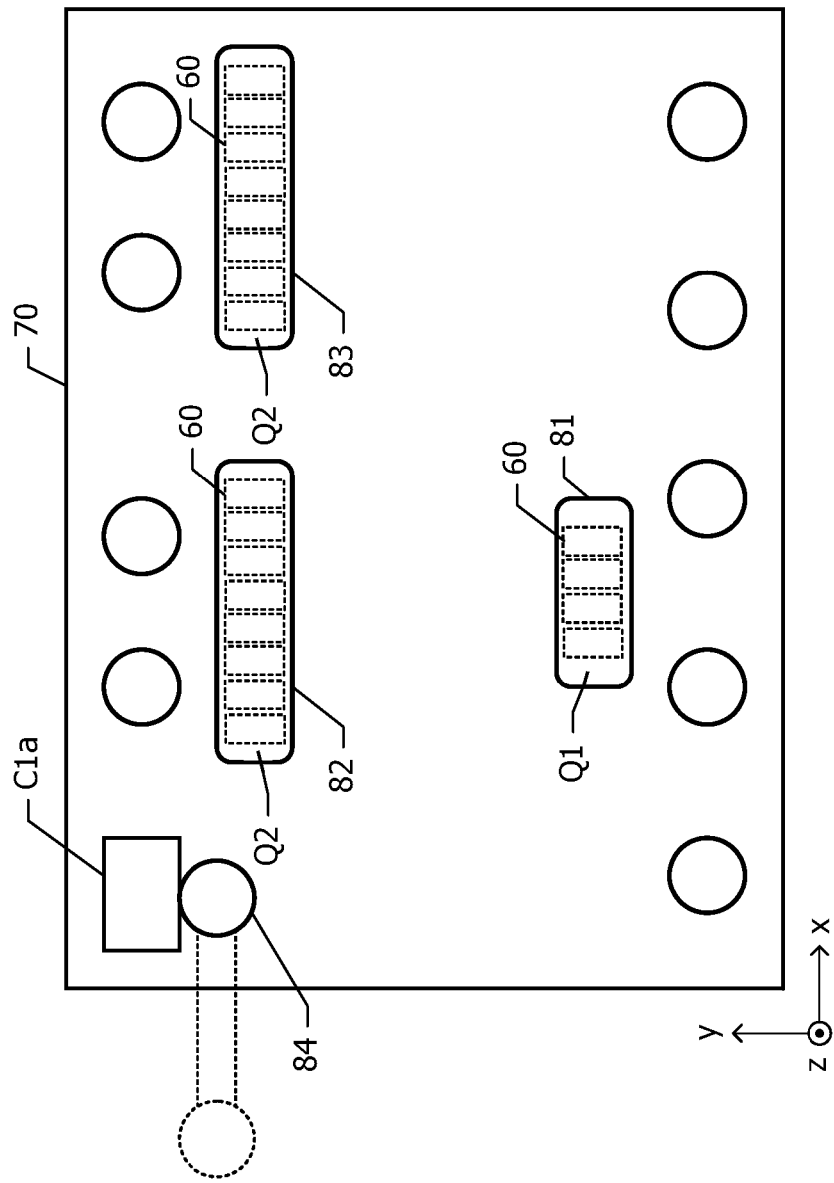

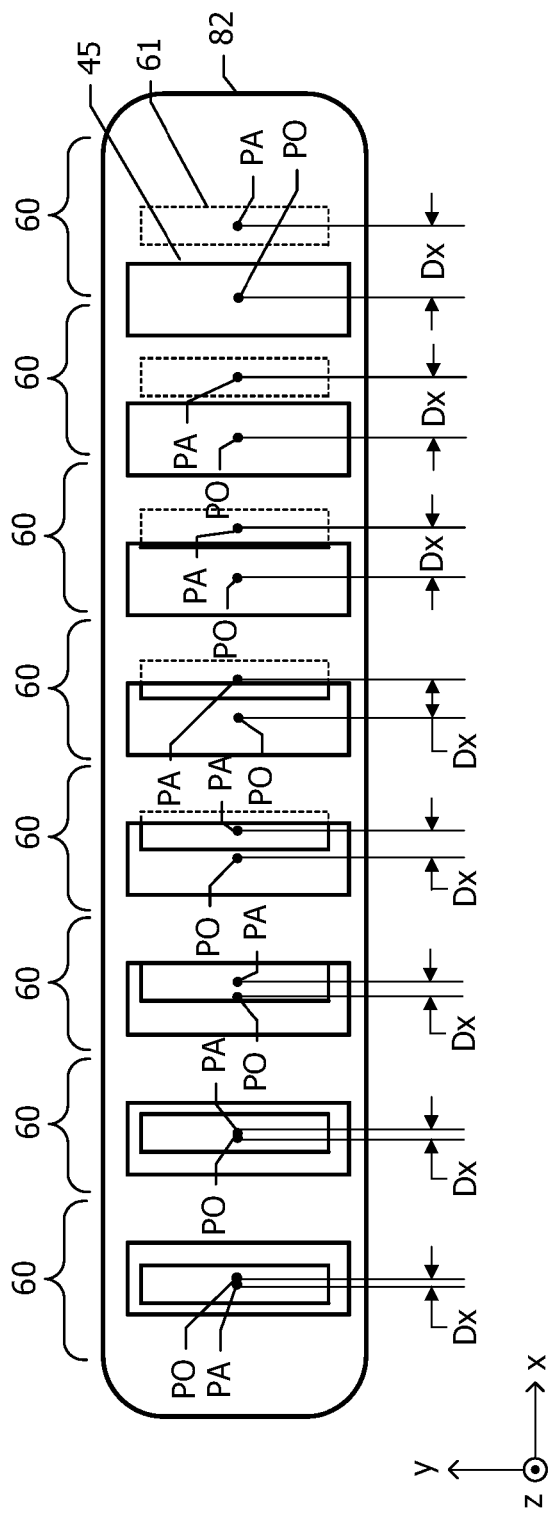

FIG. 27
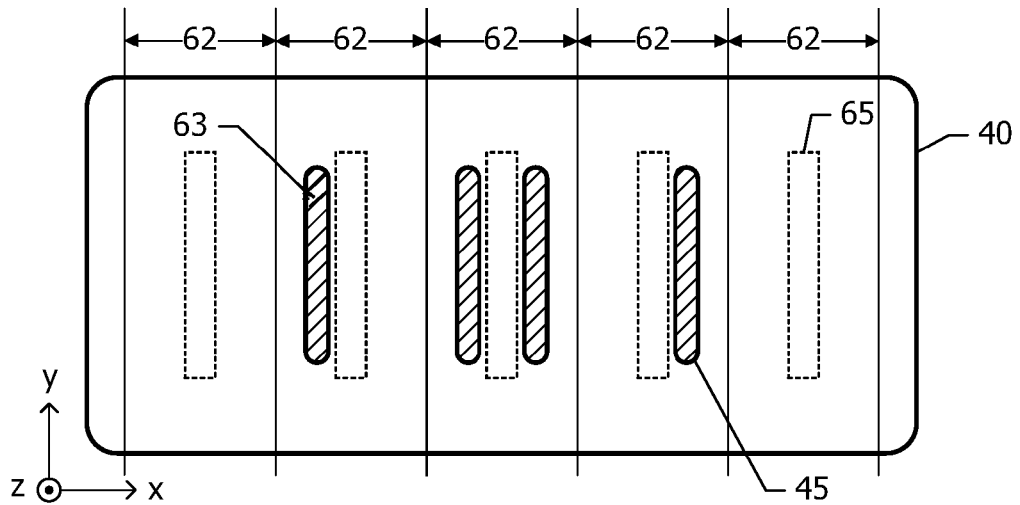
FIG. 28
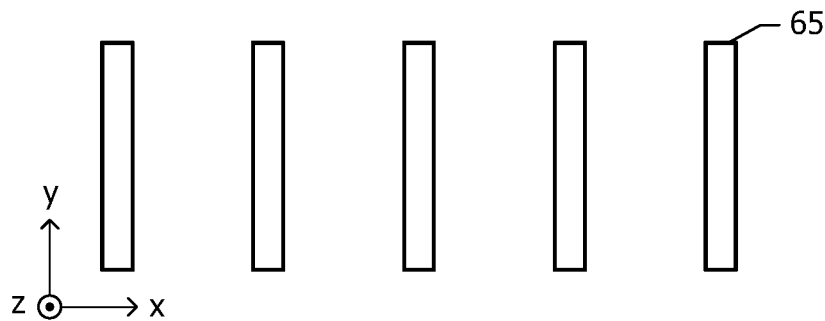
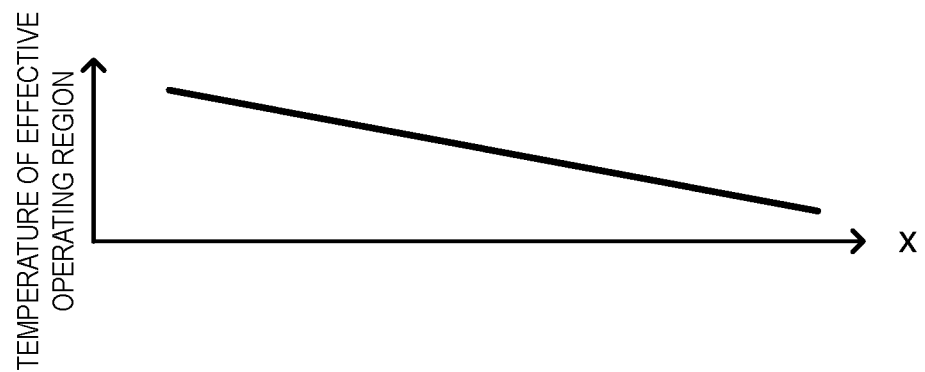

SEMICONDUCTOR APPARATUS

This application claims priority from Japanese Patent Application No. 2017-234278, filed on Dec. 6, 2017, Japanese Patent Application No. 2018-115799, filed on Jun. 19, 2018, and Japanese Patent Application No. 2018-168440, filed on Sep. 10, 2018. The content of these applications are incorporated herein by reference in their entireties.

BACKGROUND OF THE DISCLOSURE

1. Field of the Disclosure

The present disclosure relates to a semiconductor apparatus.

2. Description of the Related Art

A heterojunction bipolar transistor (HBT) is used for a power amplifier module of, for example, a mobile terminal. In the semiconductor apparatus disclosed in Japanese Unexamined Patent Application Publication No. 2003-77930, a bump is disposed immediately above an HBT. The bump is electrically connected to the HBT via a cavity formed in an insulating film disposed between the HBT and the bump. The entirety of the HBT is disposed within the cavity. With this configuration, the distance from the HBT to the bump is decreased, thereby reducing the thermal resistance in a heat path from the HBT to the bump.

This configuration, however, is likely to produce thermal stress in the emitter layer of the HBT due to the difference between the coefficient of thermal expansion of the emitter layer and that of the bump. The occurrence of thermal stress decreases the reliability of the HBT.

Japanese Patent No. 5967317 discloses a semiconductor apparatus that can reduce the thermal stress. In this semiconductor apparatus, the emitter layer of an HBT is formed in a substantially rectangular shape as viewed from above. A cavity formed in an insulating film under a bump is disposed at a position displaced from the emitter layer of the HBT in its longitudinal direction. This configuration makes it possible to reduce the thermal stress produced in the emitter layer to be lower than in the configuration in which the entirety of the emitter layer is disposed within the cavity.

BRIEF SUMMARY OF THE DISCLOSURE

The semiconductor apparatus disclosed in Japanese Patent No. 5967317 includes one HBT. Usually, the HBT is constituted by plural unit transistors connected in parallel with each other on a single substrate. When operating the parallel-connected plural unit transistors, the temperatures of the unit transistors may not become uniform. A unit transistor where the temperature is likely to rise is degraded more quickly than the other unit transistors, and the life of the overall semiconductor apparatus becomes short. Such temperature variations also decrease the radio-frequency characteristics of the semiconductor apparatus.

It is an object of the present disclosure to provide a semiconductor apparatus that is capable of fulfilling the performance of the overall transistor by reducing the temperature variations during the operation of plural unit transistors formed on a substrate where an operating current flows.

According to an aspect of the present disclosure, there is provided a semiconductor apparatus including a plurality of unit transistors, a first wiring, an insulating film, and a metal member. The plurality of unit transistors are formed on a substrate and each include an operating region through which an operating current flows. The first wiring is disposed above the operating regions of the plurality of unit transistors to serve as a path for the operating current to flow through the plurality of unit transistors. The insulating film is disposed on the first wiring and includes at least one cavity. The entirety of the at least one cavity overlaps with the first wiring as viewed from above. The metal member is disposed on the insulating film and is electrically connected to the first wiring via the at least one cavity. The plurality of unit transistors are disposed on the substrate side by side in a first direction. The centroid of the at least one cavity is displaced from that of the operating region of each of the plurality of unit transistors in the first direction, as viewed from above. For each of the unit transistors, when, among the at least one cavity, the cavity whose centroid is positioned most closely to the centroid of the operating region of a given unit transistor is defined as a closest proximity cavity for the given unit transistor, the amount of deviation of the centroid of the closest proximity cavity from the centroid of the operating region of the corresponding unit transistor in the first direction becomes greater from the center to an end of the arrangement direction of the plurality of unit transistors.

According to another aspect of the present disclosure, there is provided a semiconductor apparatus including a plurality of unit transistors, a wiring, an insulating film, and a metal member. The plurality of unit transistors are formed on a substrate and each include an operating region through which an operating current flows. The wiring is disposed above the operating regions of the plurality of unit transistors to serve as a path for the operating current to flow through the plurality of unit transistors. The insulating film is disposed on the wiring and includes at least one cavity. The entirety of the at least one cavity overlaps with the wiring as viewed from above. The metal member is disposed on the insulating film and is electrically connected to the wiring via the at least one cavity. The plurality of unit transistors are disposed on the substrate side by side in a first direction. The centroid of the at least one cavity is displaced from that of the operating region of each of the plurality of unit transistors in the first direction, as viewed from above. For each of the unit transistors, when, among the at least one cavity, the cavity whose centroid is positioned most closely to the centroid of the operating region of a given unit transistor is defined as a closest proximity cavity for the given unit transistor, the amount of deviation of the centroid of the closest proximity cavity in the first direction from the centroid of the operating region of the unit transistor positioned at one end in the first direction is smaller than that from the centroid of the operating region of the unit transistor positioned at the other end in the first direction.

According to still another aspect of the present disclosure, there is provided a semiconductor apparatus including a plurality of unit transistors, a wiring, an insulating film, and a metal member. The plurality of unit transistors are formed on a substrate and each include at least one operating region through which an operating current flows. The wiring is disposed above the operating regions of the plurality of unit transistors to serve as a path for the operating current to flow through the plurality of unit transistors. The insulating film is disposed on the wiring and includes at least one cavity. The entirety of the at least one cavity overlaps with the wiring as viewed from above. The metal member is disposed on the insulating film and is electrically connected to the wiring via the at least one cavity. The plurality of unit transistors are disposed on the substrate side by side in a first direction. As viewed from above, when the smallest rectangle containing the at least one operating region of each of the plurality of unit transistors therein is defined as an effective operating region, and, assuming that a line which is parallel with a second direction perpendicular to the first direction and which passes through a midpoint of a segment between the centroid of a given effective operating region and the centroid of an adjacent effective operating region is set as an imaginary line, when each of a plurality of regions sandwiched between the imaginary lines is defined as a range influenced by the effective operating region positioned within the range, the area of an overlapping region where the range and the cavity overlap with each other differs among the effective operating regions. The areas of the overlapping regions corresponding to the effective operating regions positioned at both ends in the first direction are smaller than those of the overlapping regions corresponding to the effective operating regions other than those positioned at both ends in the first direction.

The heat generated in the operating regions or the effective operating regions are conducted to the top surface of the metal member via the metal member disposed within the cavity. If the position of the cavity is displaced from that of the operating region or if the area of the overlapping region is differentiated among the effective operating regions, the heat dissipation becomes different among the operating regions or the effective operating regions. Hence, when the temperatures of the operating regions or the effective operating regions are non-uniform, varying of the heat dissipation among the operating regions or the effective operating regions to reduce the non-uniformity of the temperatures can reduce the temperature difference among the operating regions or the effective operating regions.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 2 is a sectional view taken along the long-dashed dotted line 2-2 in FIG. 1;

FIG. 3 is a sectional view taken along the long-dashed dotted line 3-3 in FIG. 1;

FIG. 6 is a plan view illustrating the layout of the elements forming a semiconductor apparatus according to a second embodiment;

FIG. 9 is a plan view illustrating the layout of the devices on a semiconductor chip forming the semiconductor apparatus according to the third embodiment;

FIG. 13 is a plan view illustrating the layout of the devices on a semiconductor chip forming the semiconductor apparatus according to the fourth embodiment;

FIG. 14 illustrates the positional relationships among a pillar bump, operating regions of unit transistors, and cavities;

FIGS. 25B through 27 illustrate the positional relationships among the effective operating regions, cavities, and pillar bumps of semiconductor apparatuses according to modified examples of the tenth embodiment;

FIG. 28 illustrates the arrangement of effective operating regions of a semiconductor apparatus according to an eleventh embodiment and shows a graph illustrating the temperature distribution of the effective operating regions when heat dissipation from the effective operating regions is uniform;

DETAILED DESCRIPTION OF THE DISCLOSURE

First Embodiment

A semiconductor apparatus according to a first embodiment will be described below with reference to FIGS. 1 through 5B.

Figure 1:
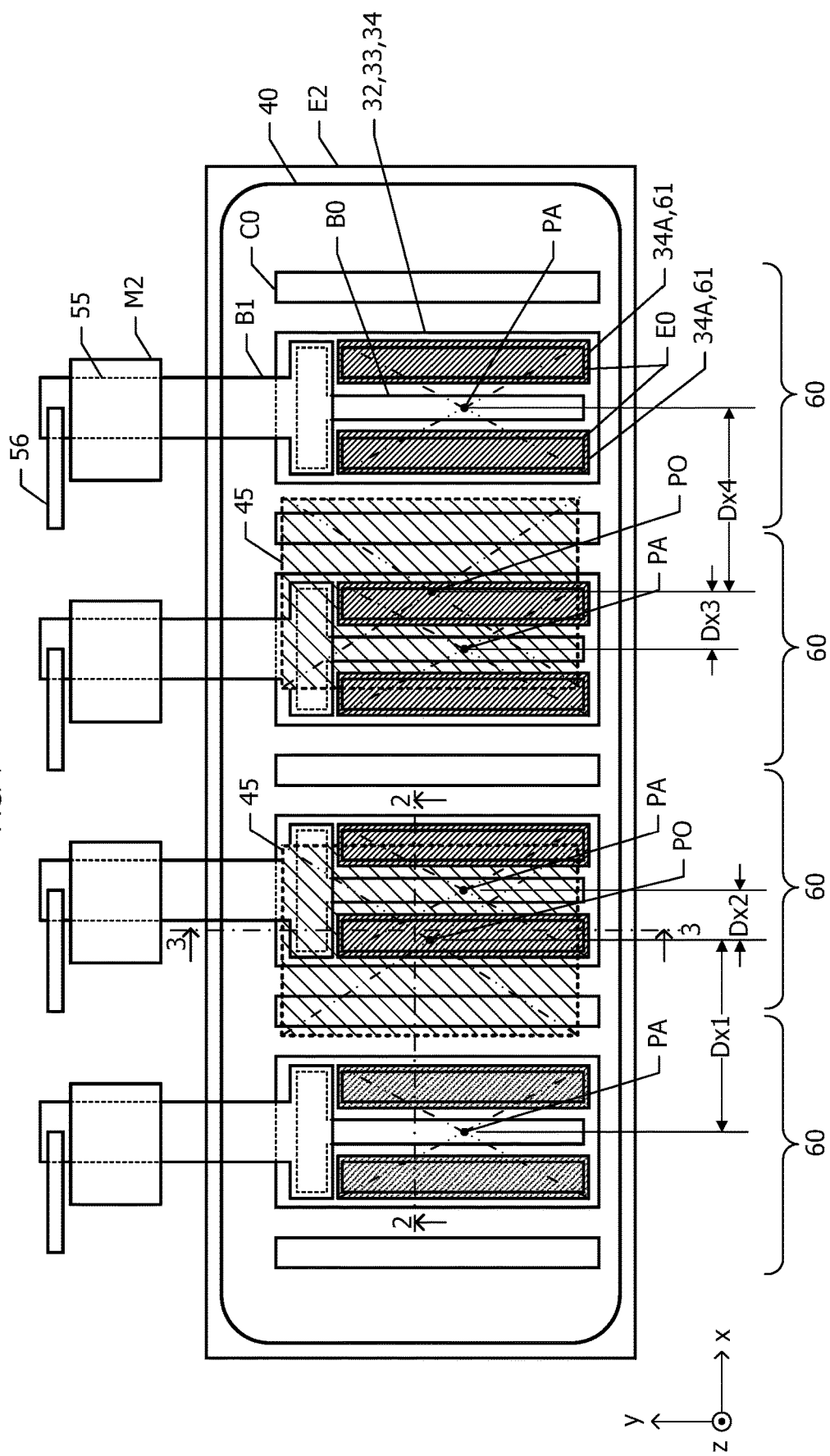
FIG. 1 is a plan view illustrating the layout of the elements forming a semiconductor apparatus according to a first embodiment.

FIG. 1 is a plan view illustrating the layout of the elements forming the semiconductor apparatus according to the first embodiment. FIG. 2 is a sectional view taken along the long-dashed dotted line 2-2 in FIG. 1. FIG. 3 is a sectional view taken along the long-dashed dotted line 3-3 in FIG. 1. The semiconductor apparatus is constituted by plural elements stacked on each other. To make it easy to differentiate the elements of the semiconductor apparatus, some elements located on the lower side and hidden under the elements on the upper side are indicated by the broken lines, though they are not actually seen from above in FIG. 1. The outer edges of some elements are indicated by the broken lines, and some elements are indicated by the hatched portions with different densities.

In the drawings, an xyz rectangular coordinate system is defined. In this coordinate system, the horizontal direction of the semiconductor apparatus in FIG. 1 is set as the x-axis direction, the vertical direction is set as the y-axis direction, and the direction perpendicular to the plane of the drawing is set as the z-axis direction. Plural unit transistors 60 (four transistors 60 in the first embodiment in FIG. 1) are arranged in a first direction (x-axis direction). The plural unit transistors 60 are connected in parallel with each other by wiring on an upper layer.

Each of the unit transistors 60 includes a collector layer 32, a base layer 33, and an emitter layer 34, a collector electrode C0, a base electrode B0, and two emitter electrodes E0. Portions of the emitter layer 34 that contribute to the operation of an HBT (where an emitter current substantially flows) will be called emitter regions 34A. The two emitter electrodes E0 are disposed within the respective two emitter regions 34A, as viewed from above. The two emitter regions 34A are each formed in a substantially rectangular shape elongated in the y-axis direction, as viewed from above, and are located with a space therebetween in the x-axis direction. The main portion of the base electrode B0 is disposed between the two emitter regions 34A. The operating current flows in the thickness direction (z-axis direction) of the emitter regions 34A, which will be discussed later with reference to FIG. 2. The portions located within the emitter regions 34A in a plan view serve as operating regions 61 of each unit transistor 60. The operating regions 61 serve as a major heating source. In FIG. 1, the operating regions 61 are indicated by the hatched portions with high-density right-downward lines.

The emitter regions 34A and the base electrode B0 are disposed within the base layer 33, as viewed from above. The base electrode B0 has a portion (connecting portion) extending from one end of the main portion (positive side of the y axis in FIG. 1) toward both sides in parallel with the x-axis direction. A first-layer base wiring B1 is connected to this connecting portion of the base electrode B0. The first-layer base wiring B1 partially overlaps with a second-layer wiring M2. A capacitor 55 is formed in this overlapping portion. The first-layer base wiring B1 is connected to a ballast resistor 56.

The collector electrode C0 is disposed at both sides of the base layer 33 in the x-axis direction. Two adjacent unit transistors 60 use the same collector electrode C0 disposed between the base layers 33 of the unit transistors 60.

A second-layer emitter wiring E2 is disposed above the emitter layer 34. The term "above" suggests that the second-layer emitter wiring E2 is not in direct contact with the emitter layer 34 and is located at a higher level than the emitter layer 34. The second-layer emitter wiring E2 is disposed above the operating regions 61. The second-layer emitter wiring E2 contains the four unit transistors 60 therein as viewed from above, and serves as wiring for the operating current to flow through the unit transistors 60. The second-layer emitter wiring E2 is electrically connected to the emitter electrodes E0 with a first-layer emitter wiring E1 (see FIGS. 2 and 3) interposed therebetween.

A pillar bump (metal member) 40 is formed to overlap with the second-layer emitter wiring E2, as viewed from above. The pillar bump 40 is electrically connected to the second-layer emitter wiring E2 via plural cavities 45 formed in an insulating film located immediately under the pillar bump 40. In FIG. 1, the cavities 45 are indicated by the hatched portions with low-density right-upward lines.

The dimensions of each of the emitter regions 34A are about 2 to 8 μm in the x-axis direction (width) and about 10 to 40 μm in the y-axis direction (length). The dimensions of the pillar bump 40 are about 70 to 500 μm in the x-axis direction (width) and about 60 to 100 μm in the y-axis direction (length). The width (x-axis direction) of each of the cavities 45 is about 10 to 60 μm.

As shown in FIG. 2, a sub-collector layer 31 made of high-concentration n-type GaAs is formed on a substrate 30 made of semi-insulating GaAs. The thickness of the sub-collector layer 31 is about 0.5 μm.

Multiple mesas are formed on the sub-collector layer 31. Each mesa is constituted by the collector layer 32, the base layer 33, and the emitter layer 34 stacked on each other. One mesa corresponds to one unit transistor 60 (FIG. 1). It can also be said that a transistor using a single continuous base layer 33 is a unit transistor 60. Two emitter mesa layers 35 are disposed on the emitter layer 34 so as to be separated from each other in the x-axis direction. The portions of the emitter layer 34 located immediately under the emitter mesa layers 35 operate as the emitter regions 34A where the operating current flows in the thickness direction. The portions of the emitter layer 34 on which the emitter mesa layers 35 are not provided are depleted and are called ledge layers 34B. The ledge layers 34B serve as protection layers for reducing the occurrence of the electron hole recombination on the surface of the base layer 33.

The collector layer 32 is formed of n-type GaAs, for example, and has a thickness of about 1 The base layer 33 is formed of p-type GaAs, for example, and has a thickness of about 100 nm. The emitter layer 34 is formed of n-type InGaP, for example, and has a thickness of about 30 to 40 nm. The interface between the emitter layer 34 and the base layer 33 forms a heterojunction. The emitter mesa layers 35 are each formed in a double-layer structure constituted by a high-concentration n-type GaAs layer having a thickness of about 100 nm and a high-concentration n-type InGaAs layer having a thickness of about 100 nm.

The emitter electrodes E0 are disposed on the respective emitter mesa layers 35. A Ti film having a thickness of about 50 nm, for example, is used for the emitter electrodes E0. The emitter electrodes E0 are connected to the emitter mesa layers 35 based on ohmic connection.

A cavity is formed in the ledge layer 34B in a region sandwiched between the two emitter mesa layers 35. The base electrode B0 is disposed within this cavity. The base electrode B0 is connected to the base layer 33 based on ohmic connection. The base electrode B0 is constituted by a Ti film, a Pt film, and an Au film stacked on each other in this order.

A collector electrode C0 is disposed on the sub-collector layer 31 between two mesas, each of which is constituted by the collector layer 32, the base layer 33, and the emitter layer 34. The collector electrode C0 is constituted by an AuGe film, a Ni film, and an Au film stacked on each other in this order. The collector electrode C0 is connected to the sub-collector layer 31 based on ohmic connection. Two adjacent unit transistors 60 use the same collector electrode C0 disposed therebetween. The sub-collector layer 31 serves as a current path which connects the collector electrode C0 and the collector layer 32.

A first-layer insulating film 50 is formed to cover the mesa including the collector layer 32, the base layer 33, and the emitter layer 34, the emitter mesa layers 35, the emitter electrodes E0, the base electrode B0, and the collector electrode C0. A single SiN film or a multilayer film of a SiN film and a resin film, for example, is used for the first-layer insulating film 50.

On the first-layer insulating film 50, the first-layer emitter wiring E1 and a first-layer collector wiring C1 are disposed. The first-layer emitter wiring E1 is electrically connected to the emitter electrodes E0 via cavities formed in the first-layer insulating film 50. The first-layer collector wiring C1 is electrically connected to the collector electrode C0 via a cavity formed in the first-layer insulating film 50. The first-layer emitter wiring E1 and the first-layer collector wiring C1 each have a multilayer structure constituted by a Ti film having a thickness of about 50 nm and an Au film having a thickness of about 1 μm stacked on each other in this order.

A second-layer insulating film 51 is formed on the first-layer insulating film 50 to cover the first-layer emitter wiring E1 and the first-layer collector wiring C1. A single SiN film or a multilayer film of a SiN film and a resin film, for example, is used for the second-layer insulating film 51. The second-layer emitter wiring E2 is disposed on the second-layer insulating film 51. The second-layer emitter wiring E2 is constituted by a Ti film having a thickness of about 50 nm and an Au film having a thickness of about 4 μm stacked on each other in this order. The second-layer emitter wiring E2 is connected to the first-layer emitter wiring E1 via a cavity formed in the second-layer insulating film 51. The first-layer emitter wirings E1 disposed for the respective unit transistors 60 are connected to each other via the second-layer emitter wiring E2.

A third-layer insulating film 52 is formed to cover the second-layer emitter wiring E2. A single SiN film or a multilayer film of a SiN film and a resin film, for example, is used for the third-layer insulating film 52. Plural cavities 45 (only one cavity 45 is shown in FIG. 2) are formed in the third-layer insulating film 52. As shown in FIG. 1, the plural cavities 45 are located within the second-layer emitter wiring E2, as viewed from above. The second-layer emitter wiring E2 extends until the bottom surfaces of the cavities 45.

The pillar bump (metal member) 40 is disposed on the third-layer insulating film 52. The pillar bump 40 includes an under bump metal layer 41, which is the bottommost layer, a metal post 42, which is the intermediate layer, and a solder layer 43, which is the topmost layer, in this order. The pillar bump 40 is electrically connected to the second-layer emitter wiring E2 via the cavities 45.

A Ti film having a thickness of about 100 nm, for example, may be used for the under bump metal layer 41. The under bump metal layer 41 serves to enhance the adhesiveness of the pillar bump 40 to the third-layer insulating film 52. A metal material containing copper as a main constituent, for example, may be used for the metal post 42. A Cu film having a thickness of about 20 to 50 μm, for example, may be used as the metal post 42. A Sn film having a thickness of 30 μm, for example, may be used for the solder layer 43. A mutual-diffusion-preventing barrier metal layer may be disposed between the metal post 42 and the solder layer 43. Ni, for example, may be used for this barrier metal layer.

In each of the unit transistors 60, a large number of electrons are implanted from the emitter regions 34A into the base layer 33. Most of the electrons implanted into the base layer 33 are transported mainly in the thickness direction of the collector layer 32 and reach the sub-collector layer 31. At this time, Joule heating occurs due to a voltage drop in the base layer 33 and the collector layer 32. The portions of the emitter layer 34, the base layer 33, and the collector layer 32 immediately under the emitter mesa layers 35 operate as the operating regions 61 and generate heat. As viewed from above, the outer edge lines of the operating regions 61 coincide with those of the emitter mesa layers 35.

The configuration of the semiconductor apparatus that is not shown in the sectional view of FIG. 2 will be discussed below with reference to FIG. 3. Because of the increased resistance of a part of the sub-collector layer 31, an isolation region 31A is formed. In this specification, the sub-collector layer 31 is a region other than the isolation region 31A. A mesa constituted by the collector layer 32, the base layer 33, and the emitter layer 34 is disposed on the sub-collector layer 31 surrounded by the isolation region 31A.

The first-layer base wiring B1 is disposed on the first-layer insulating film 50. The first-layer base wiring B1 is electrically connected to the base electrode B0 via a cavity formed in the first-layer insulating film 50.

The positional relationships among the pillar bump 40, the cavities 45, and the operating regions 61 will be discussed below. For each unit transistor 60, the centroid PA (FIG. 1) of the operating regions 61 is defined. The centroid PA corresponds to the center of gravity of the two operating regions 61 included in each unit transistor 60. That is, focusing on one unit transistor 60, the area of the operating region 61 on the positive side of the x axis with respect to the centroid PA is equal to that on the negative side of the x axis. The area of the operating region 61 on the positive side of the y axis with respect to the centroid PA is equal to that on the negative side of the y axis. In this specification, the centroid of the two operating regions 61 included in one unit transistor 60 will simply be called the centroid PA of the operating region 61.

The centroid PO of each cavity 45 is defined. The centroid PO corresponds to the center of gravity of each cavity 45. If the planar configuration of the cavity 45 is substantially a rectangle, the centroid PO coincides with the point of the intersection of the two diagonal lines of the rectangle.

The plural unit transistors 60 are arranged side by side in the x-axis direction (direction perpendicular to the longitudinal direction of the operating region 61). The plural cavities 45 are also arranged side by side in the x-axis direction. The centroid PO of each cavity 45 is displaced from the centroid PA of the operating region 61 in the x-axis direction.

The amount of deviation between the centroid PA of the operating region 61 of the unit transistor 60 positioned at the left end in the x-axis direction and the centroid PO of the cavity 45 positioned most adjacent to this unit transistor 60 is indicated by Dx1. The amount of deviation between the centroid PA of the operating region 61 of the unit transistor 60 positioned at the right end in the x-axis direction and the centroid PO of the cavity 45 positioned most adjacent to this unit transistor 60 is indicated by Dx4. The amount of deviation between the centroid PA of the operating region 61 of the second unit transistor 60 from the left end and the centroid PO of the cavity 45 positioned most adjacent to this unit transistor 60 is indicated by Dx2. The amount of deviation between the centroid PA of the operating region 61 of the third unit transistor 60 from the left end and the centroid PO of the cavity 45 positioned most adjacent to this unit transistor 60 is indicated by Dx3. The amounts of deviation Dx1 and Dx4 are greater than the amounts of deviation Dx2 and Dx3.

The centroid PO of the cavity 45 is displaced from the centroid PA of the operating region 61 in the y-axis direction as well as in the x-axis direction.

Advantages achieved by the configuration of the semiconductor apparatus according to the first embodiment will be discussed below.

In the first embodiment, the operating regions 61 of each unit transistor 60 are disposed within the pillar bump 40, as viewed from above in FIG. 1. In the sectional views of FIGS. 2 and 3, the pillar bump 40 is disposed immediately above the operating regions 61 of each unit transistor 60. With this configuration, the distance from the operating regions 61 to the pillar bump 40 becomes shorter than that in the configuration in which the pillar bump 40 is displaced from a position immediately above the operating regions 61.

The pillar bump 40 serves as a heat path for dissipating the heat generated in the operating regions 61 to the outside. The decreased distance from the operating regions 61 to the pillar bump 40 enhances the heat dissipation.

The operating regions 61 are disposed such that they entirely overlap with the pillar bump 40, as viewed from above. This configuration makes it possible to decrease the chip area of the semiconductor apparatus compared with the configuration in which the operating regions 61 extend to the outside of the pillar bump 40, thereby achieving a cost reduction.

The configuration of the semiconductor apparatus according to the first embodiment also makes it possible to reduce the thermal stress produced in the unit transistors 60. This advantage will be discussed below.

The thermal stress is produced due to the difference between the coefficient of thermal expansion of semiconductor layers, such as the emitter layer 34 (FIG. 2), and that of the pillar bump 40. The coefficient of thermal expansion of a metal forming the pillar bump 40 is greater than that of GaAs (about 6 ppm/° C.). For example, the coefficient of thermal expansion of Cu is about 17 ppm/° C. and that of Sn solder is about 22 ppm/° C. The coefficient of thermal expansion of a printed substrate (about 15 to 20 ppm/° C.) for mounting the semiconductor apparatus thereon is greater than that of GaAs.

Separating the centroid PO of the cavity 45 farther from the centroid PA of the operating region 61 makes the third-layer insulating film 52 intervene between the emitter layer 34 and the pillar bump 40. For example, as shown in FIG. 2, the third-layer insulating film 52 intervenes between the unit transistor 60 on the left side and the pillar bump 40. The third-layer insulating film 52 serves as a stress absorber to reduce the thermal stress produced in the semiconductor layers of the unit transistor 60. Crystal defects produced due to the thermal stress decrease the current amplification factor in a short period of time. In the first embodiment, the thermal stress is reduced, and the reliability is thus less likely to be decreased even under high-temperature operation. The magnitudes of the thermal stress produced in the plural unit transistors 60 vary because the positional relationship of the unit transistor 60 to the pillar bump 40 is different among the plural unit transistors 60. Regarding a unit transistor 60 located at a position where the thermal stress is less likely to produce, the emitter layer 34 of this unit transistor 60 may be disposed within the cavity 45, as viewed from above.

In most cases, the coefficient of thermal expansion of the material for the third-layer insulating film 52 is smaller than that of the material for the pillar bump 40 and that of a semiconductor material, such as GaAs. For example, the coefficient of thermal expansion of SiN for the third-layer insulating film 52 is about 2 to 3 ppm/° C. A material having a smaller coefficient of thermal expansion than that of a semiconductor material for the operating regions 61 of the unit transistor 60 is used for the third-layer insulating film 52, thereby exhibiting a noticeable effect of absorbing thermal stress.

In particular, the thermal stress produced in the semiconductor layers, such as the emitter layer 34, of the two unit transistors 60 positioned at both ends in the x-axis direction tends to be greater than that in the other unit transistors 60. In the first embodiment, the amounts of deviation Dx1 and Dx4 between the centroids PA of the operating regions 61 of the unit transistors 60 at both ends and the centroid PO of the corresponding cavities 45 are greater than the amounts of deviation Dx2 and Dx3 in the operating regions 61 of the other unit transistors 60. This can enhance the effect of reducing the thermal stress produced in the semiconductor layers of the unit transistors 60 at both ends. As a result, the magnitudes of thermal stress produced in the semiconductor layers of the plural unit transistors 60 can substantially be equalized, and the reliability of the overall semiconductor apparatus is less likely to be decreased.

With the configuration of the semiconductor apparatus according to the first embodiment, the heat dissipation from the operating regions 61 can be controlled for each unit transistor 60. This advantage will be discussed below.

The heat generated in the operating regions 61 (FIG. 2) is dissipated outside mainly via the emitter electrodes E0, the first-layer emitter wiring E1, the second-layer emitter wiring E2, and the pillar bump 40. Separating the centroid PO of the cavity 45 farther from the centroid PA of the operating region 61 makes the third-layer insulating film 52 intervene between the first-layer emitter wiring E1 and the pillar bump 40. For example, as shown in FIG. 2, the third-layer insulating film 52 is not interposed between the pillar bump 40 and the most part of the first-layer emitter wiring E1 connected to the unit transistor 60 on the right side. In contrast, as shown in FIG. 2, the third-layer insulating film 52 is interposed between the pillar bump 40 and the entirety of the first-layer emitter wiring E1 connected to the unit transistor 60 on the left side.

The thermal conductivity of SiN or resin used for the third-layer insulating film 52 is lower than that of a metal used for the wiring or the pillar bump 40. Accordingly, the thermal resistance of the area from the operating regions 61 of the left-side unit transistor 60 to the pillar bump 40 becomes higher than that of the area from the operating regions 61 of the right-side unit transistor 60 to the pillar bump 40. As a result, the heat dissipation from the operating regions 61 of the left-side unit transistor 60 becomes lower than that from the operating regions 61 of the right-side unit transistor 60. Usually, as the amount of deviation of the centroid PA of the operating region 61 of the unit transistor 60 from the centroid PO of the cavity 45 positioned most adjacent to this unit transistor 60 is greater, the heat dissipation from this operating region 61 becomes lower.

As shown in FIG. 1, the unit transistors 60 other than those located at both ends are sandwiched between other unit transistors 60 in the x-axis direction. The operating regions 61 of such inner-side unit transistors 60 are thus more likely to be at a higher temperature than those of the unit transistors 60 at both ends.

In the first embodiment, the amounts of deviation Dx2 and Dx3 are smaller than the amounts of deviation Dx1 and Dx4. For each of the plural unit transistors 60, the cavity 45 whose centroid PO is positioned most closely to the centroid PA of the operating region 61 of a given unit transistor 60 is defined as the closest proximity cavity 45 for this unit transistor 60. In this case, the amount of deviation of the centroid PA of the operating region 61 of the unit transistor 60 from the centroid PO of the closest proximity cavity 45 in the x-axis direction becomes greater from the center to the ends of the arrangement direction of the plural unit transistors 60. Consequently, the heat dissipation from the operating regions 61 of the two inner-side unit transistors 60 is higher than that from the operating regions 61 of the two unit transistors 60 at both ends. The heat dissipation from the operating regions 61 where the temperature is likely to rise is relatively high. It is thus possible to reduce the variations in the temperatures of the operating regions 61 of the plural unit transistors 60. Conducting simulations or evaluation experiments by using different combinations of the amounts of deviation Dx1, Dx2, Dx3, and Dx4 can determine suitable amounts of deviation to substantially equalize the temperatures of the plural operating regions 61. This makes it possible to maintain the radio-frequency characteristics of the semiconductor apparatus.

In the semiconductor apparatus including the parallel-connected unit transistors 60 which operate together, the life of the unit transistors 60 where the temperature is likely to rise is relatively short. This also makes the life of the overall semiconductor apparatus short. Equalizing the temperatures of the operating regions 61 of the plural unit transistors 60 can prolong the life of the overall semiconductor apparatus.

In the first embodiment, no cavities 45 are formed outside the centroids PA of the operating regions 61 of the two unit transistors 60 located at both ends in the x-axis direction. Arranging the cavities 45 in this manner increases the heat dissipation from the operating regions 61 of the inner-side unit transistors 60 to be higher than that of the unit transistors 60 at both ends.

The advantages achieved by employing the configuration in which the centroid PO of the cavity 45 is displaced from the centroid PA of the operating region 61 of the unit transistor 60 in the x-axis direction have been validated by conducting the simulations. The simulations will be discussed below with reference to FIGS. 4A through 5B. The subject of the simulations is unit transistors 60 each including one operating region 61.

Figure 4A:
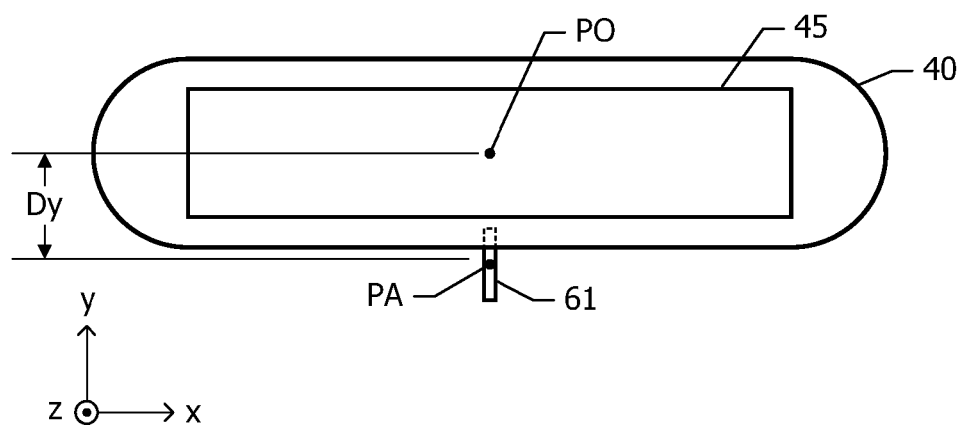
FIG. 4A is a plan view illustrating the positional relationships among an operating region of a unit transistor, a cavity, and a pillar bump of a semiconductor apparatus according to a comparative example.

FIG. 4A is a plan view illustrating the positional relationships among an operating region 61 of a unit transistor 60, a cavity 45, and a pillar bump 40 of a semiconductor apparatus according to a comparative example. The planar configuration of the pillar bump 40 is a race-track shape formed in the following manner. Semicircles having a diameter of about 75 μm are connected to the longitudinal ends of a rectangle having a length of about 240 μm in the x-axis direction and a width of about 75 μm in the y-axis direction. The dimensions of the operating region 61 are about 4 μm in the x-axis direction and about 30 μm in the y-axis direction. The dimensions of the cavity 45 are about 240 μm in the x-axis direction and about 51 μm in the y-axis direction. The position of the centroid PA of the operating region 61 and the centroid PO of the cavity 45 coincide with each other in the x-axis direction and are displaced from each other in the y-axis direction. The absolute value of the amount of deviation between the centroid PA and the centroid PO in the y-axis direction is indicated by Dy.

Figure 4B:
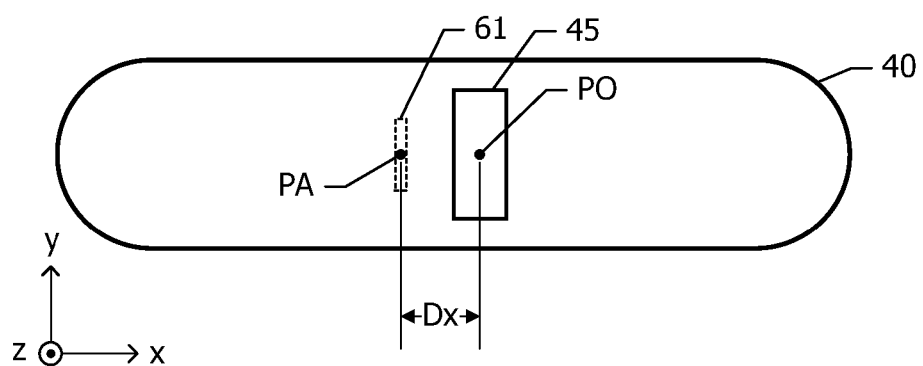
FIG. 4B is a plan view illustrating the positional relationships among an operating region of a unit transistor, a cavity, and a pillar bump of a semiconductor apparatus according to an embodiment.

FIG. 4B is a plan view illustrating the positional relationships among an operating region 61 of a unit transistor 60, a cavity 45, and a pillar bump 40 of a semiconductor apparatus according to an embodiment. The configuration and the dimensions of the pillar bump 40 and those of the operating region 61 are the same as those of the semiconductor apparatus shown in FIG. 4A. The dimensions of the cavity 45 are about 20 μm in the x-axis direction and about 50 μm in the y-axis direction. The position of the centroid PA of the operating region 61 and the centroid PO of the cavity 45 coincide with each other in the y-axis direction and are displaced from each other in the x-axis direction. The absolute value of the amount of deviation between the centroid PA and the centroid PO in the x-axis direction is indicated by Dx.

In the simulations, thermal stress produced in the emitter regions 34A (FIGS. 2 and 3) when the temperature of each semiconductor apparatus was about 150° C. was found. Thermal resistance in the area from the emitter regions 34A to the pillar bump 40 was also found.

Figure 5A:
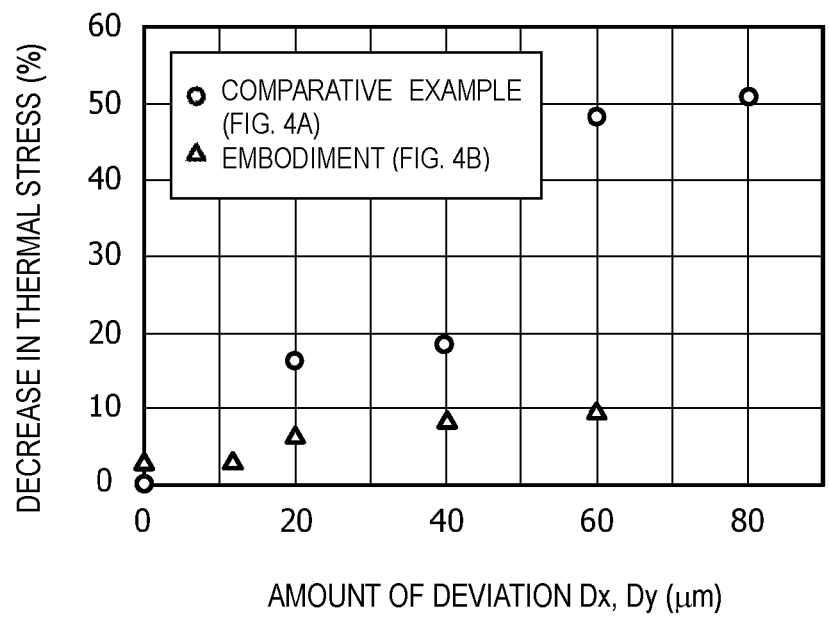
FIG. 5A is a graph illustrating the relationship between the amounts of deviation Dx and Dy and a decrease in the thermal stress produced in the emitter regions.

FIG. 5A is a graph illustrating the relationship between the amounts of deviation Dx and Dy and a decrease in thermal stress produced in the emitter regions 34A. The horizontal axis of the graph indicates the amounts of deviation Dx and Dy by "μm", and the vertical axis indicates a decrease in thermal stress by "%". The circles in the graph represent the calculation results of a decrease in thermal stress in the comparative example (FIG. 4A), while the triangles represent the calculation results of a decrease in thermal stress in the embodiment (FIG. 4B). The value of thermal stress produced in the semiconductor apparatus of the comparative example (FIG. 4A) when the amount of deviation Dy is 0 is set as a reference value. A decrease in thermal stress is represented by the ratio of the amount of decrease from the reference value to the reference value.

FIG. 5A shows that, in the semiconductor apparatus of the comparative example (FIG. 4A), as the amount of deviation Dy increases, the thermal stress is reduced to a smaller level. FIG. 5A also shows that, in the semiconductor apparatus of the embodiment (FIG. 4B), as the amount of deviation Dx increases, the thermal stress is reduced to a smaller level, though the degree of a decrease is smaller than that in the comparative example.

Figure 5B:
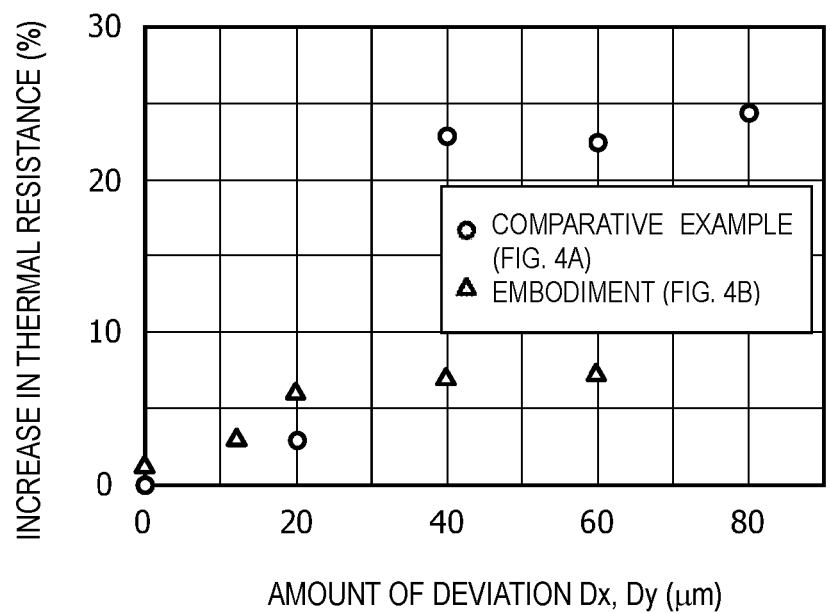
FIG. 5B is a graph illustrating the relationship between the amounts of deviation Dx and Dy and an increase in the thermal resistance.

FIG. 5B is a graph illustrating the relationship between the amounts of deviation Dx and Dy and an increase in thermal resistance. The horizontal axis of the graph indicates the amounts of deviation Dx and Dy by "µm", and the vertical axis indicates an increase in thermal resistance by "%". The circles in the graph represent the calculation results of an increase in thermal resistance in the comparative example (FIG. 4A), while the triangles indicate the calculation results of an increase in thermal resistance in the embodiment (FIG. 4B). The value of the thermal resistance observed in the semiconductor apparatus of the comparative example (FIG. 4A) when the amount of deviation Dy is 0 is set as a reference value. An increase in thermal resistance is represented by the ratio of the amount of increase from the reference value to the reference value. FIG. 5B shows that, as the amounts of deviation Dx and Dy increase, the thermal resistance rises to a higher level. The simulation results show that the thermal resistance can be controlled by changing the amount of deviation of the centroid PO of the cavity 45 from the centroid PA of the operating region 61 in the x-axis direction or in the y-axis direction.

Modified examples of the first embodiment will be discussed below. In the first embodiment, the emitter electrodes E0 are disposed between the emitter mesa layers 35 (FIG. 2) and the first-layer emitter wiring E1 (FIG. 2). The first-layer emitter wiring E1 may alternatively directly contact with the emitter mesa layers 35. In this case, the provision of the emitter electrodes E0 is omitted, and the first-layer emitter wiring E1 also serves as the function of an emitter electrode.

In the first embodiment, as shown in FIG. 1, the centroid PO of each cavity 45 is displaced from the centroid PA of the operating region 61 of the corresponding unit transistor 60 in the x-axis direction. However, it is sufficient if the centroid PO of at least one cavity 45 is displaced from the centroid PA of the operating region 61 of the corresponding unit transistor 60. "Being displaced in the x-axis direction" means that the centroid PO is displaced from the centroid PA such that a vector starting from the centroid PA until the centroid PO contains x components.

In the first embodiment, two cavities 45 are provided to connect the pillar bump 40 and the second-layer emitter wiring E2. However, the provision of at least one cavity 45 is sufficient.

Although the pillar bump 40 is used as an external connection bump in the first embodiment, another type of bump, such as a solder bump or a stud bump, may alternatively be used. Although the planar configuration of the emitter layer 34 and that of the emitter mesa layers 35 (FIGS. 1 through 3) are substantially a rectangle in the first embodiment, they may be formed in another shape, such as a circle, an ellipse, a hexagon, or an octagon.

Although InGaP is used for the emitter layer 34 and GaAs is used for the base layer 33 in the first embodiment, other types of compound semiconductors may be used. Examples of the combination of the material for the emitter layer 34 and that for the base layer 33 are AlGaAs/GaAs, InP/InGaAs, InGaP/GaAsSb, InGaP/InGaAsN, Si/SiGe, and AlGaN/GaN. In any of the combinations, the emitter-base interface is a heterojunction.

Although the semiconductor apparatus of the first embodiment includes four unit transistors 60, as shown in FIG. 1, it may include any other plural number of unit transistors 60.

Second Embodiment

A semiconductor apparatus according to a second embodiment will be described below with reference to FIG. 6. An explanation of the elements configured in the same manner as those of the first embodiment will be omitted.

FIG. 6 is a plan view illustrating the layout of the elements forming the semiconductor apparatus according to the second embodiment. In the second embodiment, three unit transistors 60 are arranged in the x-axis direction. However, four unit transistors 60 may be provided, as in the first embodiment, or two or five or more unit transistors 60 may be provided. In the first embodiment, one unit transistor 60 includes two emitter regions 34A (FIGS. 1 and 2). In the second embodiment, one unit transistor 60 includes one emitter region 34A, that is, one unit transistor 60 includes one operating region 61. The operating region 61 is defined by the outer edge lines of the emitter region 34A for each unit transistor 60. In FIG. 6, the operating regions 61 are indicated by the hatched portions with high-density right-downward lines.

As in the first embodiment, the planar configuration of the emitter region 34A is substantially a rectangle elongated in the y-axis direction. The main portion of the base electrode B0 is disposed next to the emitter region 34A in the x-axis direction. Although the planar configuration of the base electrode B0 is a T-like shape in the first embodiment, it is an L-like shape in the second embodiment.

In the first embodiment, the centroid PA of the operating region 61 of the unit transistor 60 is positioned at the center of the two operating regions 61. In the second embodiment, one unit transistor 60 includes one operating region 61, and the centroid PA of the operating region 61 is located at the center of gravity of the operating region 61. That is, the centroid PA of the operating region 61 is located at the point of intersection of the two diagonal lines of the rectangular operating region 61. One cavity 45 is formed within the pillar bump 40, as viewed from above. In FIG. 6, the cavity 45 is indicated by the hatched portion with low-density right-upward lines. In the second embodiment, as well as in the first embodiment, the centroid PO of the cavity 45 is displaced from the centroid PA of the operating region 61 in the x-axis direction.

The positional relationship between the operating region 61 and the cavity 45 in the second embodiment is similar to that in the first embodiment. Advantages similar to those of the first embodiment are thus achieved in the second embodiment.

Third Embodiment

A semiconductor apparatus according to a third embodiment will be described below with reference to FIGS. 7 through 11. An explanation of the elements configured in the same manner as those of the first embodiment will be omitted. The semiconductor apparatus of the third embodiment is a power amplifier module using the plural unit transistors 60 (FIG. 1) of the first embodiment as amplifiers.

Figure 7:
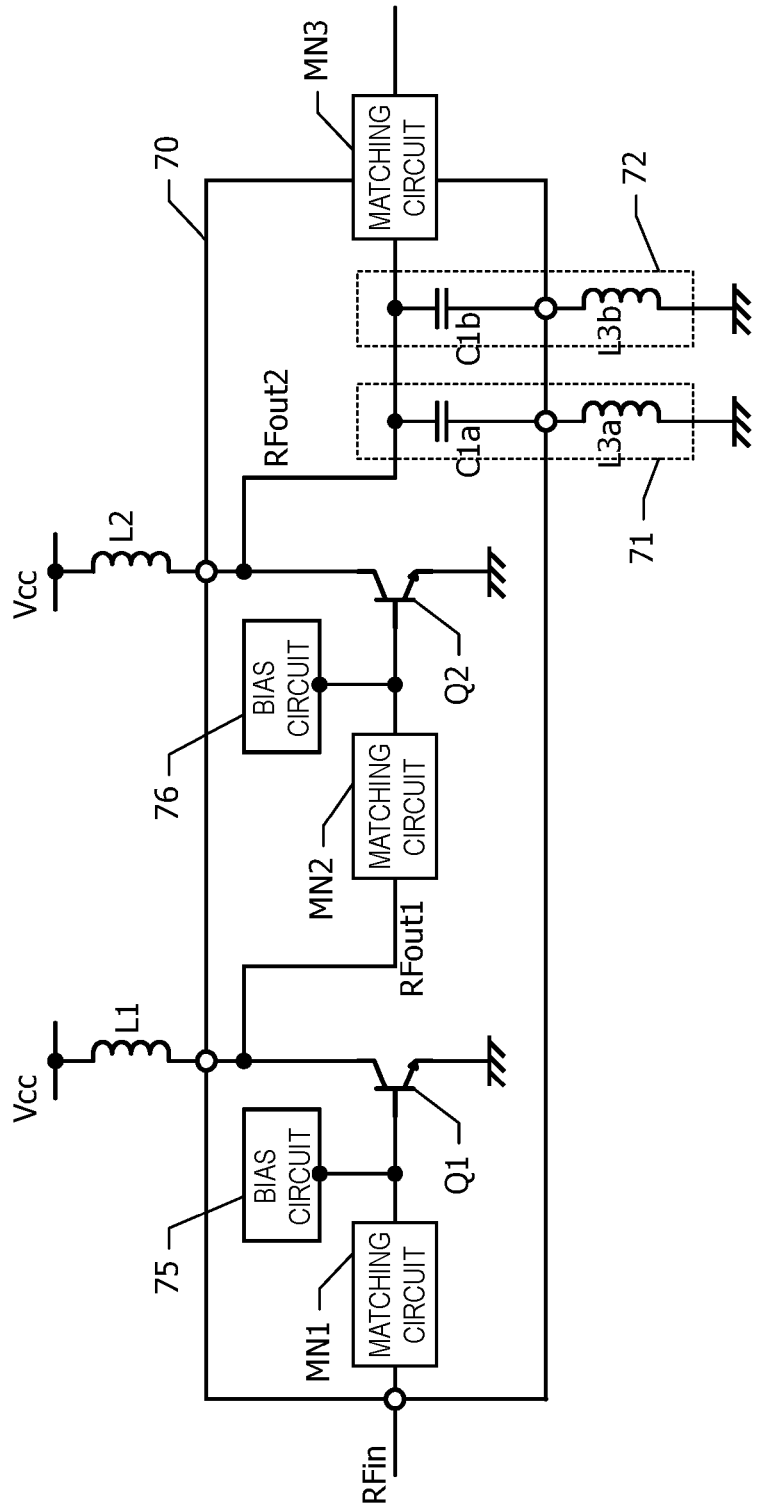
FIG. 7 is an equivalent circuit diagram of a power amplifier circuit implemented by a semiconductor apparatus according to a third embodiment.

FIG. 7 is an equivalent circuit diagram of a power amplifier circuit implemented by the semiconductor apparatus according to the third embodiment. The power amplifier circuit in the third embodiment amplifies an input signal in a radio-frequency band and outputs an amplified signal. The frequency of the input signal is in a range of several hundreds of megahertz (about 600 MHz, for example) to several dozens of gigahertz (60 GHz, for example).

The power amplifier circuit using the semiconductor apparatus according to the third embodiment includes transistors Q1 and Q2, matching circuits MN1, MN2, and MN3, filter circuits 71 and 72, bias circuits 75 and 76, and inductors L1 and L2. The transistor Q1 forms a first-stage (drive-stage) power amplifier circuit, while the transistor Q2 forms a second-stage (power-stage) power amplifier circuit. The transistors Q1 and Q2 are each formed such that the plural unit transistors 60 are connected in parallel with each other, as in the semiconductor apparatus of the first or second embodiment.

A power supply voltage Vcc is supplied to the collector of the transistor Q1 via the inductor L1, while a power supply voltage Vcc is supplied to the collector of the transistor Q2 via the inductor L2. The emitters of the transistors Q1 and Q2 are grounded. A bias current or a bias voltage is supplied to the base of the transistor Q1 from the bias circuit 75, while a bias current or a bias voltage is supplied to the base of the transistor Q2 from the bias circuit 76.

An input signal RFin is supplied to the base of the transistor Q1 via the matching circuit MN1. The transistor Q1 amplifies the input signal RFin and outputs an amplified signal RFout1 from the collector. The amplified signal RFout1 is supplied to the base of the transistor Q2 via the matching circuit MN2. The transistor Q2 amplifies the amplified signal RFout1 and outputs an amplified signal RFout2 from the collector. The amplified signal RFout2 is supplied to an external circuit via the matching circuit MN3.

The filter circuits 71 and 72 are each connected between a ground and a transmission line which connects the collector of the transistor Q2 and the matching circuit MN3. The filter circuit 71 is a series resonance circuit including a capacitor C1a and an inductor L3a connected in series with each other. The filter circuit 72 is a series resonance circuit including a capacitor C1b and an inductor L3b connected in series with each other. The filter circuits 71 and 72 each serve as a harmonic terminating circuit that attenuates the frequency components in a harmonic band contained in the amplified signal RFout2. The harmonic terminating circuit adjusts the impedance so that the impedance of a subject harmonic (impedance of a second order harmonic or a third order harmonic) will become short or open unlike the impedance of fundamental waves. Setting or adjusting of the impedance of a certain order of harmonic separately from the impedance of the fundamental waves can attenuate the harmonic components. The circuit constants of the capacitors C1a and C1b and the inductors L3a and L3b of the filter circuits 71 and 72 are selected so that the resonant frequency substantially matches the frequency of a harmonic, such as the frequency of the second order harmonic or the third order harmonic, of the amplified signal RFout2.

The transistors Q1 and Q2, the matching circuits MN1 and MN2, the bias circuits 75 and 76, the capacitors C1a and C1b of the filter circuits 71 and 72, and a part of the matching circuit MN3 are formed within a single semiconductor chip 70. The inductors L1 and L2, the inductors L3a and L3b of the filter circuits 71 and 72, and the remaining part of the matching circuit MN3 are formed or mounted on a mounting substrate for mounting the semiconductor chip 70 thereon. The inductors L3a and L3b of the filter circuits 71 and 72 are implemented by wiring containing the inductance components formed in or on the mounting substrate.

Figure 8:
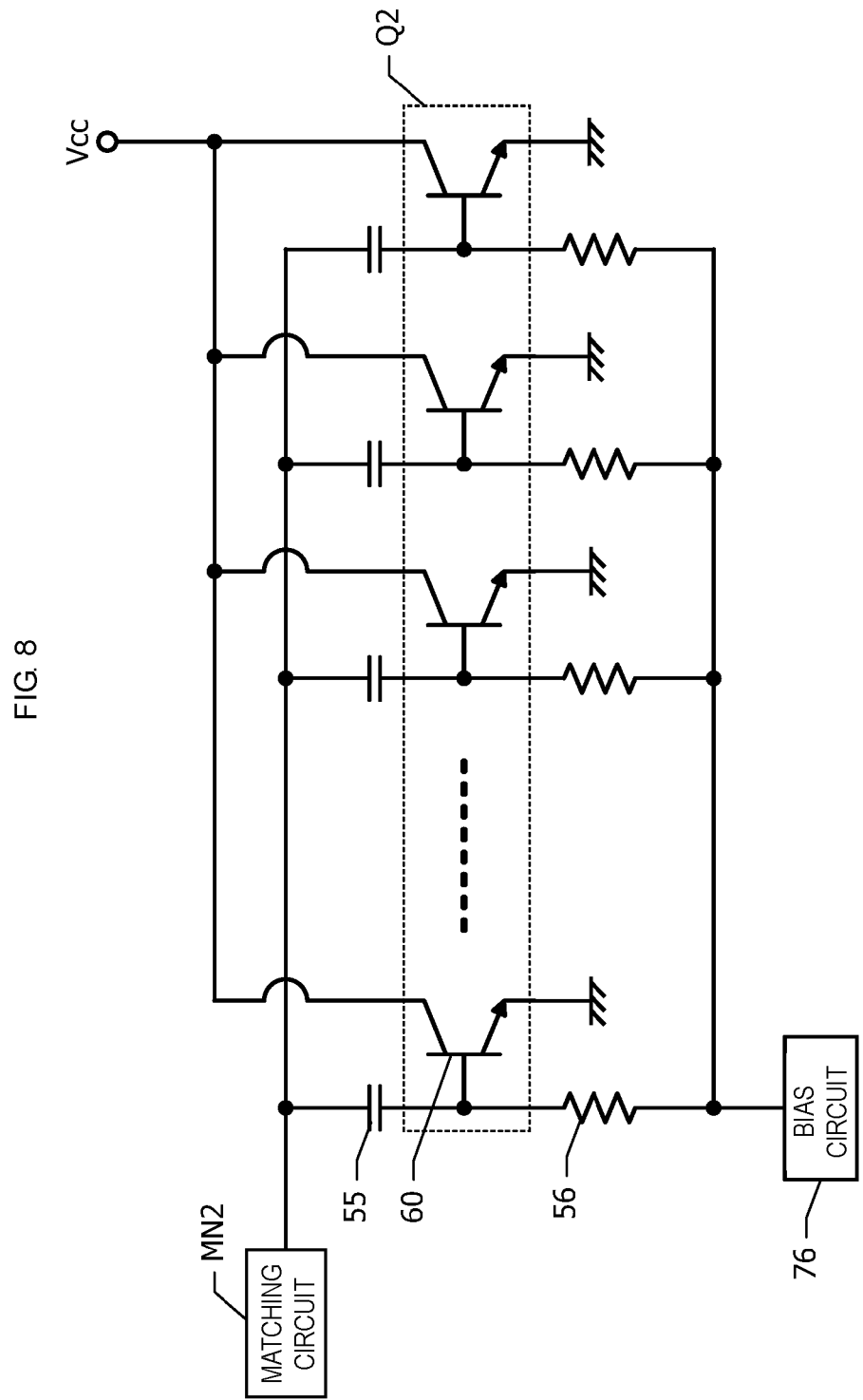
FIG. 8 is an equivalent circuit diagram of a transistor Q2 and its peripheral circuit.

FIG. 8 is an equivalent circuit diagram of the transistor Q2 and its peripheral circuit. The transistor Q2 is constituted by plural unit transistors 60 connected in parallel with each other, as in the semiconductor apparatus of the first or second embodiment. A capacitor 55 and a ballast resistor 56 are connected to the base of each of the plural unit transistors 60. The capacitor 55 and the ballast resistor 56 correspond to the counterparts shown in FIG. 1.

A radio-frequency signal passing through the matching circuit MN2 is supplied to the bases of the unit transistors 60 via the corresponding capacitors 55. A bias current or a bias voltage is supplied to the bases of the unit transistors 60 from the bias circuit 76 via the corresponding ballast resistors 56. The collectors of the unit transistors 60 are connected to the power supply voltage Vcc in a direct current (DC) range. The emitters of the unit transistors 60 are grounded.

FIG. 9 is a plan view illustrating the layout of the devices on the semiconductor chip 70 forming the semiconductor apparatus according to the third embodiment. The planar configuration of the semiconductor chip 70 is substantially a rectangle having two sides parallel with each other in the x-axis direction and two sides parallel with each other in the y-axis direction. Pillar bumps 81, 82, and 83 elongated in the x-axis direction are provided on the semiconductor chip 70.

The pillar bump 81 is connected to the emitters of four unit transistors 60 forming the transistor Q1 (FIG. 7). The transistor Q2 is constituted by two sets of unit transistors 60, each set including ten unit transistors 60. The unit transistors 60 of each set are connected in parallel with each other. The emitters of the ten unit transistors 60 of one set are connected to the pillar bump 82, and the emitters of the ten unit transistors 60 of the other set are connected to the pillar bump 83.

The pillar bumps 82 and 83 have the same planar configuration and the same dimensions and are disposed with a space therebetween in the y-axis direction. The pillar bump 81 is shorter than the pillar bumps 82 and 83. This is because fewer unit transistors 60 are connected to the pillar bump 81 than those connected to each of the pillar bumps 82 and 83.

The capacitors C1a and C1b forming the filter circuits 71 and 72 (FIG. 7) are disposed on the semiconductor chip 70. On-chip capacitors formed on the semiconductor chip 70 are used as the capacitors C1a and C1b. It is now assumed that the right end of the arrangement direction of the unit transistors 60 connected to the pillar bump 82 or 83 is a first end, while the left end is a second end. The capacitor C1a is disposed at a position closer to the unit transistor 60 at the second end. The capacitor C1b is disposed at a position closer to the unit transistor 60 at the first end.

That is, the capacitors C1a and C1b are disposed closely to the unit transistors 60 positioned at the opposite ends of the arrangement direction (x-axis direction) of the plural unit transistors 60. For example, the capacitors C1a and C1b are located symmetrically with each other with respect to the center line of the semiconductor chip 70 in the x-axis direction.

The capacitor C1a is connected to a circular pillar bump 84 via wiring formed on the semiconductor chip 70. When the semiconductor chip 70 is mounted on a mounting substrate, the capacitor C1a is electrically connected to the inductor L3a on the mounting substrate via the pillar bump 84. Likewise, the capacitor C1b is electrically connected to the inductor L3b on the mounting substrate via a circular pillar bump 85.

Plural circular pillar bumps 86 are also provided on the semiconductor chip 70. Some pillar bumps 86 are connected to the collectors of the transistors Q1 and Q2 (FIG. 7), and some pillar bumps 86 are connected to the matching circuits MN1 and MN3 (FIG. 7). The planar configuration of the pillar bump 86 connected to the transistor Q2 may be formed in a substantially rectangular shape.

Figure 10A:
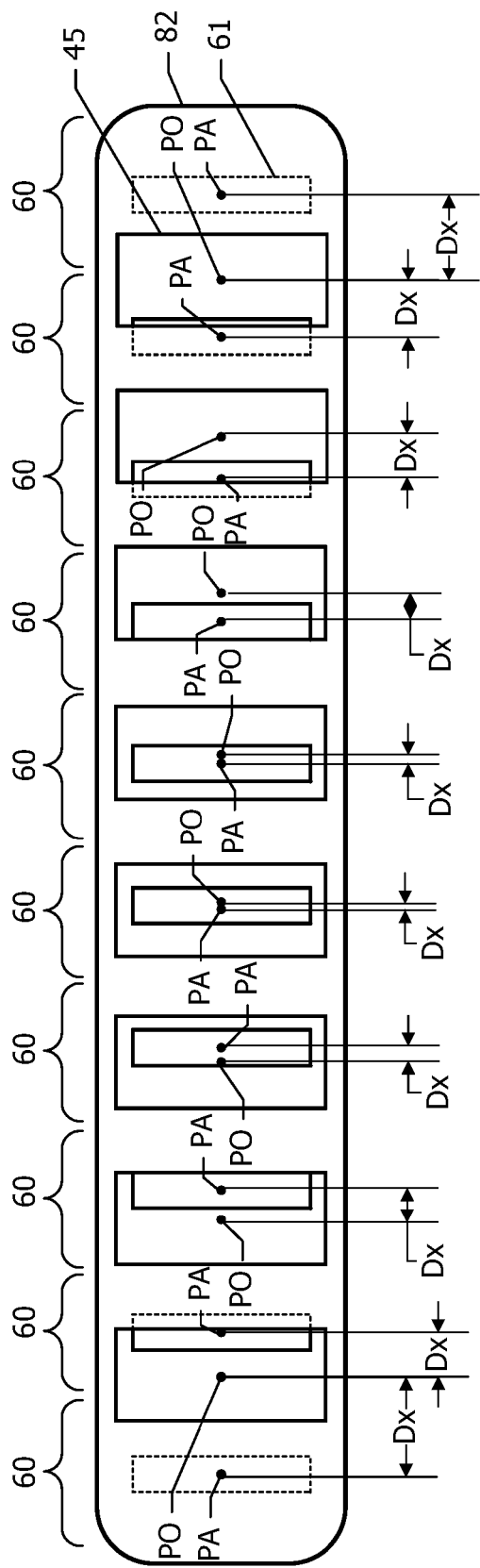
FIG. 10A illustrates the positional relationships among a pillar bump, operating regions of plural unit transistors connected to the pillar bump, and plural cavities.

FIG. 10A illustrates the positional relationships among the pillar bump 82, the operating regions 61 of the plural (ten) unit transistors 60 connected to the pillar bump 82, and the plural cavities 45. The ten operating regions 61 and the eight cavities 45 are arranged in the x-axis direction. Although each unit transistor 60 includes one operating region 61 in FIG. 10A, as in the configuration in FIG. 6, it may include two operating regions 61, as in the configuration in FIG. 1.

The amount of deviation in the x-axis direction between the centroid PA of each operating region 61 and the centroid PO of the cavity 45 most adjacent to the corresponding operating region 61 (hereinafter called the amount of deviation of the closest proximity cavity 45) is indicated by Dx. The amount of deviation Dx of the closest proximity cavity 45 is set for each unit transistor 60. The centroid PO of each cavity 45 is displaced from the centroid PA of the corresponding operating region 61. That is, the amount of deviation Dx of the closest proximity cavity 45 is not 0. All the cavities 45 are positioned farther inward than the centroids PA of the operating regions 61 of the unit transistors 60 located at both ends, and no cavities 45 are formed outside the centroids PA of the operating regions 61 of these unit transistors 60.

The amounts of deviation Dx of the closest proximity cavities 45 with respect to the unit transistors 60 at both ends are greater than those with respect to the eight inner-side unit transistors 60. The amount of deviation Dx of the closest proximity cavity 45 becomes greater from the center to the ends of the arrangement direction of the plural unit transistors 60.

Regarding the pillar bumps 81 and 83 (FIG. 9), the positional relationships among the pillar bumps 81 and 83, the operating regions 61 of the plural unit transistors 60 connected to the pillar bumps 81 and 83, and the plural cavities 45 are similar to those of the pillar bump 82. The shape and the dimensions of the cavities 45 disposed within the pillar bumps 81, 82, and 83 are the same.

Figure 10B:
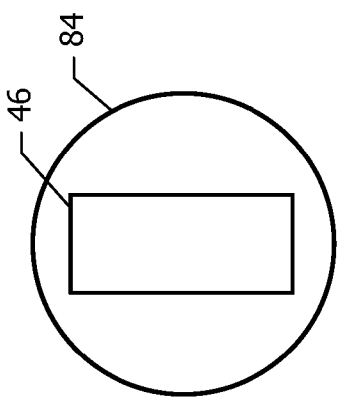
FIG. 10B illustrates the positional relationship between a circular pillar bump and a cavity disposed under the pillar bump.

FIG. 10B illustrates the positional relationship between the circular pillar bump 84 and a cavity 46 disposed under the pillar bump 84. The pillar bump 84 is electrically connected to wiring under the pillar bump 84 via the cavity 46. One cavity 46 is formed for the single pillar bump 84. Cavities are similarly formed for the circular pillar bumps 85 and 86 (FIG. 9).

The shape and the dimensions of the cavity 46 provided for the circular pillar bump 84 and those for the circular pillar bumps 85 and 86 are the same as those of the cavities 45 provided for the pillar bumps 81, 82, and 83 (FIG. 9) elongated in the x-axis direction.

Figure 11:
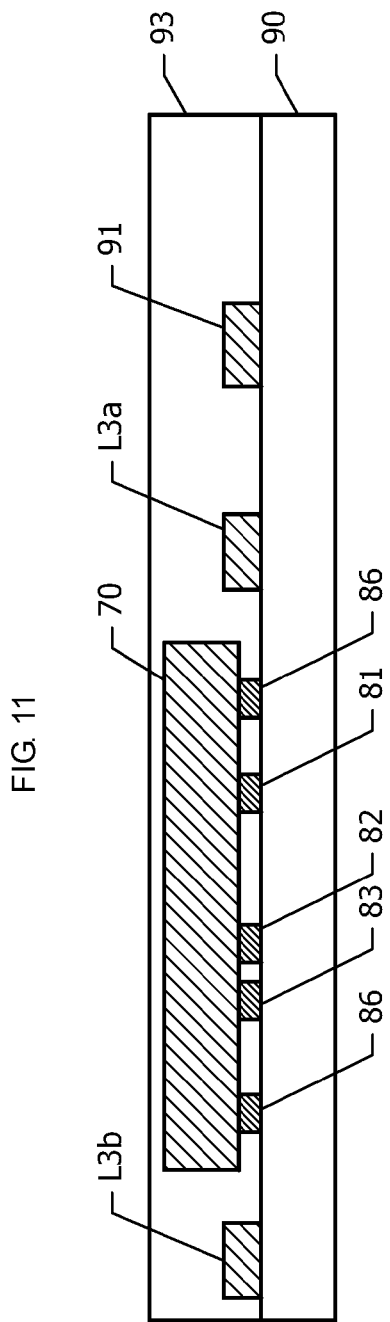
FIG. 11 is a sectional view of the semiconductor apparatus according to the third embodiment.

FIG. 11 is a sectional view of the semiconductor apparatus according to the third embodiment. The semiconductor chip 70 is soldered to a mounting substrate 90 via the pillar bumps 81, 82, 83, and 86. An alumina, ceramic, or epoxy printed substrate is used as the mounting substrate 90. On the mounting substrate 90, the inductors L3a and L3b (FIG. 9) and a surface mounting device 91, as well as the semiconductor chip 70, are mounted. The semiconductor chip 70, the inductors L3a and L3b, and the surface mounting device 91 are sealed with a sealing resin 93. A surface mounting capacitor may be mounted on the mounting substrate 90 if necessary.

Advantages achieved by the configuration of the semiconductor apparatus according to the third embodiment will be discussed below.

In the third embodiment, as shown in FIG. 10A, the positional relationships among the pillar bump 82, the operating regions 61 of the unit transistors 60 connected to the pillar bump 82, and the plural cavities 45 are similar to those in the first or second embodiment. Advantages similar to those of the first or second embodiment are thus achieved.

In the third embodiment, the capacitors C1a and C1b of the filter circuits 71 and 72 are disposed adjacent to the unit transistors 60 at opposite ends of the arrangement direction (x-axis direction) of the plural unit transistors 60. This improves the characteristics of the filter circuits 71 and 72 as the harmonic terminating circuits, thereby enhancing the performance of the power amplifiers.

In the third embodiment, the shape and the dimensions of the plural cavities 45 (FIG. 10A) for the pillar bumps 81, 82, and 83 and those of the cavity 46 (FIG. 10B) for the circular pillar bump 84 and those for the circular pillar bumps 85 and 86 are the same. Because of this arrangement, when the pillar bumps 81 through 86 are formed by plating, the portions of the pillar bumps embedded in the cavities can be made uniform. It is thus possible to improve the manufacturing yield.

To make the embedded portions of each of the pillar bumps 81, 82, and 83 uniform, it is preferable that the corresponding plural cavities 45 (FIG. 10A) be arranged at equal intervals. It is also preferable that the interval between the plural cavities 45 provided for the pillar bump 81, that for the pillar bump 82, and that for the pillar bump 83 be the same.

In the third embodiment, the power amplifier circuit is formed in two stages of power amplifiers. As a modified example of the third embodiment, the power amplifier circuit may be formed in one stage of power amplifier or three or more stages of power amplifiers.

Fourth Embodiment

A semiconductor apparatus according to a fourth embodiment will be described below with reference to FIGS. 12 through 14. An explanation of the elements configured in the same manner as those of the third embodiment in FIGS. 7 through 11 will be omitted.

Figure 12:
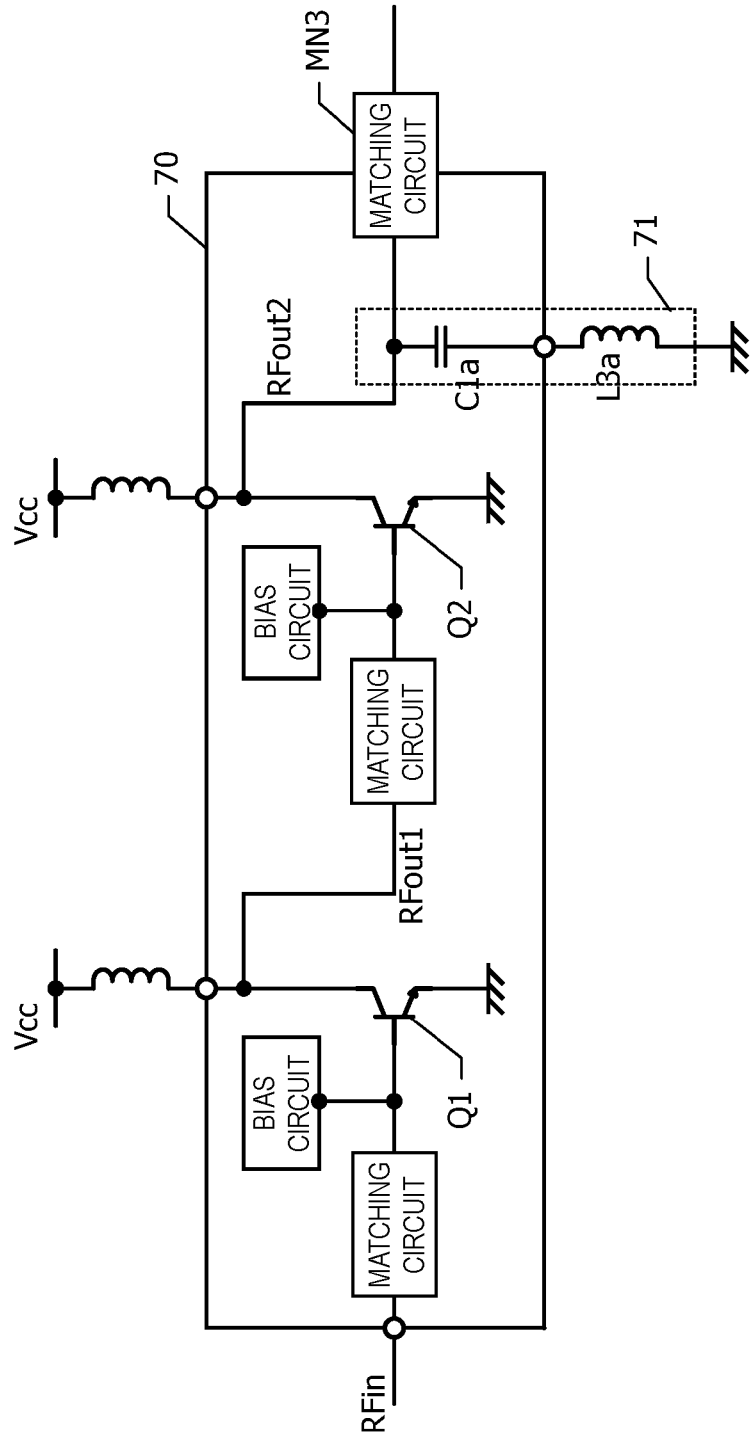
FIG. 12 is an equivalent circuit diagram of a power amplifier circuit implemented by a semiconductor apparatus according to a fourth embodiment.

FIG. 12 is an equivalent circuit diagram of a power amplifier circuit implemented by the semiconductor apparatus according to the fourth embodiment. In the third embodiment, the two filter circuits 71 and 72 are connected in parallel with each other between a ground and the transmission line which connects the collector of the transistor Q2 and the matching circuit MN3. In the fourth embodiment, only one filter circuit 71 is connected. As in the third embodiment, the filter circuit 71 is a series resonance circuit including a capacitor C1a and an inductor L3a connected in series with each other.

The configuration of the transistor Q1 is the same as that of the semiconductor apparatus of the third embodiment (FIG. 7). The transistor Q2 is constituted by two sets of unit transistors 60, as in the transistor Q2 of the semiconductor apparatus of the third embodiment. In the third embodiment, each set includes ten unit transistors 60 (FIG. 10A). In the fourth embodiment, each set includes eight unit transistors 60.

FIG. 13 is a plan view illustrating the layout of the devices on the semiconductor chip 70 forming the semiconductor apparatus according to the fourth embodiment. Eight unit transistors 60 are connected to each of the pillar bumps 82 and 83. Fewer unit transistors 60 are connected to each of the pillar bumps 82 and 83 than those in the third embodiment. The pillar bumps 82 and 83 in the semiconductor apparatus of the fourth embodiment are thus shorter than those in the third embodiment. The pillar bump 83 is disposed on a line extending from the pillar bump 82 in the x-axis direction.

In the fourth embodiment, the capacitor C1$b$ (FIG. 9) used in the third embodiment is omitted, and only the capacitor C1$a$ is used. The circular pillar bump 85 (FIG. 9) is not accordingly provided. The capacitor C1$a$ is disposed closely to the unit transistor 60 positioned at one end of the pillar bump 82.

FIG. 14 illustrates the positional relationships among the pillar bump 82, the operating regions 61 of the unit transistors 60, and the cavities 45. The operating regions 61 of the eight unit transistors 60 are arranged in the x-axis direction within the pillar bump 82 having a planar configuration elongated in the x-axis direction. The eight cavities 45 are also arranged in the x-axis direction within the pillar bump 82.

The amount of deviation Dx of the closest proximity cavity 45 with respect to the unit transistor 60 at the first end (the right end) is greater than that with respect to the unit transistor 60 at the second end (the left end). The amount of deviation Dx of the closest proximity cavity 45 becomes greater from the second end (the left end) to the first end (the right end). The capacitor C1$a$ (FIG. 13) of the filter circuit 71 is disposed near the left end of the pillar bump 82.

Advantages achieved by the configuration of the semiconductor apparatus according to the fourth embodiment will be discussed below.

The present inventors have found that, when the filter circuit 71 (FIG. 13) which serves as a harmonic terminating circuit is connected to the collector of the transistor Q2 (FIG. 12), heating in the plural unit transistors 60 does not uniformly occur under the high-frequency operation of the unit transistors 60. For example, the present inventors have found that the amount of the generated heat tends to be gradually decreased from the unit transistor 60 at the left end to the unit transistor 60 at the right end in the example in FIG. 14.

In the fourth embodiment, the heat dissipation from the operating regions 61 of the unit transistors 60 is adjusted so that variations in the amount of the heat generated in the individual unit transistors 60 will cancel each other out. More specifically, the amount of deviation Dx of the closest proximity cavity 45 is adjusted to become greater from the unit transistor 60 at the left end to that at the right end, so that heat dissipation of the operating region 61 is gradually decreased from the unit transistor 60 at the left end to that at the right end. With this configuration, the temperatures of the operating plural unit transistors 60 can be substantially equalized.

Additionally, the average of the amounts of the heat generated in the plural unit transistors 60 connected to the pillar bump 82 (FIG. 13) and that in the plural unit transistors 60 connected to the pillar bump 83 (FIG. 13) may not become uniform. In the example in FIG. 13, the average of the amounts of the heat generated in the unit transistors 60 connected to the pillar bump 82 closer to the capacitor C1$a$ of the filter circuit 71 is greater than that in the plural unit transistors 60 connected to the pillar bump 83. In this case, the average of the amounts of deviation Dx of the closest proximity cavities 45 with respect to the unit transistors 60 that generate a greater amount of heat on average is set to be smaller than that with respect to the unit transistors 60 that generate a smaller amount of heat on average. This can decrease the difference in the temperature between the operating plural unit transistors 60 connected to the pillar bump 82 and those connected to the pillar bump 83.

Depending on the high-frequency operating conditions for the semiconductor apparatus, the distribution in the amount of the generated heat may become different from the above-described distribution. In this case, the distribution in the amount of deviation Dx of the closest proximity cavity 45 is determined so as to cancel out the variations in the amount of heat.

Even when the two filter circuits 71 and 72 serving as harmonic terminating circuits are connected, such as in the semiconductor apparatus of the third embodiment (FIG. 7), the amounts of the heat generated in the plural unit transistors 60 may become non-uniform. In such a case, the distribution in the amount of deviation Dx of the closest proximity cavity 45 is determined so as to cancel out the variations in the amount of heat.

The reason why the amount of the generated heat varies among the unit transistors 60 will be explained below. The collectors of the plural unit transistors 60 are connected to the same collector wiring. Under the high-frequency operation of the plural unit transistors 60, it is no longer possible to ignore the inductance components in the collector wiring. If the length of the collector wiring from the power supply terminal is different among the plural unit transistors 60, the inductance components in the collector wiring influencing the unit transistors 60 also vary. As a result, the output power and the consumed current become different among the plural unit transistors 60.

Modified examples of the fourth embodiment will be discussed below.

As described above, the provision of a harmonic terminating circuit connected to the collector of the transistor Q2 (FIG. 12) makes it more likely to vary the amount of heat among the plural unit transistors 60. If the amount of heat significantly varies among the plural unit transistors 60, the provision of the filter circuit 71 (FIG. 12) serving as a harmonic terminating circuit may be omitted.

In the fourth embodiment, a part of the matching circuit MN3 (FIG. 12) is formed on the semiconductor chip 70, and the remaining part is mounted on the mounting substrate 90 (FIG. 11). The entirety of the matching circuit MN3 may alternatively be mounted on the mounting substrate 90.

The configurations of the above-described modified examples may be employed by considering the optimal conditions for the radio-frequency characteristics and the manufacturability of the semiconductor apparatus.

Fifth Embodiment

Semiconductor apparatuses according to a fifth embodiment and modified examples thereof will be described below with reference to FIGS. 15A through 16D. An explanation of the elements configured in the same manner as those of the first embodiment will be omitted. The configuration of unit transistors 60 of the semiconductor apparatus according to the fifth embodiment is the same as the unit transistors 60 (FIG. 1) in the first embodiment or the unit transistors 60 (FIG. 6) in the second embodiment. In the fifth embodiment, the positional relationship between the operating regions 61 of the unit transistors 60 and the cavities 45 positioned immediately under the pillar bump 40 is different from that of the first and second embodiments. In the examples in FIGS. 15A through 16D, one unit transistor 60 includes one operating region 61. However, one unit transistor 60 may include two operating regions 61, such as in the first embodiment (FIG. 1).

Figure 15A:
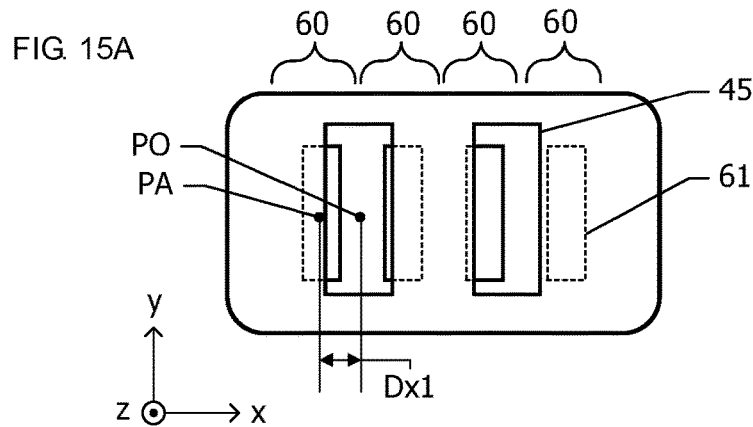
FIG. 15A illustrates the positional relationship between operating regions of unit transistors and cavities of a semiconductor apparatus according to a fifth embodiment.

FIG. 15A illustrates the positional relationship between the operating regions 61 of the unit transistors 60 and the cavities 45 in the semiconductor apparatus according to the fifth embodiment. The plural cavities 45 are disposed farther inward than the outer edges of the operating regions 61 of the unit transistors 60 positioned at both ends in the x-axis direction, and no cavities 45 are formed outside the operating regions 61 of these unit transistors 60.

The operating region 61 of the unit transistor 60 at one end (the left end) is partially covered with a cavity 45, while the operating region 61 of the unit transistor 60 at the other end (the right end) is not covered with any cavity 45.

If the heat dissipation from the operating region 61 of the unit transistor 60 at the left end is prioritized, the arrangement shown in FIG. 15A may be employed.

Figure 15B:
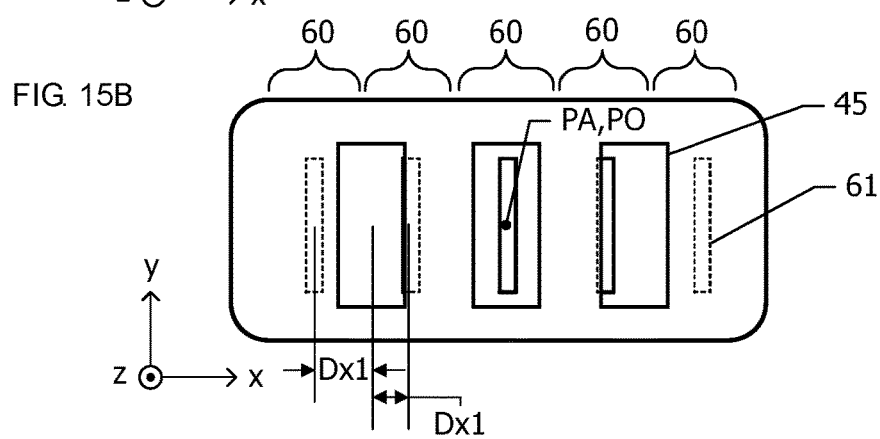
FIGS. 15B through 16D illustrate the positional relationships between operating regions of unit transistors and cavities of semiconductor apparatuses according to modified examples of the fifth embodiment.

In the modified example in FIG. 15B, an odd number (five, for example) of unit transistors 60 are provided, and an odd number (three, for example) of cavities 45 are provided. The centroid PA of the operating region 61 of the unit transistor 60 at the center and the centroid PO of the cavity 45 at the center are set at the same position in the x-axis direction. The amount of deviation Dx of the closest proximity cavity 45 becomes greater from the center to both ends of the arrangement direction of the unit transistors 60. The heat dissipation from the unit transistors 60 at both ends is thus lower than that of the unit transistor 60 at the center.

The arrangement shown in FIG. 15B may be employed for a semiconductor apparatus in which the unit transistor 60 positioned at the center generates a relatively large amount of heat and the amount of the generated heat is decreased from the center toward the ends. The temperatures of the operating unit transistors 60 can thus be substantially equalized.

Figure 15C:
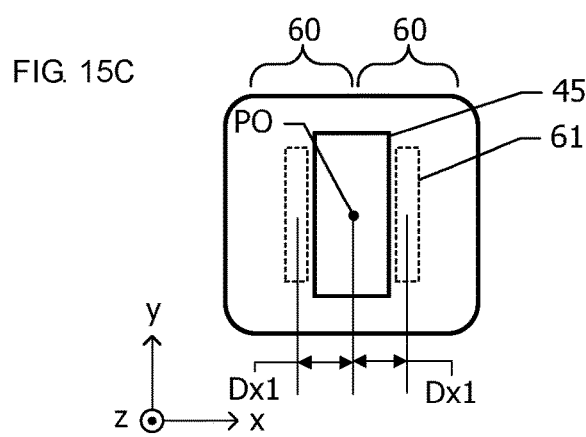

In the modified example in FIG. 15C, two unit transistors 60 and one cavity 45 are provided. The two unit transistors 60 are disposed symmetrically with each other with respect to an imaginary line passing through the centroid PO of the cavity 45 and being parallel with the y axis (second direction). Accordingly, the amount of deviation Dx of the closest proximity cavity 45 with respect to one unit transistor 60 is equal to that with respect to the other unit transistor 60. It is thus possible to make the heat dissipation from one transistor 60 and that from the other transistor 60 substantially the same. The thermal stress produced in the emitter layer 34 of one unit transistor 60 and that in the other unit transistor 60 can also be reduced almost uniformly.

Figure 15D:
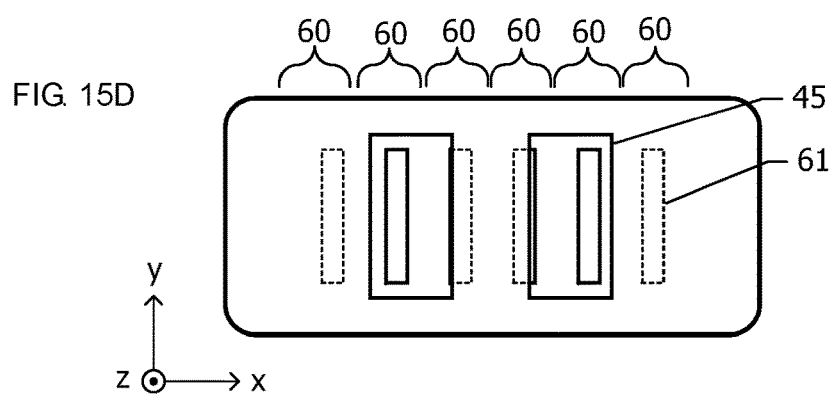

In the modified example in FIG. 15D, six unit transistors 60 and two cavities 45 are disposed. The cavities 45 are disposed farther inward than the operating regions 61 of the unit transistors 60 at both ends. The operating regions 61 of the unit transistors 60 at both ends are not covered with any cavity 45. That is, no cavities 45 are disposed immediately above the unit transistors 60 at both ends where the temperature is likely to be relatively low.

The arrangement shown in FIG. 15D may be employed when the amount of the heat generated from unit transistors 60 at both ends is smaller than that from inner-side unit transistors 60. The temperatures of the junctions of the plural unit transistors 60 can be substantially equalized.

Figure 16A:
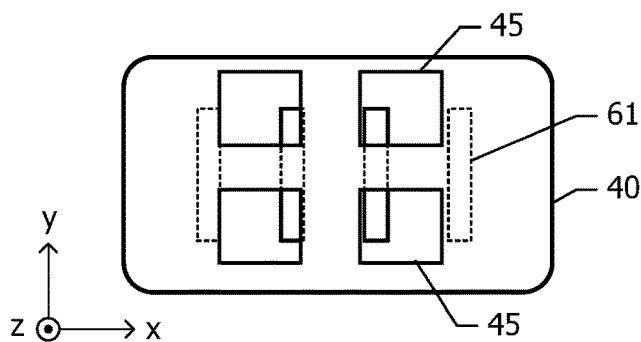

In the modified example in FIG. 16A, plural cavities 45 are arranged in a matrix in the x-axis and y-axis directions. This arrangement corresponds to the configuration in which each of the plural cavities 45 in the first embodiment is divided into two portions in the y-axis direction.

Dividing the cavity 45 in the y-axis direction decreases the area of each portion of the divided cavity 45. The sectional area of the flow channel in the heat path within the cavity 45 is accordingly decreased so as to increase the thermal resistance. This makes it easier to control the heat dissipation from the unit transistors 60. Additionally, the portion of the third-layer insulating film (FIGS. 2 and 3) where the cavity 45 is formed is decreased, thereby enhancing the effect of reducing the thermal stress.

Because of the skin effect, a high-frequency signal tends to pass only on the surface of a conductor. Dividing a cavity 45 increases the surface area of a conductor within the cavity 45, thereby reducing the resistance to a high-frequency signal. Additionally, when the pillar bump 40 (FIGS. 2 and 3) is formed by plating, each cavity 45 with a reduced area can be filled with a conductor more easily. This makes it possible to enhance the flatness of the top surface of the pillar bump 40.

Although two cavities 45 are arranged in the y-axis direction in the modified example in FIG. 16A, three or more cavities 45 may be disposed. Arranging of more cavities 45 in the y-axis direction enhances the above-described effects.

Figure 16B:
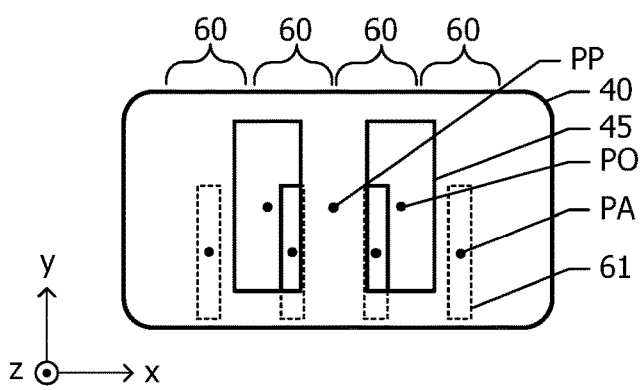

In the modified example in FIG. 16B, the centroid PO of a cavity 45 is displaced from the centroid PA of the operating region 61 of a unit transistor 60, not only in the x-axis direction, but also in the y-axis direction. The centroid PA of the operating region 61 is also displaced from the centroid PP of the pillar bump 40 in the y-axis direction. Displacing the centroid PO of the cavity 45 from the centroid PA of the operating region 61, not only in the x-axis direction, but also in the y-axis direction makes it more likely to increase the thermal resistance in the area from the operating region 61 to the pillar bump 40. It is thus possible to more easily adjust the heat dissipation from the unit transistors 60 and also to reduce the thermal stress.

Figure 16C:
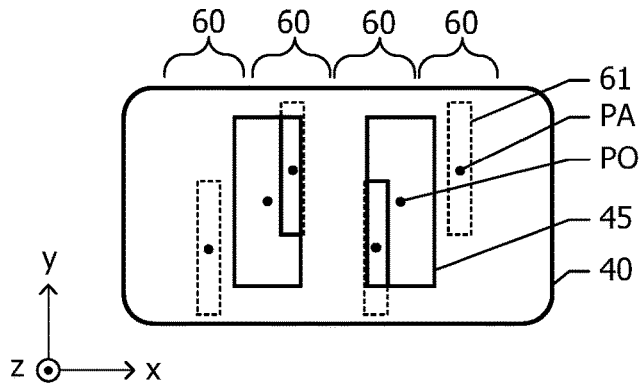

In the modified example in FIG. 16C, the centroids PA of the operating regions 61 of plural unit transistors 60 are disposed in staggered arrangement. More specifically, among the plural unit transistors 60 arranged in the x-axis direction, the centroids PA of the operating regions 61 of the odd-numbered unit transistors 60 are disposed on a straight line in the x-axis direction. Likewise, the centroids PA of the operating regions 61 of the even-numbered unit transistors 60 are disposed on another straight line in the x-axis direction. The centroids PA of the operating regions 61 of the odd-numbered unit transistors 60 and those of the even-numbered unit transistors 60 are located at different positions in the y-axis direction.

The centroid PO of each cavity 45 is displaced from the centroid PA of any of the operating regions 61 in the x-axis direction and in the y-axis direction. Advantages similar to those of the example in FIG. 16B are thus achieved.

Figure 16D:
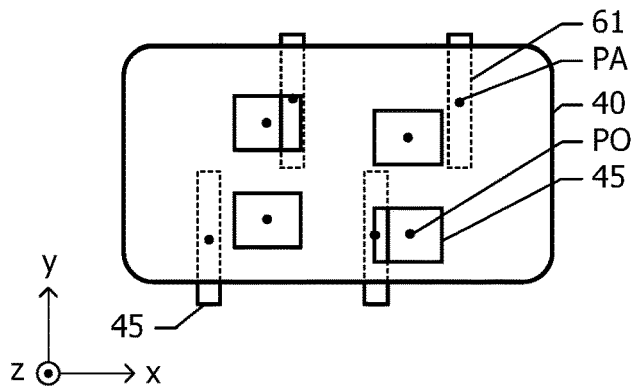

In the modified example in FIG. 16D, the pitch between the centroids PA of the operating regions 61 disposed in staggered arrangement is greater than that in the example in FIG. 16C. Each operating region 61 partially extends to the outside of the pillar bump 40, as viewed from above. To avoid a significant increase in thermal resistance, each operating region 61 partially overlaps with the pillar bump 40. Each cavity 45 is divided into two portions in the y-axis direction. The centroid PO of each cavity 45 is displaced from the centroid PA of any of the operating regions 61 in the x-axis direction and in the y-axis direction. Advantages similar to those of the example in FIG. 16B are thus achieved.

Sixth Embodiment

A semiconductor apparatus according to a sixth embodiment will be described below with reference to FIG. 17. An explanation of the elements configured in the same manner as those of the first embodiment (FIGS. 1 through 3) will be omitted.

Figure 17:
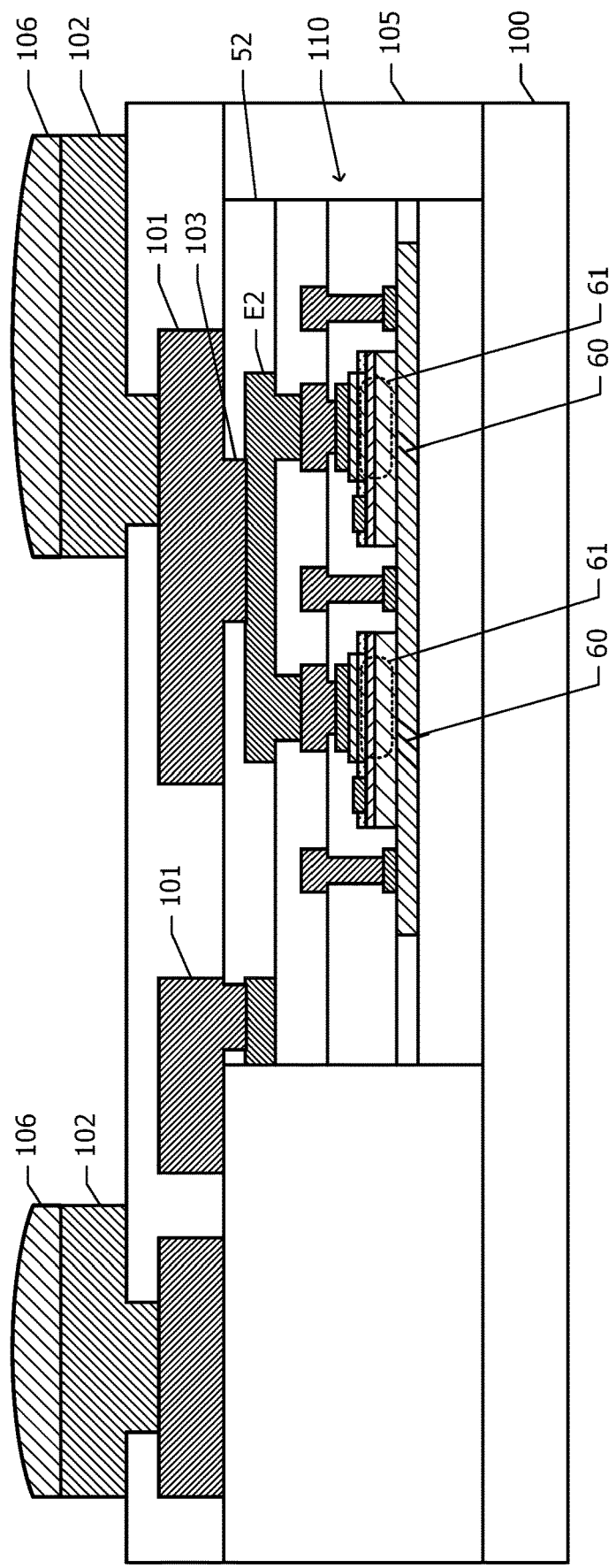
FIG. 17 is a sectional view of a semiconductor apparatus according to a sixth embodiment.

FIG. 17 is a sectional view of the semiconductor apparatus according to the sixth embodiment. In the first embodiment, the pillar bump 40 (FIGS. 2 and 3) is formed on the top surface of the semiconductor chip on which the unit transistors 60 are formed. The semiconductor apparatus of the sixth embodiment is implemented by using a wafer-level package including a semiconductor chip.

On a package substrate 100, a semiconductor chip 110 is bonded and fixed. The semiconductor chip 110 includes a device structure from the substrate 30 to the second-layer emitter wiring E2 of the semiconductor apparatus (FIGS. 1 through 3) of the first embodiment, for example, and also includes the third-layer insulating film 52 covering the second-layer emitter wiring E2 (first wiring). The semiconductor chip 110 includes plural unit transistors 60. Apart from the semiconductor chip 110, surface mounting devices are bonded and fixed on the package substrate 100.

The semiconductor chip 110 and the surface mounting devices are sealed with a resin insulating film 105. The top surface of the semiconductor chip 110 is on the same level as that of the insulating film 105. On the semiconductor chip 110 and the insulating film 105, plural first-layer redistribution lines 101 (second wiring) are disposed. A part of the first-layer redistribution line 101 is electrically connected to the second-layer emitter wiring E2 underneath via a cavity 103 formed in the third-layer insulating film 52. Plural second-layer redistribution lines 102 are disposed on the first-layer redistribution lines 101. The second-layer redistribution lines 102 are electrically connected to terminals 106, such as bumps, disposed thereon. The first-layer redistribution lines 101 and the second-layer redistribution lines 102 are formed by plating using Cu, for example.

The positional relationships among the first-layer redistribution lines 101, the cavities 103, and the operating regions 61 of the unit transistors 60 in a plan view is substantially equivalent to those among the pillar bump 40, the cavities 45, and the operating regions 61 of the unit transistors 60 of the semiconductor apparatus of the first embodiment.

Advantages achieved by the configuration of the semiconductor apparatus according to the sixth embodiment will be discussed below.

In the sixth embodiment, the first-layer redistribution lines 101 have a function similar to the pillar bump 40 (FIGS. 1 through 3) of the first embodiment. That is, the first-layer redistribution lines 101 serve as a heat path for dissipating the heat generated in the operating regions 61 to the outside. The cavity 103 for connecting the first-layer redistribution line 101 and the second-layer emitter wiring E2 has a function similar to the cavity 45 (FIGS. 1 through 3) in the first embodiment. The first-layer redistribution lines 101, the cavities 103, and the operating regions 61 of the unit transistors 60 are arranged with the above-described positional relationships, thereby achieving advantages similar to those of the first embodiment.

The positional relationships among the first-layer redistribution lines 101, the cavities 103, and the operating regions 61 of the unit transistors 60 may alternatively be set, as in one of the second through fifth embodiments. In this case, advantages similar to those of the corresponding one of the second through fifth embodiments are achieved.

Seventh Embodiment

A semiconductor apparatus according to a seventh embodiment will be described below with reference to FIG. 18. An explanation of the elements configured in the same manner as those of the sixth embodiment (FIG. 17) will be omitted.

Figure 18:
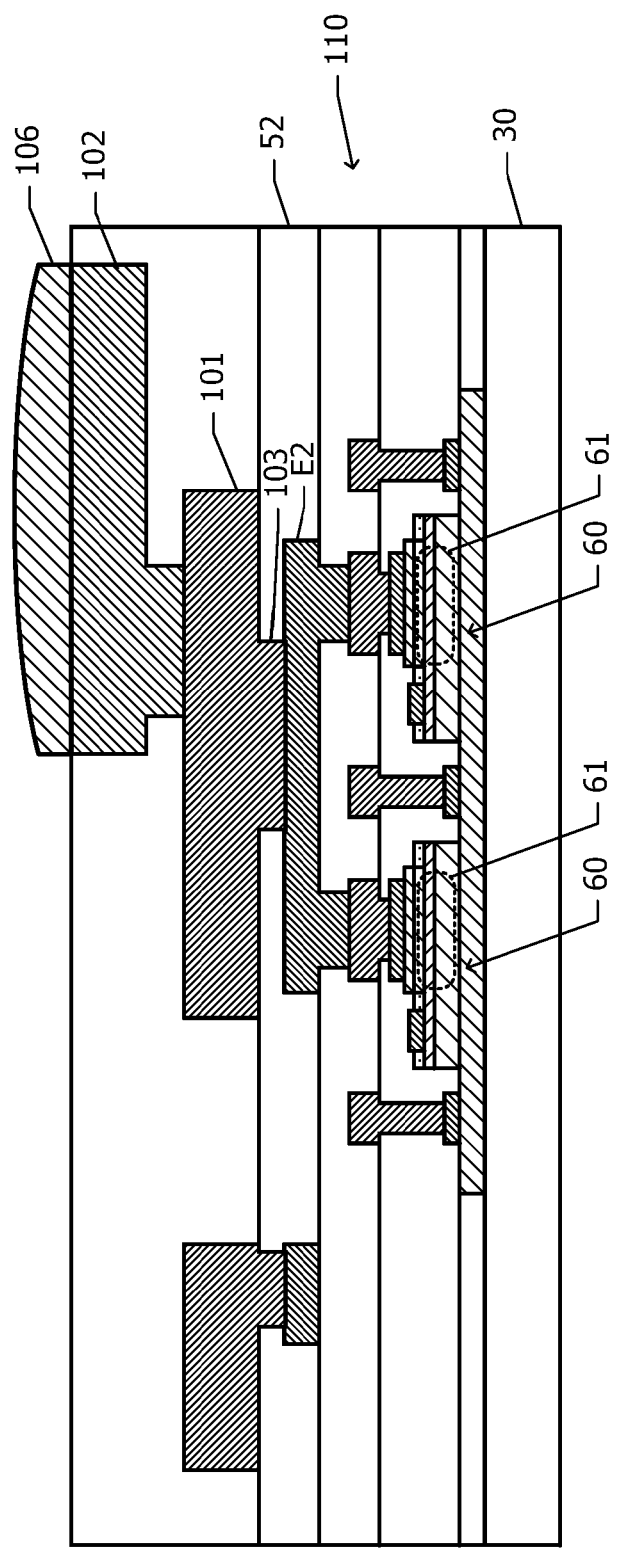
FIG. 18 is a sectional view of a semiconductor apparatus according to a seventh embodiment.

FIG. 18 is a sectional view of the semiconductor apparatus according to the seventh embodiment. In the sixth embodiment, the semiconductor chip 110 is bonded to the package substrate 100, and the first-layer and second-layer redistribution lines 101 and 102 are formed above the package substrate 100, as shown in FIG. 17. In the seventh embodiment, the first-layer and second-layer redistribution lines 101 and 102 are formed on the third-layer (the uppermost-layer) insulating film 52 of the semiconductor chip 110. An external connection terminal 106 is disposed on the second-layer redistribution line 102. The first-layer redistribution line 101 is electrically connected to the second-layer emitter wiring E2 via the cavity 103 formed in the third-layer insulating film 52.

In the seventh embodiment, as well as in the sixth embodiment, the positional relationships among the first-layer redistribution line 101, the cavity 103, and the operating regions 61 of the unit transistors 60 are set to be the same as those of the semiconductor apparatus of the sixth embodiment. Advantages similar to those of the sixth embodiment are thus achieved.

Eighth Embodiment

A semiconductor apparatus according to an eighth embodiment will be described below with reference to FIGS. 19 through 21. An explanation of the elements configured in the same manner as those of the first embodiment will be omitted. The semiconductor apparatus of the eighth embodiment includes an HBT having a base layer made of SiGe.

Figure 19:
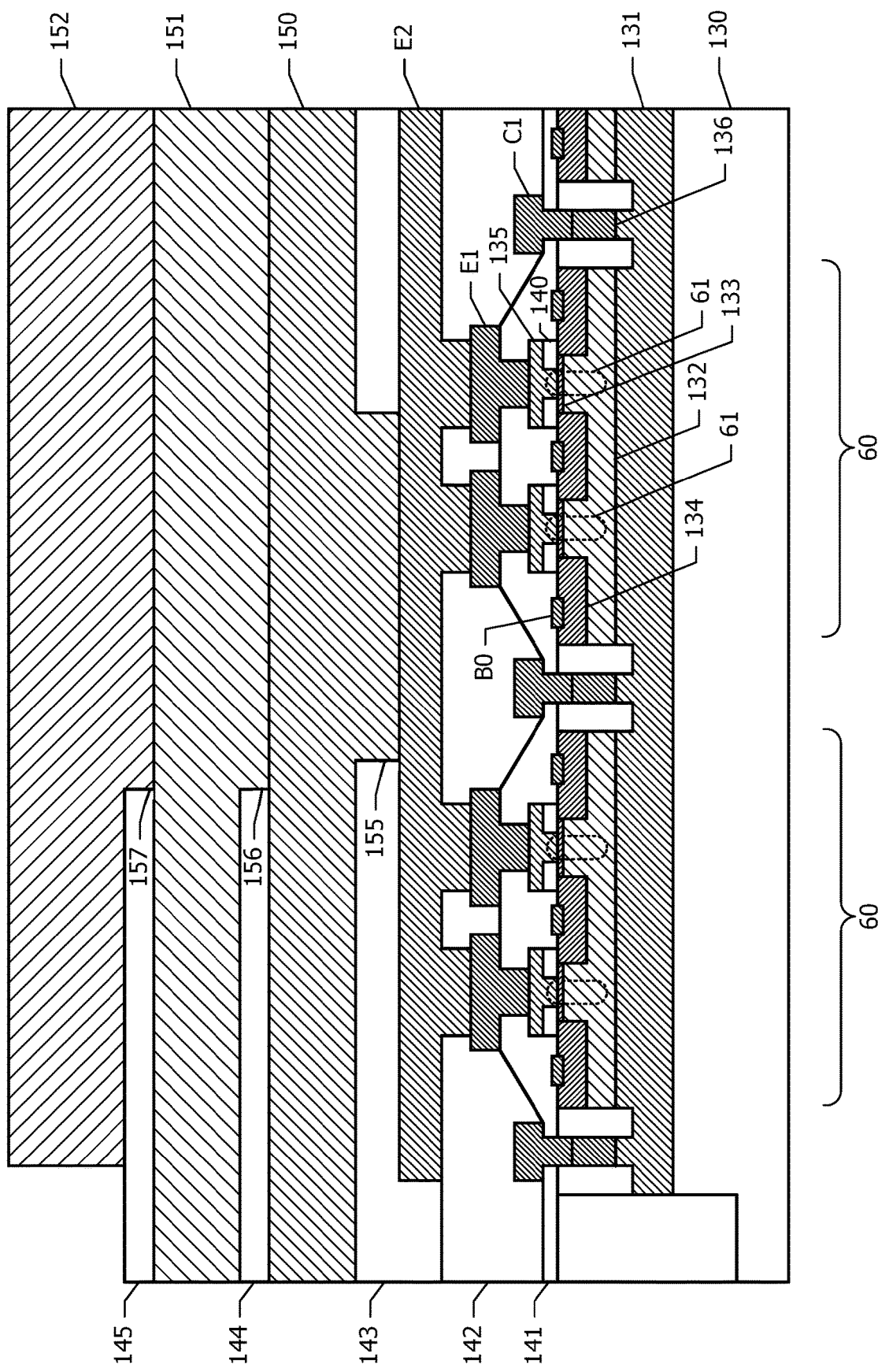
FIG. 19 is a sectional view of a semiconductor apparatus according to an eighth embodiment.

FIG. 19 is a sectional view of the semiconductor apparatus according to the eighth embodiment. In the first embodiment, GaAs is used for the base layer 33, and InGaP is used for the emitter layer 34. In the eighth embodiment, SiGe is used for the base layer 33.

On the front layer of a substrate 130 made of p-type Si, a sub-collector layer 131 made of high-concentration n-type Si is disposed, and a collector layer 132 made of n-type Si is disposed on the sub-collector layer 131. On the collector layer 132, base layers 133 made of epitaxially grown SiGe are disposed.

Because of a shallow trench isolation structure in the area from the top surface of the base layers 133 until the position slightly deeper than the top surface of the sub-collector layer 131, multiple active regions are defined, and a unit transistor 60 is disposed in each of the active regions. Because of the shallow trench isolation structure which reaches the bottom surface of the sub-collector layer 131, the plural unit transistors 60 are electrically isolated from the peripheral circuits. The cross-sectional view of FIG. 19 shows two unit transistors 60.

A p-type external base layer 134 is formed on the front layer of part of the active region. The external base layer 134 surrounds the base layer 133 made of p-type SiGe, as viewed from above. In one active region, two base layers 133 are disposed.

An insulating film 140 made of silicon oxide, for example, is formed on each of the base layers 133, and an emitter layer 135 made of n-type polysilicon, for example, is disposed on the insulating film 140. The emitter layer 135 contacts with the base layer 133 via a cavity formed in the insulating film 140. The operating current flows in the thickness direction of a heterojunction between the emitter layer 135 and the base layer 133. The outer edge lines of this heterojunction define the operating region 61, as viewed from above. Each unit transistor 60 includes two operating regions 61.

The base electrode B0 is disposed on the front surface of the external base layer 134. The base electrode B0 is made of Ti silicide or Ni silicide, for example. The base electrode B0 is provided for reducing the base resistance. If the base resistance is sufficiently low without the base electrode B0, the provision of the base electrode B0 may be omitted.

A first-layer insulating film 141 made of silicon oxide, for example, is disposed to cover the emitter layers 135, the external base layer 134, and the base electrode B0. The first-layer emitter wirings E1 and a first-layer collector wiring C1 made of Al, for example, are formed on the first-layer insulating film 141. The first-layer emitter wiring E1 is electrically connected to the emitter layer 135 via a cavity formed in the first-layer insulating film 141. The first-layer collector wiring C1 is electrically connected to the sub-collector layer 131 via a cavity formed in the first-layer insulating film 141 and a high-concentration n-type region 136 formed above the front surface of the substrate. To reduce the collector resistance, a collector electrode made of metal silicide may be disposed at the interface between the first-layer collector wiring C1 and the n-type region 136.

The base electrode B0 is connected to the first-layer base wiring B1 at a portion which is not seen in the sectional view of FIG. 19.

A second-layer insulating film 142 made of silicon oxide or silicon nitride, for example, is disposed on the first-layer insulating film 141 to cover the first-layer emitter wirings E1 and the first-layer collector wiring C1. On the second-layer insulating film 142, the second-layer emitter wiring E2 is disposed. The second-layer emitter wiring E2 is electrically connected to the first-layer emitter wirings E1 via cavities formed in the second-layer insulating film 142 so as to connect the emitter layers 135 of the plural unit transistors 60.

On the second-layer emitter wiring E2, a third-layer insulating film 143, a third-layer wiring 150, a fourth-layer insulating film 144, a fourth-layer wiring 151, and a fifth-layer insulating film 145 are disposed in this order. The third-layer wiring 150 is electrically connected to the second-layer emitter wiring E2 via a cavity 155 formed in the third-layer insulating film 143. The fourth-layer wiring 151 is electrically connected to the third-layer wiring 150 via a cavity 156 formed in the fourth-layer insulating film 144. A bump 152 is disposed on the fifth-layer insulating film 145. The bump 152 is electrically connected to the fourth-layer wiring 151 via a cavity 157 formed in the fifth-layer insulating film 145. The second-layer emitter wiring E2, the third-layer wiring 150, and the fourth-layer wiring 151 are made of Al or Cu, for example. The third-layer, fourth-layer, and fifth-layer insulating films 143, 144, and 145 are formed of silicon oxide or silicon nitride, for example.

The top surface of each of the second-layer through fifth-layer insulating films 142 through 145 is flattened. The top surface of the first-layer insulating film 141 may also be flattened if necessary.

Figure 20:
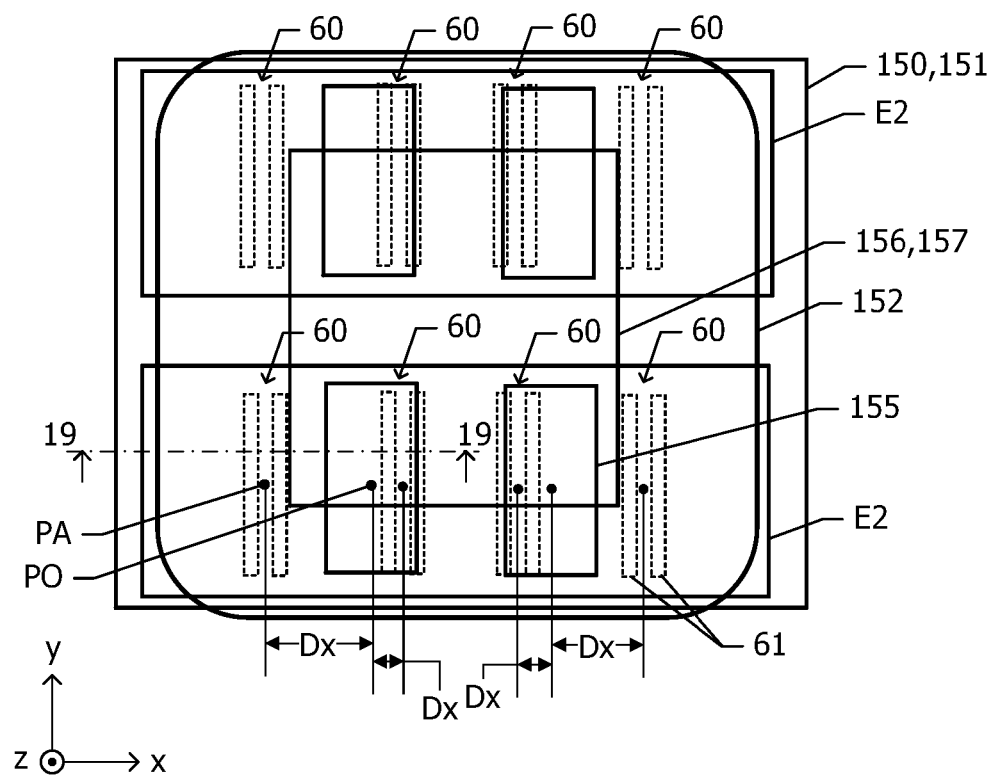
FIG. 20 is a plan view illustrating the layout of the elements forming the semiconductor apparatus of the eighth embodiment.

FIG. 20 is a plan view illustrating the layout of the elements forming the semiconductor apparatus of the eighth embodiment. A sectional view taken along the long-dashed dotted line 19-19 in FIG. 20 corresponds to that shown in FIG. 19. Eight unit transistors 60 are arranged in a matrix of two rows and four columns, assuming that the row direction is the x-axis direction and the column direction is the y-axis direction. Each unit transistor 60 includes two operating regions 61. Each operating region 61 has a planar configuration elongated in the y-axis direction, as viewed from above. Within one unit transistor 60, two operating regions 61 are arranged side by side in the x-axis direction.

The second-layer emitter wiring E2 is disposed for each row constituted by four unit transistors 60. The second-layer emitter wiring E2 contains the operating regions 61 of the unit transistors 60 of the corresponding row therein, as viewed from above.

The third-layer wiring 150, the fourth-layer wiring 151, and the bump 152 are disposed to cover all the operating regions 61 of the eight unit transistors 60, as viewed from above. Four cavities 155 formed in the third-layer insulating film 143 (FIG. 19) are disposed in a matrix of two rows and two columns. One row of two cavities 155 corresponds to one row of four unit transistors 60.

With respect to an imaginary line passing through the center of the bump 152 and being parallel with the x axis, the operating regions 61 of the unit transistors 60 of the first row and those of the second row are disposed symmetrically with each other. Similarly, the cavities 155 of the first row and those of the second row are disposed symmetrically with each other with respect to this imaginary line.

The centroid PO of each cavity 155 is displaced from the centroid PA of the operating regions 61 of the corresponding unit transistor 60 in the x-axis direction. Focusing on each row of unit transistors 60, the amounts of deviation Dx of the closest proximity cavities 155 with respect to the unit transistors 60 at both ends are greater than those with respect to the inner-side unit transistors 60, as in the first embodiment (FIG. 1).

The cavity 156 formed in the fourth-layer insulating film 144 (FIG. 19) and the cavity 157 formed in the fifth-layer insulating film 145 (FIG. 19) have the same configuration and the same dimensions, and overlap with each other substantially perfectly as viewed from above. The cavities 156 and 157 are disposed farther inward than the operating regions 61 at both ends in the x-axis direction, and partially overlap with some operating regions 61 of the unit transistors 60 of the first row and also those of the second row in the y-axis direction.

Figure 21:
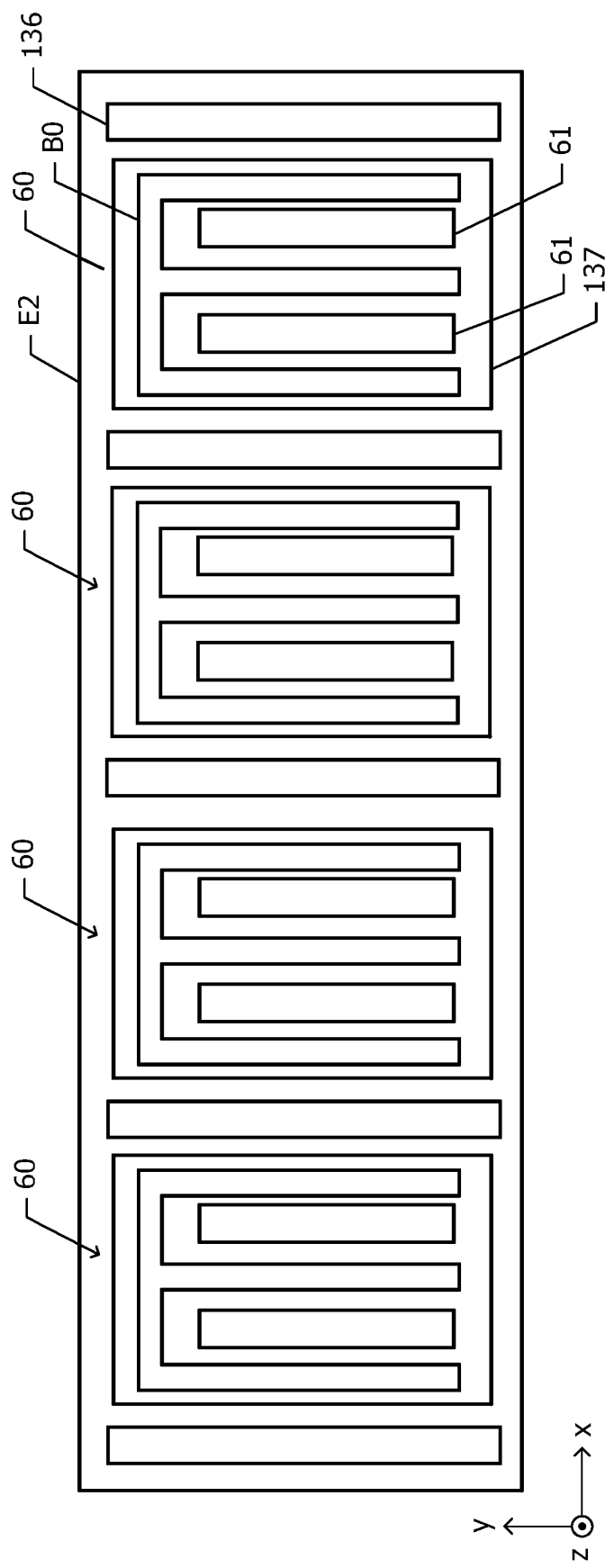
FIG. 21 is a plan view illustrating the layout of four unit transistors disposed in one row in the semiconductor apparatus of the eighth embodiment.

FIG. 21 is a plan view illustrating the layout of four unit transistors 60 disposed in one row in the semiconductor apparatus of the eighth embodiment. Each unit transistor 60 includes two operating regions 61 disposed with a space therebetween in the x-axis direction. The base electrode B0 has an interdigital configuration having three teeth portions, as viewed from above. One of the three teeth portions of the base electrode B0 is located between the two operating regions 61 and the other two teeth portions are located outside the operating regions 61. The area where the base layers 133 and the external base layer 134 (FIG. 19) are combined with each other are defined by outer edge lines 137. The two operating regions 61 and the base electrode B0 are disposed within the outer edge lines 137.

Some n-type regions 136 are disposed between the unit transistors 60 arranged in the x-axis direction, and two n-type regions 136 are also disposed outside the unit transistors 60 at both ends. The second-layer emitter wiring E2 is disposed and contains the unit transistors 60 and the n-type regions 136 therein, as viewed from above.

Advantages achieved by the configuration of the semiconductor apparatus according to the eighth embodiment will be discussed below.

The cavities 155 connecting the second-layer emitter wiring E2 and the third-layer wiring 150 serve as a heat path for dissipating the heat generated in the operating regions 61 to the outside. From this point of view, the cavities 155 correspond to the cavities 45 in the semiconductor apparatus of the first embodiment (FIG. 1).

In the eighth embodiment, the centroid PO of each cavity 155 is displaced from the centroid PA of the corresponding operating region 61 in the x-axis direction. Advantages similar to those of the first embodiment are thus achieved.

Ninth Embodiment

A semiconductor apparatus according to a ninth embodiment will be described below with reference to FIGS. 22 and 23. An explanation of the elements configured in the same manner as those of the first embodiment will be omitted. In the first embodiment, the unit transistors 60 (FIGS. 1 through 3) are HBTs. In the ninth embodiment, the unit transistors 60 are metal-oxide-semiconductor field-effect transistors (MOSFETs).

Figure 22:
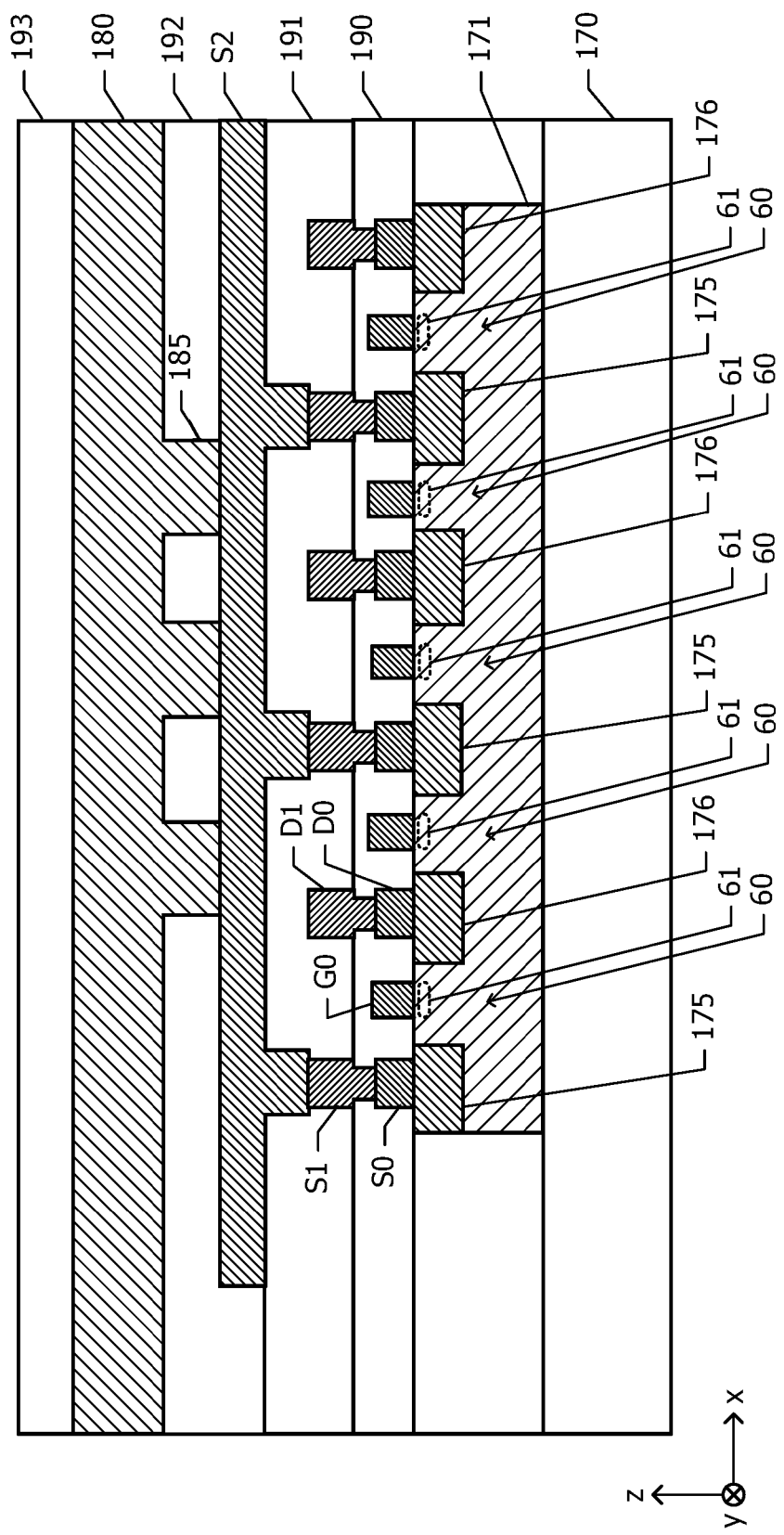
FIG. 22 is a sectional view of a semiconductor apparatus according to a ninth embodiment.

FIG. 22 is a sectional view of the semiconductor apparatus according to the ninth embodiment. On the front surface of a silicon substrate 170, an active region 171 separated by a shallow trench isolation structure is formed. Plural unit transistors 60 are arranged in the x-axis direction within the active region 171. In the ninth embodiment in FIG. 22, five unit transistors 60 are disposed. The unit transistors 60 are all MOSFETs and each include a source region 175 and a drain region 176 disposed with a space therebetween in the x-axis direction. A gate electrode GO is disposed on a channel region between the source region 175 and the drain region 176. A source electrode S0 and a drain electrode D0 are electrically connected to the source region 175 and the drain region 176, respectively. Concerning the source regions 175 and the drain regions 176 other than those at both ends, two adjacent unit transistors 60 use the same source region 175 or the same drain region 176. A part of the active region 171 immediately under the gate electrode GO serves as an operating region 61. The operating current flows through the operating region 61 in the in-plane direction.

A first-layer insulating film 190 is disposed to cover the unit transistors 60. On the first-layer insulating film 190, first-layer source wirings S1 and first-layer drain wirings D1 made of Al, for example, are disposed. The first-layer source wiring S1 is electrically connected to the source region 175 via a cavity formed in the first-layer insulating film 190 and the source electrode S0. The first-layer drain wiring D1 is electrically connected to the drain region 176 via a cavity formed in the first-layer insulating film 190 and the drain electrode D0.

A second-layer insulating film 191 is disposed to cover the first-layer source wirings S1 and the first-layer drain wirings D1. On the second-layer insulating film 191, a second-layer source wiring S2 is disposed. The second-layer source wiring S2 is electrically connected to the plural first-layer source wirings S1 via cavities formed in the second-layer insulating film 191.

A third-layer insulating film 192 is disposed to cover the second-layer source wiring S2. On the third-layer insulating film 192, a third-layer wiring 180 is disposed. The third-layer wiring 180 is electrically connected to the second-layer source wiring S2 via plural cavities 185 formed in the third-layer insulating film 192. A fourth-layer insulating film 193 is disposed to cover the third-layer wiring 180.

The second-layer source wiring S2 and the third-layer wiring 180 are made of Al or Cu, for example. The first through fourth insulating films 190 through 193 are formed of silicon oxide or silicon nitride, for example.

Figure 23:
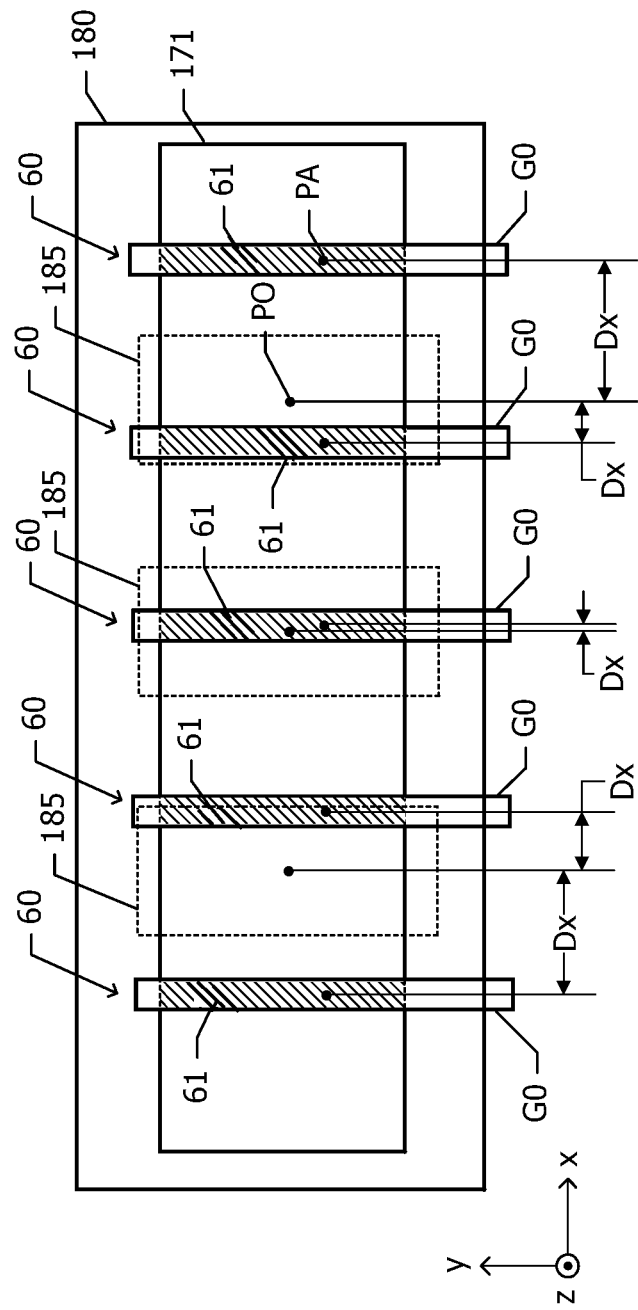
FIG. 23 is a plan view illustrating the layout of the elements forming the semiconductor apparatus according to the ninth embodiment.

FIG. 23 is a plan view illustrating the layout of the elements forming the semiconductor apparatus according to the ninth embodiment. Five gate electrodes GO arranged in the x-axis direction intersect the active region 171 formed in a substantially rectangular shape elongated in the x-axis direction. The gate electrodes GO have a planar configuration elongated in the y-axis direction and pass through the active region 171 in the y-axis direction. The portions where the active region 171 and the gate electrodes GO overlap with each other (indicated by the hatched portions in FIG. 23) serve as the operating regions 61.

The third-layer wiring 180 is disposed to cover all the operating regions 61, as viewed from above. The three cavities 185 are provided in the x-axis direction within the third-layer wiring 180, as viewed from above. The centroid PO of each cavity 185 is displaced from the centroid PA of the corresponding operating region 61 in the x-axis direction. The amount of deviation Dx of the closest proximity cavity 185 becomes greater from the center to both ends of the arrangement direction of the operating regions 61 in the x-axis direction.

Arranging the positional relationship between the operating regions 61 and the cavities 185 as described above achieves advantages similar to those of the first embodiment. That is, the thermal stress produced in the semiconductor portions of the unit transistors 60 can be reduced, and the temperatures of the operating plural unit transistors 60 can be substantially equalized. As a result, it is possible to improve the radio-frequency characteristics of the overall transistor circuit constituted by the plural unit transistors 60 connected in parallel with each other.

Although a silicon substrate is used as the substrate 170 in the ninth embodiment, a substrate made of a compound semiconductor may be used. For example, a GaAs substrate may be used as the substrate 170, and the unit transistors 60 may be each constituted by a high-electron-mobility transistor (HEMT) having a channel made of InGaAs. The unit transistors 60 may alternatively be constituted by HEMTs on a GaN substrate.

Tenth Embodiment

A semiconductor apparatus according to a tenth embodiment will be described below with reference to FIGS. 24A, 24B, and 25A. An explanation of the elements configured in the same manner as those of the first embodiment will be omitted. In the first through ninth embodiments, even when one unit transistor 60 includes plural operating regions 61, one centroid PA (FIG. 1) of the operating regions 61 is set for each unit transistor 60. In the tenth embodiment, one effective operating region including plural operating regions 61 is defined for each unit transistor 60.

Figure 24A:
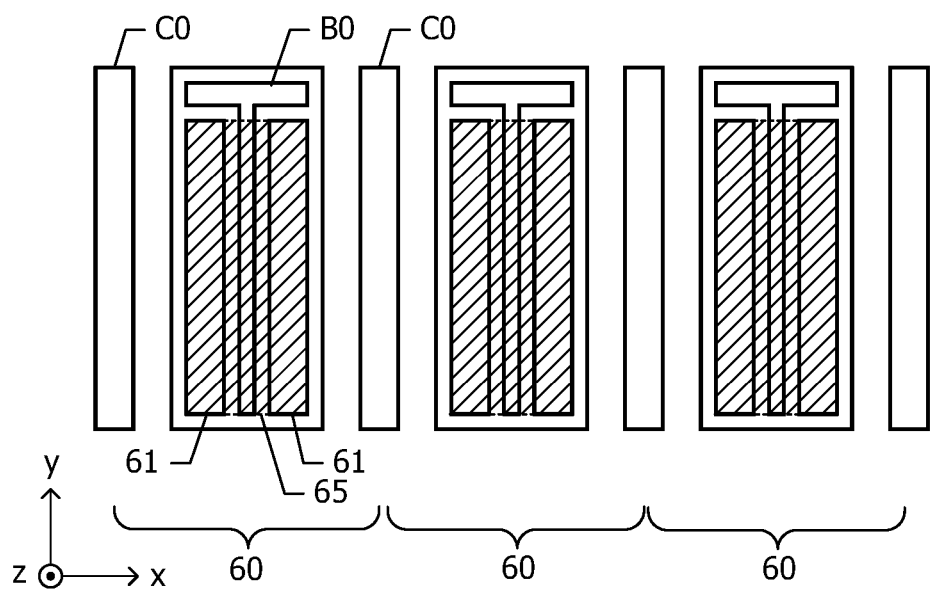
FIG. 24A illustrates the positional relationship between operating regions and effective operating regions of a semiconductor apparatus according to a tenth embodiment.

FIG. 24A illustrates the positional relationship between the operating regions 61 and an effective operating region 65. The effective operating regions 65 are indicated by the hatched portions in FIG. 24A. Each unit transistor 60 includes plural (two, for example) operating regions 61. The smallest rectangle containing the plural operating regions 61 of one unit transistor 60 therein is defined as the effective operating region 65. The plural operating regions 61 included in one unit transistor 60 are located closely to each other with the base electrode B0 interposed therebetween, and thus, one effective operating region 65 can be regarded as one heating region.

Figure 24B:
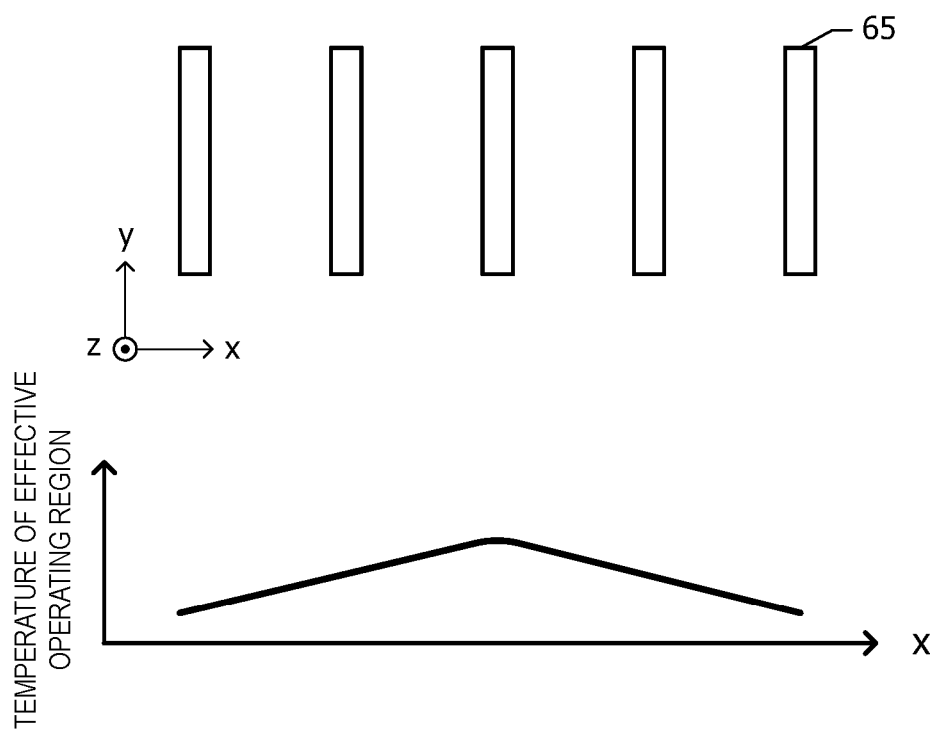
FIG. 24B illustrates the arrangement of the effective operating regions of the semiconductor apparatus according to the tenth embodiment and shows a graph illustrating the temperature distribution of the effective operating regions when heat dissipation from the effective operating regions is uniform.

FIG. 24B illustrates the arrangement of the effective operating regions 65 of the semiconductor apparatus according to the tenth embodiment. FIG. 24B also shows a graph illustrating the temperature distribution of the effective operating regions 65 when the heat dissipation from the effective operating regions 65 is uniform. In FIG. 24B, plural (five, for example) effective operating regions 65 are arranged in the x-axis direction. Each of the plural effective operating regions 65 is formed in a substantially rectangular shape elongated in the y-axis direction, as viewed from above. The shape and the dimensions of the plural effective operating regions 65 are the same.

During the operation of the semiconductor apparatus, among the effective operating regions 65, the effective operating region 65 positioned at the center in the x-axis direction is likely to be at the highest temperature and the temperature tends to decrease from the center toward both ends. For example, when the heat dissipation from the effective operating regions 65 is uniform, the temperature of the effective operating regions 65 at both ends does not considerably rise because only one heating source is adjacent to such effective operations regions 65, thereby resulting in the temperature distribution shown in FIG. 24B.

Figure 25A:
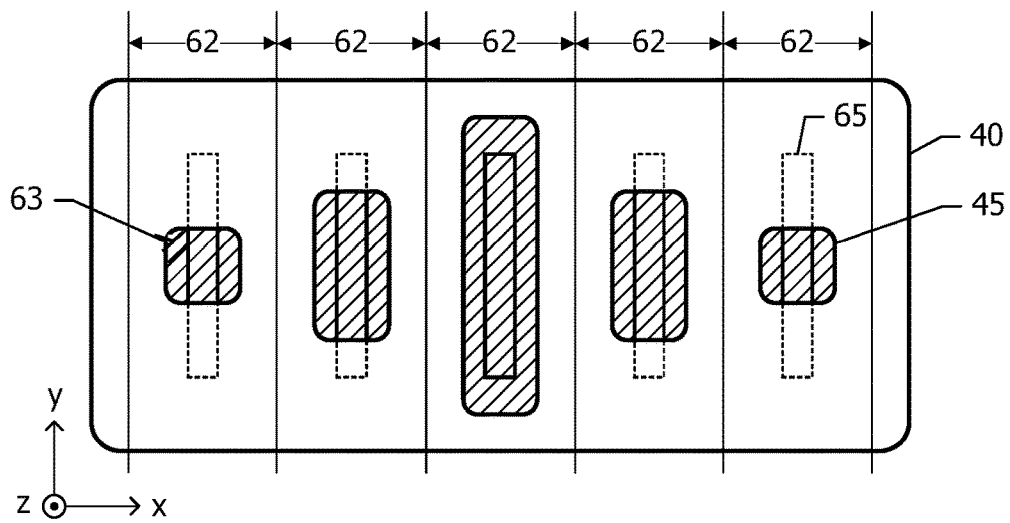
FIG. 25A illustrates the positional relationships among the effective operating regions, cavities, and a pillar bump of the semiconductor apparatus according to the tenth embodiment.

FIG. 25A illustrates the positional relationships among the effective operating regions 65, the cavities 45, and the pillar bump 40 of the semiconductor apparatus according to the tenth embodiment. A thermally vulnerable range 62 is defined for each effective operating region 65 in the following manner. A line parallel with the y-axis direction and passing through the midpoint of a segment between the centroid of a given effective operating region 65 and the adjacent effective operating region 65 is set as an imaginary line. A region sandwiched between this imaginary line and the adjacent imaginary line is defined as the thermally vulnerable range 62 of the given effective operating region 62. Regarding each of the outermost effective operating regions 65, the thermally vulnerable range 62 is defined so that the effective operating region 65 is positioned at the center of the thermally vulnerable range 62 in the x-axis direction. The thermally vulnerable ranges 62 may cover the region until the edges of the pillar bump 40 in the x-axis direction. Then, the effective operating regions 65 and the thermally vulnerable ranges 62 are associated with each other based on a one-to-one correspondence.

The thermally vulnerable ranges 62 are strip-like regions extending in the y-axis direction. When the effective operating regions 65 are arranged at equal pitches in the x-axis direction, the thermally vulnerable ranges 62 each contain the corresponding effective operating region 65 at the center in the x-axis direction. The width (the dimension in the x-axis direction) of the thermally vulnerable range 62 is equal to the pitch between the effective operating regions 65 arranged in the x-axis direction. For each thermally vulnerable range 62, the region where the thermally vulnerable range 62 and the cavity 45 overlap with each other is defined as an overlapping region 63. In FIG. 25A, the overlapping regions 63 are indicated by the hatched portions. The distance from a certain point within a thermally vulnerable range 62 to the centroid of the effective operating region 65 within this thermally vulnerable range 62 is shorter than that to the centroid of any other effective operating region 65. From this point of view, a thermally vulnerable range 62 is more vulnerable to the effective operating region 65 within this thermally vulnerable range 62 than to any other effective operating regions 65.

As the location is farther separated from the effective operating region 65 in the y-axis direction, it is less thermally vulnerable to the effective operating region 65. The dimension of the thermally vulnerable range 62 in the y-axis direction is thus set to be about three times as large as the dimension of the effective operating region 65 in the y-axis direction, and the effective operating region 65 is located at the center of the thermally vulnerable range 62 in the y-axis direction.

In the tenth embodiment, the area of the overlapping region 63 is different among the plural thermally vulnerable ranges 62. "Being different" does not mean that there are no overlapping regions 63 having the same area. That is, some overlapping regions 63 have the same area and some overlapping regions 63 have different areas.

One cavity 45 is disposed for each of the plural effective operating regions 65. Each cavity 45 is disposed at the center of the corresponding effective operating region 65 in the y-axis direction. The cavity 45 for the effective operating region 65 located at the center in the x-axis direction has the largest dimension in the y-axis direction, and the dimension of the cavity 45 in the y-axis direction becomes smaller from the center to both ends of the arrangement direction (x-axis direction) of the effective operating regions 65. The entirety of the effective operating region 65 located at the center in the x-axis direction overlaps with the cavity 45. Concerning the other effective operating regions 65, only a part of each effective operating region 65 overlaps with the corresponding cavity 45, that is, a part of each effective operating region 65 extends to the outside of the corresponding cavity 45. The area of the overlapping portion of the effective operating region 65 and the cavity 45 becomes smaller from the center to both ends of the arrangement direction (x-axis direction) of the effective operating regions 65.

Advantages achieved by the configuration of the semiconductor apparatus according to the tenth embodiment will be discussed below.

The heat generated in the effective operating region 65 is conducted to the outside via the pillar bump 40 within the cavity 45 positioned near this effective operating region 65. Accordingly, the heat is dissipated more effectively as the area of the cavity 45 within the thermally vulnerable range 62 is larger. In the tenth embodiment, the cavity 45 for the effective operating region 65 at the center has a relatively large area. The heat dissipation is thus performed effectively in the region where the temperature is likely to rise. As a result, it is possible to substantially equalize the temperatures of the plural effective operating regions 65 during the operation of the semiconductor apparatus.

Semiconductor apparatuses according to modified examples of the tenth embodiment will be described below with reference to FIGS. 25B through 27. FIGS. 25B through 27 illustrate the positional relationships among the effective operating regions 65, the cavities 45, and the pillar bump 40 of the semiconductor apparatuses according to the modified examples of the tenth embodiment. As in the tenth embodiment in FIG. 25A, the area of the overlapping region 63 differs among the thermally vulnerable ranges 62 in each of the modified examples shown in FIGS. 25B through 27. Advantages similar to those of the tenth embodiment are thus achieved in these modified examples.

Figure 25B:
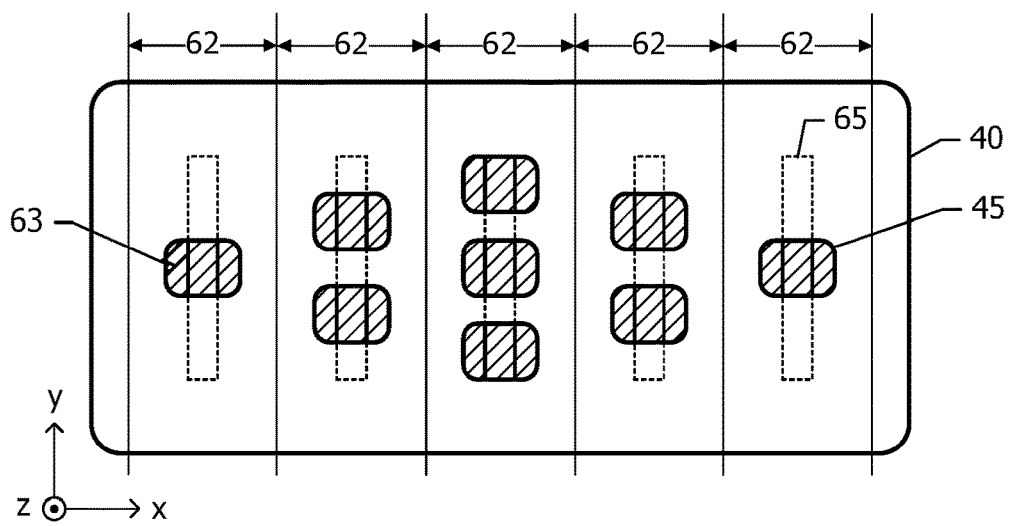

In the modified example in FIG. 25B, the plural cavities 45 have the same size, and the number of cavities 45 overlapping with the corresponding effective operating region 65 is different. For example, three cavities 45 overlap with the effective operating region 65 positioned at the center in the x-axis direction. Two cavities 45 overlap with each of the effective operating regions 65 next to the effective operating region 65 at the center. One cavity 45 overlaps with each of the effective operating regions 65 at both ends.

Figure 25C:
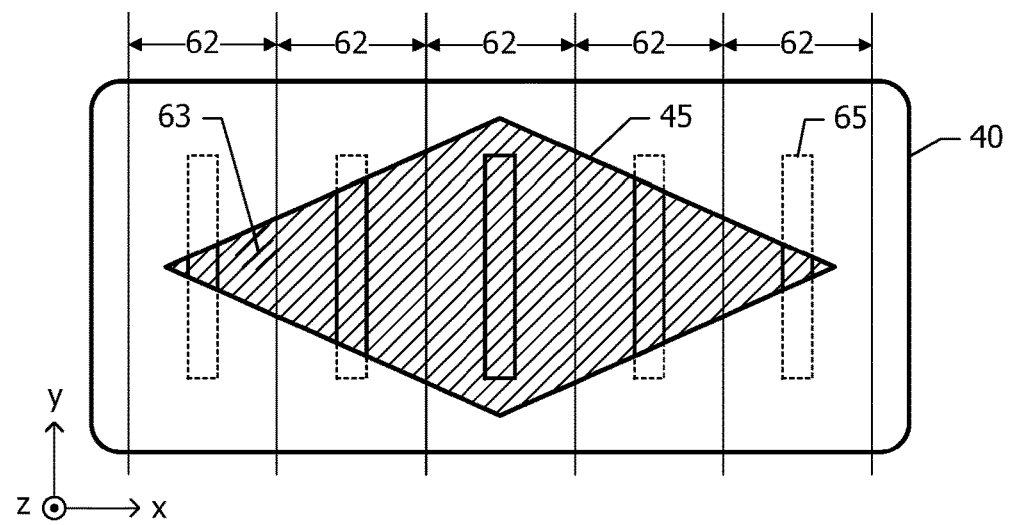

In the modified example in FIG. 25C, one cavity 45 is disposed over plural effective operating regions 65. The boundary lines between adjacent thermally vulnerable ranges 62 pass through the cavity 45. The dimension of the cavity 45 in the y-axis direction gradually becomes smaller from the center to both ends in the x-axis direction. As a result, the area of the overlapping region 63 is decreased from the thermally vulnerable range 62 including the effective operating region 65 at the center to the thermally vulnerable ranges 62 including the respective effective operating regions 65 at both ends. The dimension of the overlapping portion of the effective operating region 65 and the cavity 45 in the y-axis direction is different among the effective operating regions 65 and becomes smaller from the center to both ends in the x-axis direction.

Figure 26A:
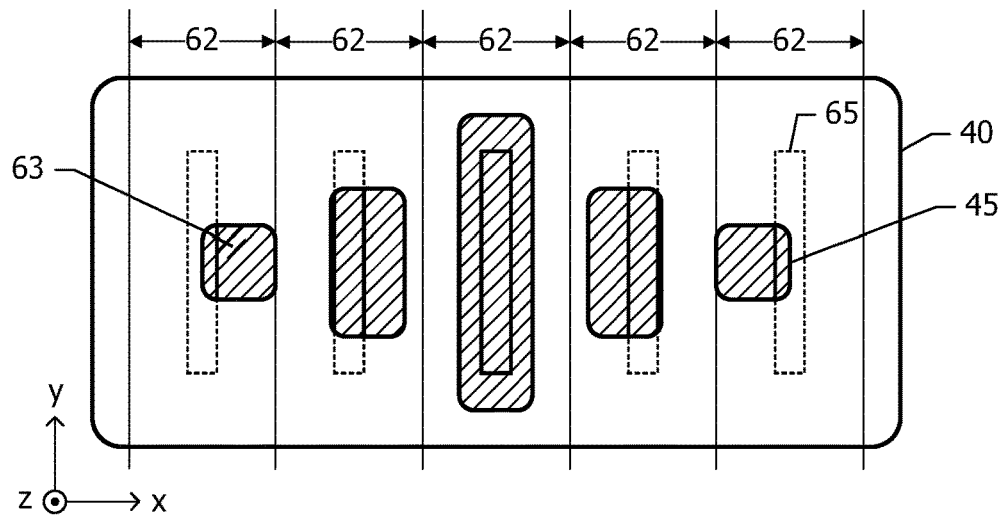

In the modified example in FIG. 26A, although the size and the position of the cavity 45 in the y-axis direction are the same as those of the tenth embodiment in FIG. 25A, the positional relationship between the effective operating region 65 and the cavity 45 in the x-axis direction is different among the effective operating regions 65. For example, the centroid of the cavity 45 is displaced from that of the effective operating region 65 in the x-axis direction. The amount of deviation of the centroid of the cavity 45 from that of the effective operating region 65 is increased from the center to both ends in the x-axis direction.

Figure 26B:
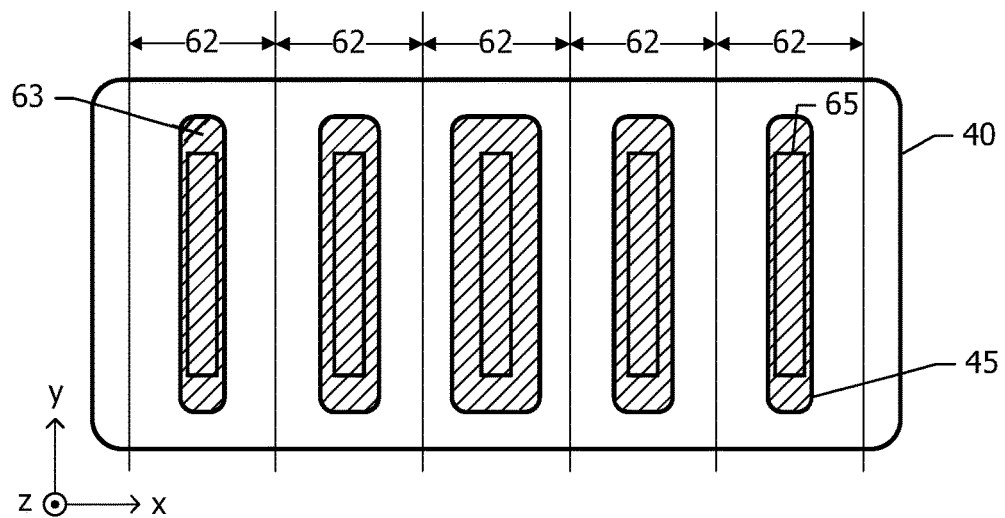

In the modified example in FIG. 26B, one cavity 45 is disposed for each effective operating region 65. The dimensions of the plural cavities 45 in the y-axis direction are the same and those in the x-axis direction are different. For example, the dimension of the cavity 45 in the x-axis direction is decreased from the center to both ends in the x-axis direction.

Figure 26C:
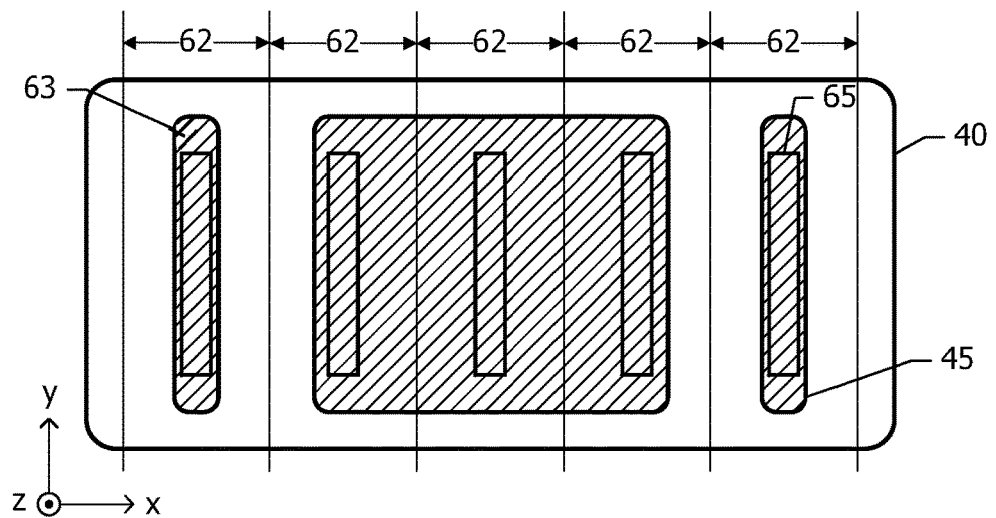

In the modified example in FIG. 26C, among plural cavities 45, one cavity 45 overlaps with plural effective operating regions 65. For example, each of the cavities 45 at both ends in the x-axis direction overlaps with one outer-side effective operating region 65, while the remaining cavity 45 overlaps with the three inner-side effective operating regions 65.

In the modified example in FIG. 27, no cavity 45 overlaps with any effective operating region 65, and cavities 45 are disposed near the corresponding effective operating regions 65. For example, the cavities 45 are displaced from the corresponding effective operating regions 65 in the x-axis direction. The number of cavities 45 disposed near the corresponding effective operating regions 65 is different among the effective operating regions 65.

In the modified example in FIG. 27, two cavities 45 are disposed near the effective operating region 65 at the center. One cavity 45 is disposed near each of the second effective operating regions 65 from the center. No cavity 45 is disposed near each of the effective operating regions 65 at both ends. In terms of the thermally vulnerable range 62, two cavities 45 are disposed within the thermally vulnerable range 62 at the center, one cavity 45 is disposed within each of the second thermally vulnerable ranges 62 from the center, and no cavity 45 is disposed within the thermally vulnerable ranges 62 at both ends.

Eleventh Embodiment

A semiconductor apparatus according to an eleventh embodiment will be described below with reference to FIGS. 28 and 29A. An explanation of the elements configured in the same manner as those of the tenth embodiment shown in FIGS. 24A through 25A will be omitted.

FIG. 28 illustrates the arrangement of the effective operating regions 65 of the semiconductor apparatus according to the eleventh embodiment. FIG. 28 also shows a graph illustrating the temperature distribution of the effective operating regions 65 when the heat dissipation from the effective operating regions 65 is uniform. In the tenth embodiment, among the effective operating regions 65, the effective operating region 65 positioned at the center in the x-axis direction is likely to be at the highest temperature and the temperature tends to decrease from the center toward both ends. In the eleventh embodiment, among the effective operating regions 65, the effective operating region 65 positioned at one end (the left end in FIG. 28) in the x-axis direction is likely to be at the highest temperature and the temperature tends to decrease toward the other end (the right end in FIG. 28). This type of temperature distribution may occur depending on the circuit arrangement on the semiconductor chip 70 (FIG. 9).

Figure 29A:
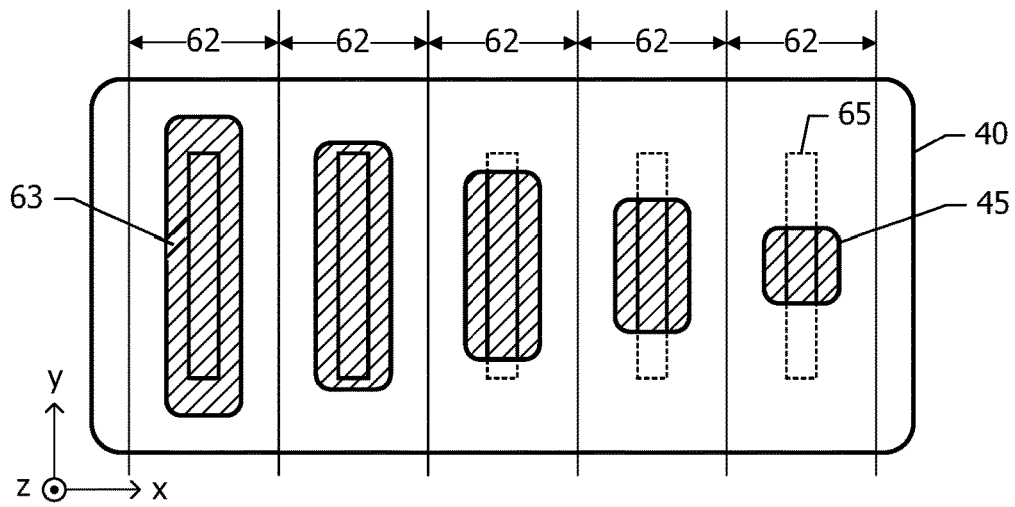
FIG. 29A illustrates the positional relationships among the effective operating regions, cavities, and a pillar bump of the semiconductor apparatus according to the eleventh embodiment.

FIG. 29A illustrates the positional relationships among the effective operating regions 65, the cavities 45, and the pillar bump 40 of the semiconductor apparatus according to the eleventh embodiment. In the tenth embodiment (FIG. 25A), the overlapping region 63 corresponding to the effective operating region 65 at the center has the largest area. In the eleventh embodiment, the overlapping region 63 corresponding to the effective operating region 65 at the left end has the largest area, and the area of the overlapping region 63 becomes smaller from the left end to the right end. In this manner, the area of the overlapping region 63 corresponding to the effective operating region 65 monotonically changes from the left end to the right end in the x-axis direction.

Advantages achieved by the configuration of the semiconductor apparatus according to the eleventh embodiment will be discussed below.

In the eleventh embodiment, the overlapping region 63 corresponding to the effective operating region 65 where the temperature is likely to rise has a relatively large area. As a result, it is possible to substantially equalize the temperatures of the plural effective operating regions 65 during the operation of the semiconductor apparatus.

Semiconductor apparatuses according to modified examples of the eleventh embodiment will be described below with reference to FIGS. 29B through 31. FIGS. 29B through 31 illustrate the positional relationships among the effective operating regions 65, the cavities 45, and the pillar bump 40 of the semiconductor apparatuses according to the modified examples of the eleventh embodiment. The modified examples in FIGS. 29B through 31 are similar to those of the tenth embodiment in FIGS. 25B through 27.

Figure 29B:
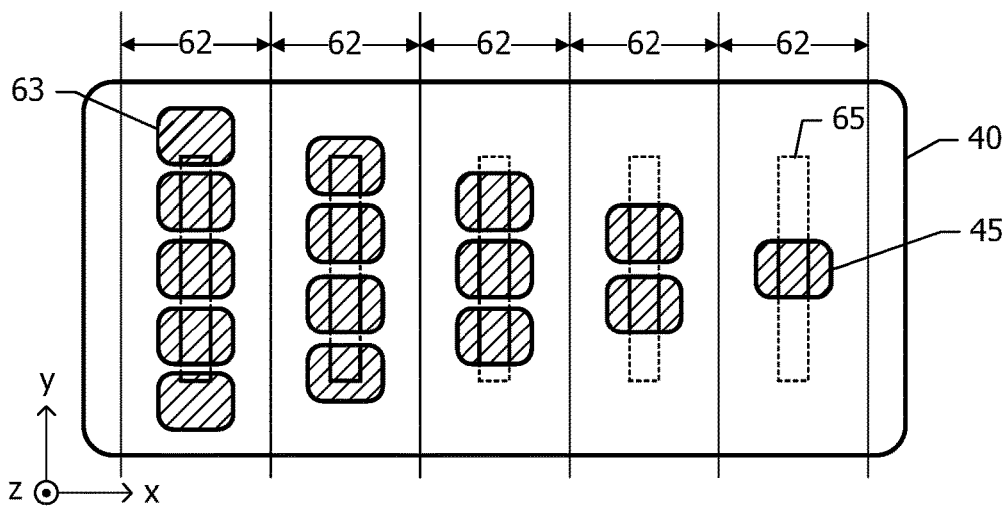
FIGS. 29B through 31 illustrate the positional relationships among the effective operating regions, cavities, and pillar bumps of semiconductor apparatuses according to modified examples of the eleventh embodiment.
Figure 29C:
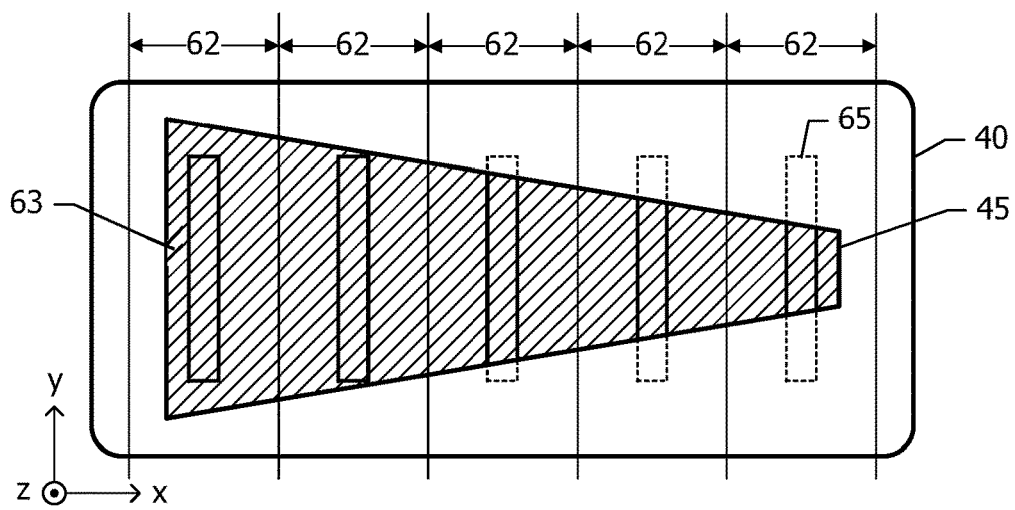

In the modified example in FIG. 29B, the number of cavities 45 within the thermally vulnerable range 62 changes monotonically from one end to the other end in the x-axis direction. In the modified example in FIG. 29C, one cavity 45 is disposed from the effective operating region 65 at one end to that at the other end in the x-axis direction. The area of the overlapping region 63 within the thermally vulnerable range 62 changes monotonically from one end to the other end in the x-axis direction.

Figure 30A:
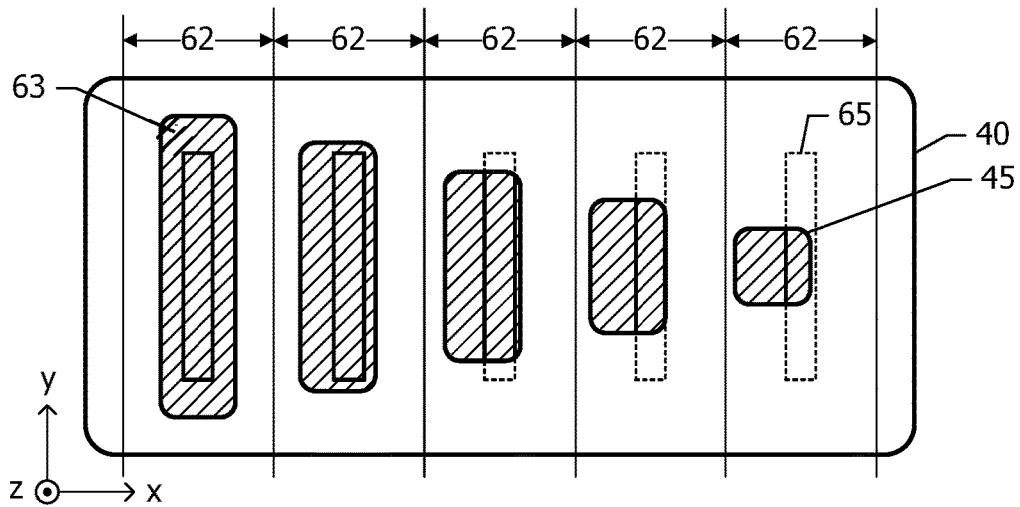
Figure 30B:
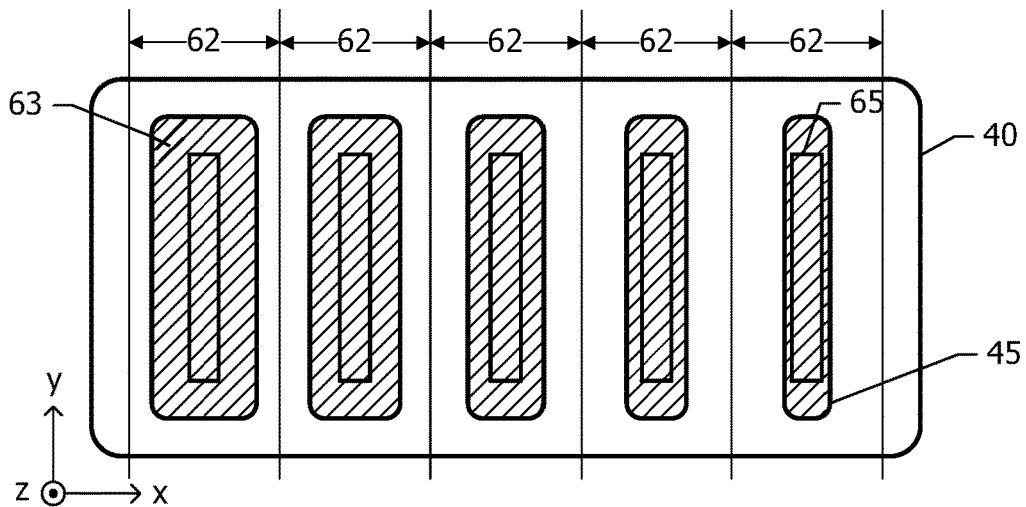
Figure 30C:
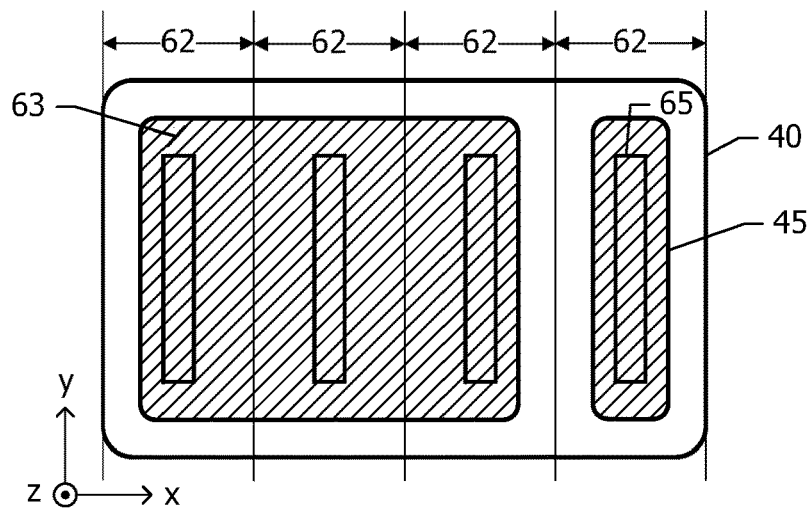

In the modified example in FIG. 30A, the cavity 45 is displaced from the effective operating region 65 in the x-axis direction. The amount of deviation of the cavity 45 from the effective operating region 65 changes monotonically from one end to the other end in the x-axis direction. In the modified example in FIG. 30B, the dimension of the cavity 45 corresponding to the effective operating region 65 in the x-axis direction changes monotonically from one end to the other end in the x-axis direction. In the modified example in FIG. 30C, among the plural cavities 45, one cavity 45 overlaps with plural effective operating regions 65. The number of effective operating regions 65 overlapping one cavity 45 changes monotonically from one end to the other end in the x-axis direction.

Figure 31:
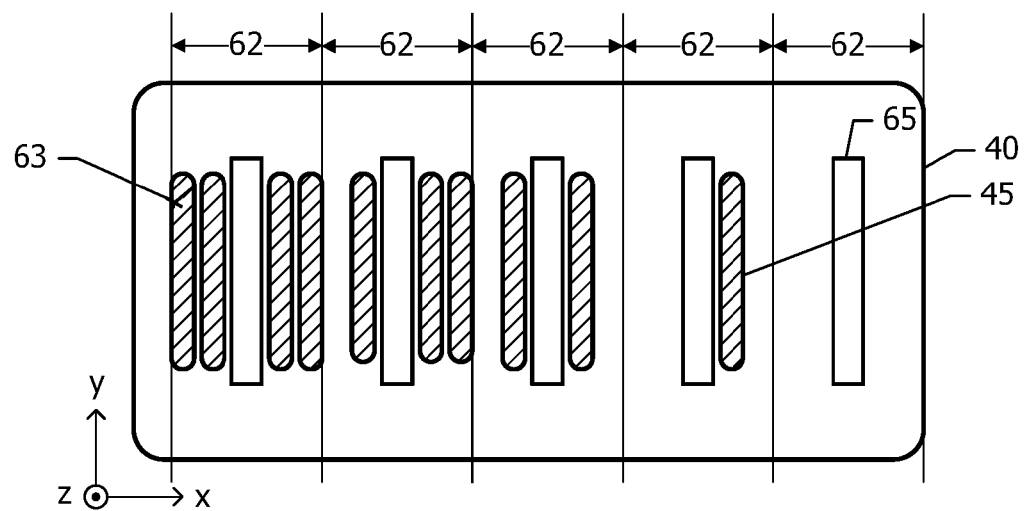

In the modified example in FIG. 31, no cavity 45 overlaps with any effective operating region 65, and cavities 45 are disposed near the corresponding effective operating regions 65. The number of cavities 45 disposed near the corresponding effective operating region 65 changes monotonically from one end to the other end in the x-axis direction.

In the modified examples of the eleventh embodiment, the overlapping region 63 corresponding to the effective operating region 65 at one end has the largest area. The area of the overlapping region 63 is decreased from one end to the other end in the x-axis direction. Advantages similar to those of the eleventh embodiment are thus achieved in the modified examples in FIGS. 29B through 31.

Twelfth Embodiment

A semiconductor apparatus according to a twelfth embodiment will be described below with reference to FIG. 32A. An explanation of the elements configured in the same manner as those of the tenth embodiment shown in FIGS. 24A through 25A will be omitted.

Figure 32A:
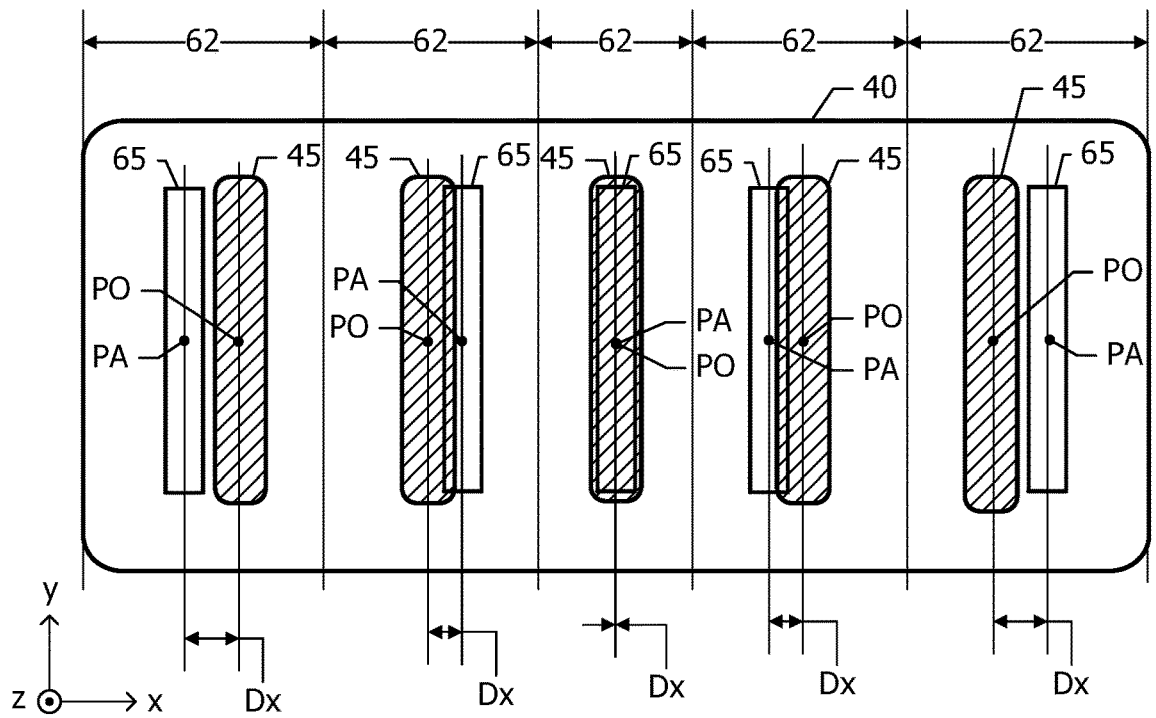
FIG. 32A illustrates the positional relationships among the effective operating regions, cavities, and a pillar bump of a semiconductor apparatus according to a twelfth embodiment.

FIG. 32A illustrates the positional relationships among the effective operating regions 65, the cavities 45, and the pillar bump 40 of the semiconductor apparatus according to the twelfth embodiment. In the tenth embodiment, the plural effective operating regions 65 are arranged at equal pitches in the x-axis direction. In the twelfth embodiment, the plural effective operating regions 65 are not arranged at equal pitches, and the cavities 45 are arranged at equal pitches. The areas of the plural cavities 45 are the same. The cavities 45 are each disposed within a thermally vulnerable range 62 including the corresponding effective operating region 65. Accordingly, the plural overlapping regions 63 where the thermally vulnerable range 62 and the cavity 45 overlap with each other also have the same area.

The centroid PA of the effective operating region 65 may be regarded as that of the operating region 61 in the first embodiment (FIG. 1). As in the third embodiment in FIG. 10A, the amount of deviation between the centroid PA of each effective operating region 65 and the centroid PO of the corresponding cavity 45 (the amount of deviation of the closest proximity cavity 45) is indicated by Dx. The amount of deviation Dx of the closest proximity cavity 45 is increased from the center to both ends of the arrangement direction of the plural unit transistors 60. It is thus possible to substantially equalize the temperatures of the operating unit transistors 60, as in the tenth embodiment.

A semiconductor apparatus according to a modified example of the twelfth embodiment will be described below with reference to FIG. 32B.

Figure 32B:
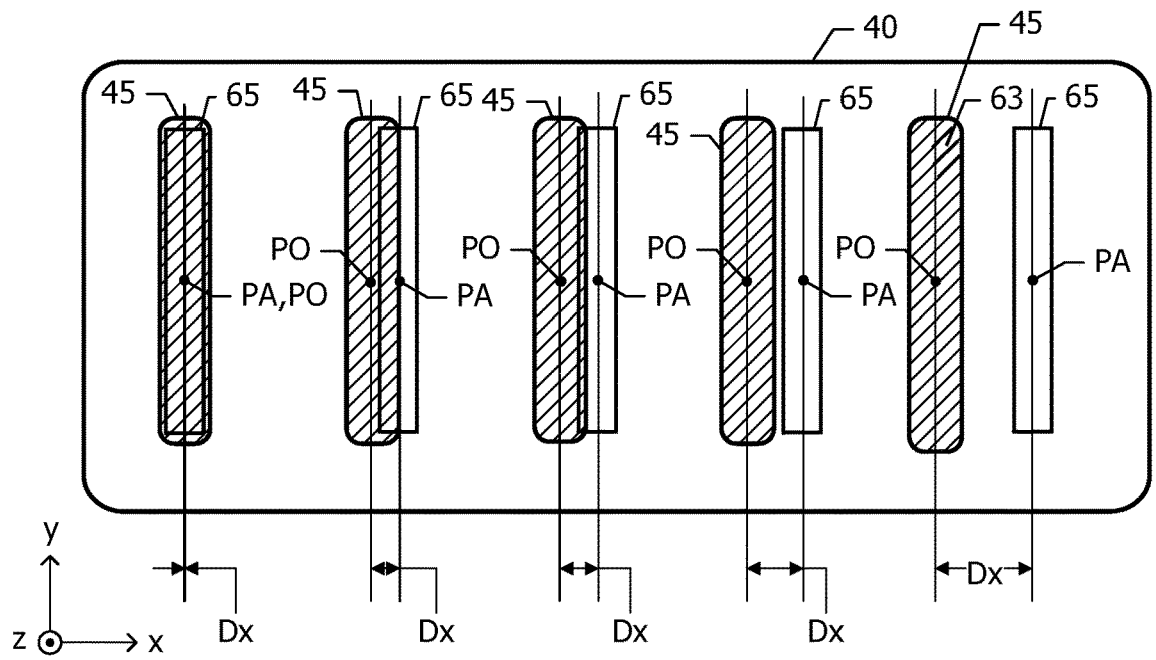
FIG. 32B illustrates the positional relationships among the effective operating regions, cavities, and a pillar bump of a semiconductor apparatus according to a modified example of the twelfth embodiment.

FIG. 32B illustrates the positional relationships among the effective operating regions 65, the cavities 45, and the pillar bump 40 of the semiconductor apparatus according to the modified example of the twelfth embodiment. As in the twelfth embodiment, the plural cavities 45 are arranged at equal pitches in the x-axis direction in this modified example. The pitches between some effective operating regions 65 are equal and those between some effective operating regions 65 are not equal.

In this modified example, the amount of deviation Dx of the closest proximity cavity 45 is increased from one end to the other end of the arrangement direction of the plural unit transistors 60. It is thus possible to substantially equalize the temperatures of the operating unit transistors 60, as in the eleventh embodiment in FIGS. 28 and 29A.

The disclosure is not limited to the above-described embodiments and modified examples. The configurations described in some of the embodiments and modified examples may partially be replaced by or combined with each other. Similar advantages obtained by similar configurations in plural embodiments are not repeated in the individual embodiments.

While preferred embodiments of the disclosure have been described above, it is to be understood that variations, improvements, combinations, and modifications will be apparent to those skilled in the art without departing from the scope and spirit of the disclosure. The scope of the disclosure, therefore, is to be determined solely by the following claims.

What is claimed is:

1. A semiconductor apparatus comprising:
a substrate;
a plurality of unit transistors provided on the substrate, each of the plurality of unit transistors including an operating region through which an operating current flows;
a first wiring disposed above the operating regions of the plurality of unit transistors to serve as a path for the operating current to flow through the plurality of unit transistors;
an insulating film disposed on the first wiring and including at least one cavity, an entirety of the at least one cavity overlapping with the first wiring as viewed from above; and
a metal member disposed on the insulating film and electrically connected to the first wiring via the at least one cavity, wherein
the plurality of unit transistors are disposed on the substrate side by side in a first direction,
a geometric center of the at least one cavity is displaced from a geometric center of the operating region of each of the plurality of unit transistors in the first direction, as viewed from above, and
for each of the unit transistors, when, among the at least one cavity, a cavity having a geometric center positioned most closely to the geometric center of the operating region of a given unit transistor is defined as a closest proximity cavity for the given unit transistor, an amount of deviation of the geometric center of the closest proximity cavity from the geometric center of the operating region of the corresponding unit transistor in the first direction becomes greater from a center to an end of an arrangement direction of the plurality of unit transistors.

2. The semiconductor apparatus according to claim 1, wherein the at least one cavity is disposed between the geometric centers of the operating regions of two of the unit transistors located at both ends in the first direction, and no cavity is disposed outside the geometric centers of the operating regions of the two unit transistors.

3. The semiconductor apparatus according to claim 2, wherein at least two of the at least one cavity are disposed at different positions in a direction perpendicular to the first direction.

4. The semiconductor apparatus according to claim 2, wherein the geometric center of the operating region of each of the plurality of unit transistors is displaced from a geometric center of the metal member in a direction perpendicular to the first direction, as viewed from above.

5. The semiconductor apparatus according to claim 2, wherein the operating region of each of the plurality of unit transistors has a planar configuration elongated in a direction perpendicular to the first direction.

6. The semiconductor apparatus according to claim 1, wherein at least two of the at least one cavity are disposed at different positions in a direction perpendicular to the first direction.

7. The semiconductor apparatus according to claim 6, wherein the geometric center of the operating region of each of the plurality of unit transistors is displaced from a geometric center of the metal member in a direction perpendicular to the first direction, as viewed from above.

8. The semiconductor apparatus according to claim 1, wherein the geometric center of the operating region of each of the plurality of unit transistors is displaced from a geometric center of the metal member in a direction perpendicular to the first direction, as viewed from above.

9. The semiconductor apparatus according to claim 1, wherein the operating region of each of the plurality of unit transistors has a planar configuration elongated in a direction perpendicular to the first direction.

10. The semiconductor apparatus according to claim 1, wherein the metal member forms a pillar bump including a metal post comprising copper as a main constituent.

11. The semiconductor apparatus according to claim 1, wherein:
the metal member forms a second wiring disposed above the substrate;
the semiconductor apparatus further comprises an external connection terminal disposed on the second wiring; and
the metal member is electrically connected to the external connection terminal.

12. The semiconductor apparatus according to claim 1, wherein the insulating film includes at least one of silicon oxide, silicon nitride, and a resin as a material.

13. The semiconductor apparatus according to claim 1, wherein:
each of the plurality of unit transistors is a bipolar transistor including a collector layer, a base layer, and an emitter layer provided on the substrate; and
the operating region is a region where the operating current flows in a thickness direction of each of the plurality of unit transistors.

14. The semiconductor apparatus according to claim 13, wherein:
the collector layer, the base layer, and the emitter layer of each of the plurality of unit transistors are sequentially stacked on the substrate;
the emitter layer is electrically connected to the first wiring; and
an interface between the base layer and the emitter layer is a heterojunction.

15. The semiconductor apparatus according to claim 14, wherein the substrate comprises GaAs and the emitter layer comprises InGaP.

16. The semiconductor apparatus according to claim 14, wherein each of the plurality of unit transistors is a heterojunction bipolar transistor including the base layer comprising SiGe.

17. The semiconductor apparatus according to claim 1, wherein:
each of the plurality of unit transistors is a field-effect transistor including a source, a drain, and a gate provided on the substrate; and
the operating region is a region where the operating current flows in an in-plane direction on a surface of the substrate.

18. A semiconductor apparatus comprising:
a substrate;
a plurality of unit transistors provided on the substrate, each of the plurality of unit transistors including an operating region through which an operating current flows;
a wiring disposed above the operating regions of the plurality of unit transistors to serve as a path for the operating current to flow through the plurality of unit transistors;
an insulating film disposed on the wiring and including at least one cavity, an entirety of the at least one cavity overlapping with the wiring as viewed from above; and
a metal member disposed on the insulating film and electrically connected to the wiring via the at least one cavity, wherein
the plurality of unit transistors are disposed on the substrate side by side in a first direction,
a geometric center of the at least one cavity is displaced from a geometric center of the operating region of each of the plurality of unit transistors in the first direction, as viewed from above, and
for each of the unit transistors, when, among the at least one cavity, a cavity having a geometric center positioned most closely to the geometric center of the operating region of a given unit transistor is defined as a closest proximity cavity for the given unit transistor, an amount of deviation of the geometric center of the closest proximity cavity in the first direction from the geometric center of the operating region of the unit transistor positioned at one end in the first direction is smaller than an amount of deviation of the geometric center of the closest proximity cavity in the first direction from the geometric center of the operating region of the unit transistor positioned at the other end in the first direction.

19. The semiconductor apparatus according to claim 18, wherein, for each unit transistor in the first direction, an amount of deviation of the geometric center of a corresponding cavity from the geometric center of the operating region of the unit transistor progressively increases in the first direction from the unit transistor corresponding to the closest proximity cavity.

20. A semiconductor apparatus comprising:
a substrate;
a plurality of unit transistors provided on the substrate, each of the plurality of unit transistors including at least one operating region through which an operating current flows;
a wiring disposed above the operating regions of the plurality of unit transistors to serve as a path for the operating current to flow through the plurality of unit transistors;
an insulating film disposed on the wiring and including at least one cavity, an entirety of the at least one cavity overlapping with the wiring as viewed from above; and
a metal member disposed on the insulating film and electrically connected to the wiring via the at least one cavity, wherein
the plurality of unit transistors are disposed on the substrate side by side in a first direction,
as viewed from above, when the smallest rectangle containing the at least one operating region of each of the plurality of unit transistors therein is defined as an effective operating region, and, assuming that a line parallel with a second direction perpendicular to the first direction and passing through a midpoint of a segment between a geometric center of a given effective operating region and a geometric center of an adjacent effective operating region is set as an imaginary line, when each of a plurality of regions sandwiched between the imaginary lines is defined as a range influenced by the effective operating region positioned within the range, an area of an overlapping region where the range and the cavity overlap with each other differs among the effective operating regions, and areas of the overlapping regions corresponding to the effective operating regions positioned at both ends in the first direction are smaller than areas of the overlapping regions corresponding to the effective operating regions other than the effective operating regions positioned at both ends in the first direction.

* * * * *